(12) United States Patent
Iwata et al.

(10) Patent No.: US 7,053,437 B2
(45) Date of Patent: May 30, 2006

(54) SEMICONDUCTOR MEMORY DEVICE, SEMICONDUCTOR DEVICE AND METHODS OF MANUFACTURING THEM, PORTABLE ELECTRONIC EQUIPMENT, AND IC CARD

(75) Inventors: Hiroshi Iwata, Ikoma-gun (JP); Takayuki Ogura, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/848,214

(22) Filed: May 19, 2004

(65) Prior Publication Data
US 2004/0232477 A1 Nov. 25, 2004

(30) Foreign Application Priority Data
May 20, 2003 (JP) ............................. 2003-142120

(51) Int. Cl.
*H01L 29/76* (2006.01)
(52) U.S. Cl. ...................... 257/314; 438/201
(58) Field of Classification Search ............... 438/201, 438/211, 257, 264; 257/314–316, 239
See application file for complete search history.

(56) References Cited

U.S. PATENT DOCUMENTS
6,803,620 B1 * 10/2004 Moriya et al. .............. 257/298

FOREIGN PATENT DOCUMENTS
| JP | 5-81072 B2 | 11/1993 |
|----|------------|---------|
| JP | 9-116119 A | 5/1997 |
| JP | 2001-156189 A | 6/2001 |
| JP | 2001-230332 A | 8/2001 |
| JP | 2001-512290 A | 8/2001 |
| WO | WO 99-07000 | 2/1999 |

OTHER PUBLICATIONS

Masuoka Fujio, "Flash Memory Technology Handbook", Science Forum Co. Ltd., Aug. 15, 1993, pp 55-58.

* cited by examiner

*Primary Examiner*—David Vu
(74) *Attorney, Agent, or Firm*—Birch, Stewart, Kolasch & Birch, LLP

(57) ABSTRACT

A semiconductor memory device including memory cells, each memory cell including: a gate insulating film formed on a semiconductor substrate; a gate electrode formed on the gate insulating film; a channel region located below the gate electrode; a pair of source and drain regions arranged on a opposite sides, respectively, of the channel region, the source and drain regions having a conductive type opposite to that of the channel region; and memory functional units located on opposite sides, respectively, of the gate electrode, each memory functional unit including a charge retaining portion and an anti-dissipation insulator, the charge retaining portion being made of a material serving to store charges, the anti-dissipation insulator serving to prevent the stored charges from being dissipated by separating the charge retaining portion from both the gate electrode and the substrate, wherein a distance between a side wall of the gate electrode and a side of the charge retaining portion facing each other (T2) is adapted to differ from a distance between a bottom of the charge retaining portion and a surface of the substrate (T1).

30 Claims, 22 Drawing Sheets

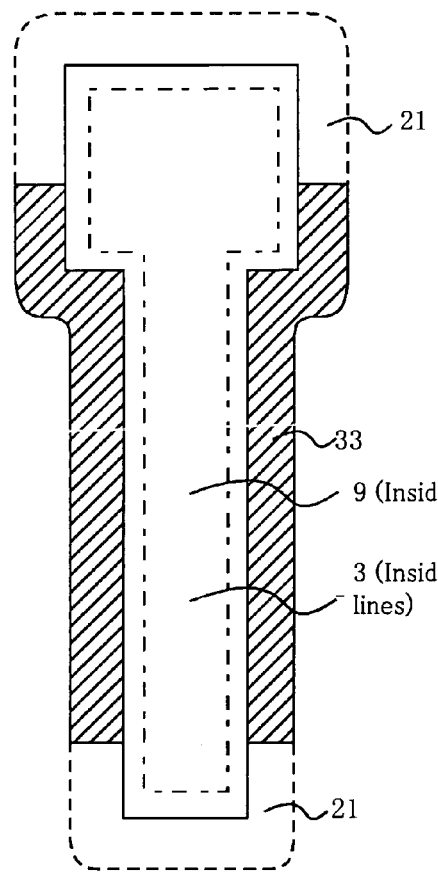
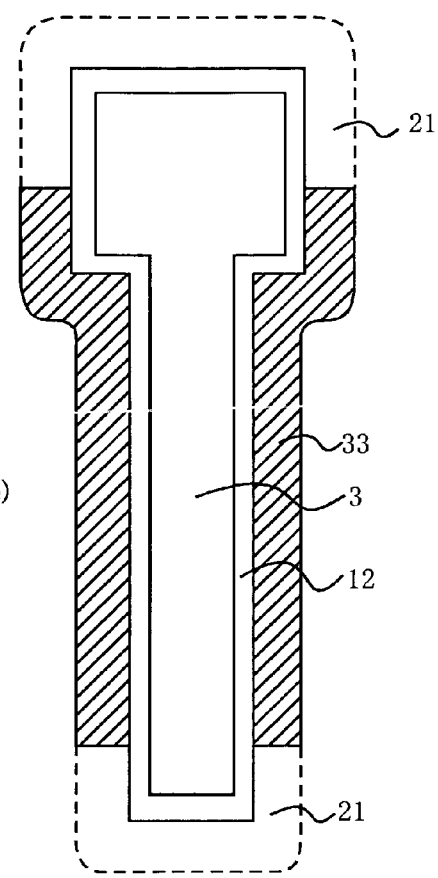
*FIG.21 (a)*  *FIG.21 (b)*

SEMICONDUCTOR MEMORY DEVICE, SEMICONDUCTOR DEVICE AND METHODS OF MANUFACTURING THEM, PORTABLE ELECTRONIC EQUIPMENT, AND IC CARD

CROSS-REFERENCE TO RELATED APPLICATION

This application is related to Japanese application No. 2003-142120 filed on May 20, 2003, whose priority is claimed under 35 USC §119, the disclosure of which is incorporated by reference in its entirety.

BACKGROUND OF THE INVENTION

1. Field of the Invention

This invention relates to a semiconductor memory device, a semiconductor device and methods of manufacturing them, portable electronic equipment, and an IC card. More particularly, it is well suited for applications to an electrically erasable and programmable semiconductor memory device and a method of manufacturing the same.

2. Description of the Related Art

An electrically erasable and programmable memory element is, for example, a flash memory. The structural sectional view of the element of the general flash memory is shown in FIG. 25. The element has a structure wherein a floating gate 906 made of polysilicon is arranged above a semiconductor substrate 901 via a first oxide film 904, a control gate 907 made of polysilicon is arranged above the floating gate 906 via a second oxide film 905, and a pair of source and drain diffused regions 902 and 903 are arranged in and on the surface of the semiconductor substrate 901. The control gate 907 functions as the gate electrode of a field effect transistor (FET) in the flash memory. Besides, the first oxide film 904, floating gate 906 and second oxide film 905 are interposed between the control gate 907 and the semiconductor substrate 901. That is, the flash memory is a memory wherein a memory film (the floating gate) is arranged in the gate oxide film portion of the FET, thereby fulfilling the function of changing the threshold voltage of the FET in accordance with the quantity of charges stored in the memory film (refer to, for example, "Handbook of Flash Memory Technology" edited by Fujio Masuoka, published by Kabushiki Kaisha Science Forum on Aug. 15, 1993, P55–58).

The problem of so-called "over-erasure" is involved in the flash memory of the above structure. More specifically, an erasing operation of the flash memory is to lower the threshold voltage of the FET in the flash memory by extracting electrons stored in the floating gate or injecting holes into the floating gate. Since, however, the erasing operation is executed excessively, the FET turns ON under the influence of the charges stored in the floating gate locating below the gate electrode (that is, the control gate), without applying any voltage to the gate electrode of the FET, so that current flows through the source and drain diffused regions. The phenomenon is ascribable to the structural feature of the flash memory that the control gate being the gate electrode as the FET, and the floating gate being the memory film as the memory are stacked vertically, so the FET turns ON due to only the stored charges of the floating gate, without applying any voltage to the control gate. This leads to a leakage current from a non-selected memory cell. Accordingly, such defective readout occurs that the readout current from a selected memory cell fails to be detected because of the leakage current.

SUMMARY OF THE INVENTION

This invention has been made in consideration of such circumstances, and comprises providing a semiconductor memory device, a semiconductor device and methods of manufacturing them, portable electronic equipment, and an IC card which are improved in over-erasure and defective readout pertaining thereto.

An embodiment of the present invention provides a semiconductor memory device including memory cells, each memory cell comprising:
a gate insulating film formed on a semiconductor substrate; a gate electrode formed on the gate insulating film; a channel region located below the gate electrode; a pair of source and drain regions arranged on opposite sides, respectively, of the channel region, the source and drain regions having a conductive type opposite to that of the channel region; and memory functional units located on opposite sides, respectively, of the gate electrode, each memory functional unit including a charge retaining portion and an anti-dissipation insulator, the charge retaining portion being made of a material serving to store charges, the anti-dissipation insulator serving to prevent the stored charges from being dissipated by separating the charge retaining portion from both the gate electrode and the substrate, wherein a distance between a side wall of the gate electrode and a side of the charge retaining portion facing each other (T2) is adapted to differ from a distance between a bottom of the charge retaining portion and a surface of the substrate (T1).

According to the semiconductor memory device of an embodiment of this invention, charge retaining portions locate on opposite sides, respectively, of the gate electrode, not on the gate insulating film of a field effect transistor, so that over-erasure and the problem of defective readout pertaining thereto are eliminated.

Besides, an anti-dissipation insulating film which can suppress the dissipation of charges from the charge retaining portion of the memory functional unit is existent, so that the retaining time of charges is enhanced.

The above distance (T2) is made different from the above distance (T1), whereby when the distance T1 is made smaller than the distance T2 by way of example, charges injected from a semiconductor substrate can be restrained from penetrating a memory functional unit to the gate electrode, and conversely, when the distance T1 is made larger than the distance T2, charges injected from the gate electrode can be restrained from penetrating the memory functional unit to the semiconductor substrate. It is therefore possible to obtain a semiconductor memory device of high charge injection efficiency and high writing/erasing speeds.

BRIEF DESCRIPTION OF THE DRAWINGS

FIGS. 21a–21b are horizontal sectional views showing a separated charge storing regions according to the tenth embodiment of the present invention;

FIGS. 22a–22b are structural views of a semiconductor memory device being provided with a memory device of the present invention, peripheral circuits, an MPU, a cash SRAM and the like;

DESCRIPTION OF THE PREFERRED EMBODIMENTS

Figure 1:
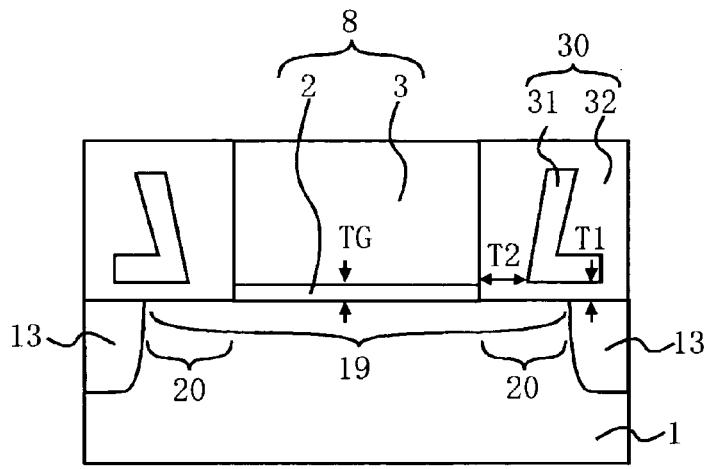
FIG. 1 is a schematic sectional view showing a structural outline of a semiconductor memory device according to a first embodiment of the present invention.
Figure 1:
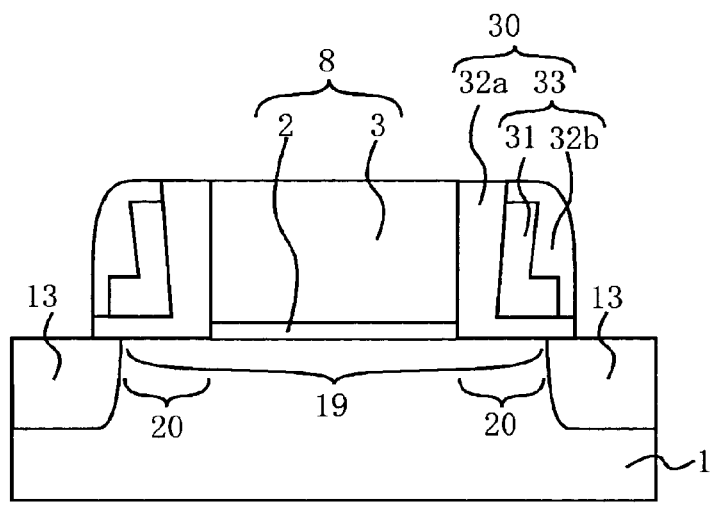
Figure 1:
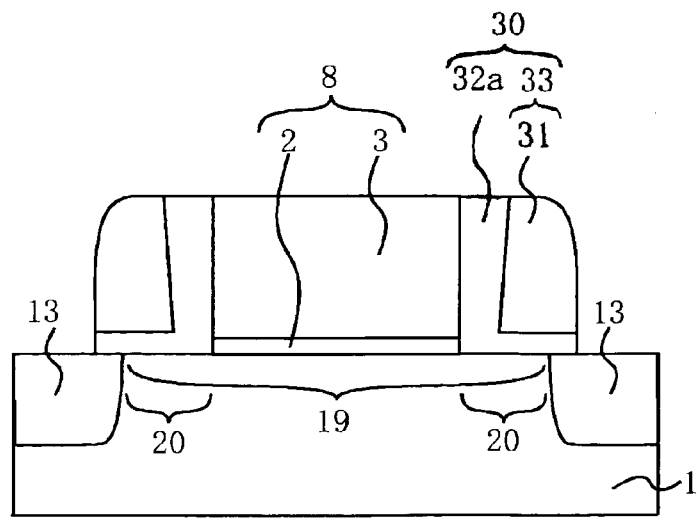

The semiconductor memory device of one embodiment of this invention comprises a semiconductor memory element mainly including a semiconductor substrate, a gate insulating film which is formed on the semiconductor substrate, a gate electrode which is formed on the gate insulating film, a channel region which is arranged under the gate electrode, a pair of source and drain diffused regions which are arranged on opposite sides of the channel region, and which have an opposite conductive type to that of the channel region, and memory functional units which are arranged on opposite sides of the gate electrode, and each of which includes a charge retaining portion that is made of a material having a function of storing charges, and a anti-dissipation insulator that has a function of preventing stored charges from scattering, wherein an distance (T2) between a sidewall of the gate electrode and the charge retaining portion opposing to the sidewall is different from an distance (T1) between a bottom of the charge retaining portion located on a semiconductor substrate side thereof and a front surface of the semiconductor substrate.

As used herein, the phrase "source and drain region" refers to a diffusion region that may function as either a source region or a drain region. These source and drain regions may sometimes be referred to individually as either a "source region" or a "drain region"; however, it should be understood that either region can be the source or the drain depending on the configuration of the circuit.

It is favorable that the semiconductor memory device of one embodiment of this invention basically adopts a MOS circuit, and that all circuits including the MOS circuit are mounted on a single semiconductor substrate.

In the semiconductor memory element according to the semiconductor memory device of one embodiment of this invention, the distance T2 may increase as it is measured farther from the substrate.

In the aspect described above, the charge retaining portion is formed so that its upper part may be remoter from the gate electrode than its lower part, so the injection of unnecessary charges into the upper part of the charge retaining portion is suppressed, and the scatter of the unnecessary charges is also suppressed. It is possible to intensely suppress, for example, electron injection from the gate electrode as occurs in an erasing mode. Further, the lower part is not so remote as the upper part, so that charges to be held are formed without being unnecessarily spaced from the channel region. Owing to the above, the injection and scatter of the unnecessary charges can be suppressed without decreasing the difference between readout currents in writing/erasing modes.

In the semiconductor memory element, the distance T2 may be larger than the distance T1.

In the aspect described above, since the distance T1 is made smaller relative to the distance T2, electron injection from the gate electrode in an erasing mode can be suppressed, and a semiconductor memory device of suppressed defective erasing can be provided.

Further, in one embodiment of the semiconductor memory element, an oxynitride film may be formed between the charge retaining portion and the gate electrode.

In the aspect described above, electron injection from the gate electrode in an erasing mode can be suppressed more remarkably, so that a semiconductor memory device of suppressed defective erasing can be provided.

Alternatively, in one embodiment of the semiconductor memory element, a deposited insulating film may be formed between the charge retaining portion and the gate electrode.

In the aspect described above, a thick film of the deposited insulator having a good uniformity can be formed between the charge retaining portion and the gate electrode, and the problem of degradation ascribable to asperity, namely, ruggedness appearing on the gate electrode is also suppressed, so that electron injection from the gate electrode in an erasing mode can be suppressed more remarkably, and a semiconductor memory device of suppressed defective erasing can be provided.

Further, in one embodiment of the semiconductor memory element, a thermal insulator ranging from 1 nm to 10 nm inclusive in thickness may be arranged between the deposited insulator and the semiconductor substrate.

In the aspect described above, the thermal insulator being an insulating film which has been formed by a substantially uniform heat treatment and ranging from 1 nm to 10 nm inclusive in thickness is arranged between the deposited insulator and the semiconductor substrate. Therefore, the interface between the thermal insulator and the semiconductor substrate has a good shape, the mobility degradation of current to flow through the interface can be suppressed, and a larger driving current is attained, so that a semiconductor memory device of more enhanced readout speed can be provided. Besides, since the film thickness of the thermal insulator is at least 1 nm, interface characteristics can be satisfactorily enhanced, and since the film thickness is at most 10 nm, the occurrence of the degradation ascribable to the asperity can be suppressed.

In one embodiment of the semiconductor memory element, the gate electrode may be formed of a different composition of material from the substrate, and the distance T2 may be different from T1.

When the gate electrode is formed of a different composition of material from the substrate, the distance T2 can be made much different from the distance T1, namely, the thickness of the anti-dissipation insulating film formed at the gate electrode sidewall and on the semiconductor substrate, and a semiconductor memory device of higher charge injection efficiency and high writing/erasing speeds can be provided.

In one embodiment of the semiconductor memory element, it is also allowed that the charge retaining portion in the memory functional unit is separated from both the gate electrode and the substrate by the anti-dissipation insulator, the substrate and the gate electrode being made of silicon, and wherein a region of the substrate facing the memory functional unit differs in impurity concentration from a region of the gate electrode facing the memory functional unit, and the distance T2 is different from T1.

Here, the expression "made of silicon" signifies "made of a substance whose principal raw material is silicon" in more detail. Concretely, it is also allowed that the principal material is single-crystal silicon, polysilicon or amorphous silicon, in which an impurity is contained.

In the aspect described above, the semiconductor substrate and the gate electrode can be formed of the silicon which is often used as the material of semiconductor devices at present, so that a semiconductor process which is highly affinitive with an ordinary semiconductor manufacturing process can be constructed, and a semiconductor memory device of low manufacturing cost can be provide.

Further, in one embodiment of the semiconductor memory element, the gate electrode may have an impurity concentration of $1 \times 10^{20}$ cm$^{-3}$ or more, and the substrate may have an impurity concentration lower than that of the gate electrode. In the aspect described above, relative to either of the gate electrode and the semiconductor substrate which are made of silicon, the other has the lower impurity concentration, and the film of the anti-dissipation insulator becomes thinner thereon. Further, since the higher impurity concentration is at least $1 \times 10^{20}$ cm$^{-3}$, the effect of impurity-enhanced oxidation appears remarkably, and the film thickens on the corresponding region. Therefore, the difference of film thicknesses becomes conspicuous. It is accordingly possible to provide a semiconductor memory device of remarkably good charge injection efficiency and remarkably high writing/erasing speeds.

Since, however, the concentration of an impurity which can be contained in silicon is subject to limitation, it is, at most, in the order of $10^{21}$ cm$^{-3}$. Besides, the impurity concentration should preferably be, at least, in the order of $10^{15}$ cm$^{-3}$ for the reason that the impurity concentration of a general semiconductor substrate is in the order of $10^{15}$ cm$^{-3}$.

Alternatively, in one embodiment of the semiconductor memory element, it is also allowed that the impurity concentration of the gate electrode of the semiconductor memory element is at least $1 \times 10^{20}$ cm$^{-3}$, and that the impurity concentration of the semiconductor substrate is lower than that of the gate electrode.

In the aspect described above, The impurity concentration of the gate electrode made of silicon is higher than that of the semiconductor substrate, and the insulating film at the gate electrode sidewall becomes thicker. Further, since the impurity concentration of the gate electrode is at least $1 \times 10^{20}$ cm$^{-3}$, the effect of impurity-enhanced oxidation appears remarkably, and the film thickens on the gate electrode, so that the difference of film thicknesses becomes conspicuous. It is accordingly possible to provide a semiconductor memory device of remarkably good charge injection efficiency and remarkably high writing/erasing speeds.

Since, however, the concentration of an impurity which can be contained in silicon is subject to limitation, it is, at most, in the order of $10^{21}$ cm$^{-3}$. Besides, the impurity concentration should preferably be, at least, in the order of $10^{15}$ cm$^{-3}$ for the reason that the impurity concentration of a general semiconductor substrate is in the order of $10^{15}$ cm$^{-3}$.

Alternatively, in one embodiment of the semiconductor memory element, at least a portion of the gate insulating film and at least a portion of the memory functional unit may be each made of an oxide film, and the gate insulating film may have an oxide film equivalent thickness smaller than that of a path extending through the memory functional unit from the side wall of the gate electrode opposed to the memory functional unit to the surface of the substrate located below the memory functional unit. Here, "the oxide film equivalent thickness" is one obtained by multiplying a thickness of an insulating film by the ratio of the dielectric constant of the oxide film to the dielectric constant of the insulating film. When the insulating film consists of some dielectric layers and one of the layers is not made of an oxide film, a nitride film for example, the equivalent thickness of the nitride film layer is taken into account for determining the oxide film equivalent thickness.

The above described structure means that the strength of an electric field in the path extending from the gate electrode to the substrate via the gate insulating film is smaller than that of an electric field in the path extending through the memory functional unit from the side wall of the gate electrode opposing the memory functional unit to the surface of the substrate locating below the memory functional unit when a voltage is applied between the gate electrode and the substrate below the gate electrode In the aspect described above, since the oxide film equivalent thickness of the gate insulating film may be smaller than that of the path extending through the memory functional unit from the side wall of the gate electrode opposed to the memory functional unit to the semiconductor substrate, a threshold voltage in the case, for example, where the gate insulating film is employed as that of a MOSFET can be set low, and low voltage drive of low readout voltage can be realized. Accordingly, a semiconductor memory device of low power consumption can be provided.

Further, in one embodiment of the semiconductor memory element, the charge retaining portions, locating on the opposite sides, respectively, of the gate electrode, may be adapted to store charges independently.

In the aspect described above, charges can be held in the two charge retaining portions independently of each other, so that information of four values can be stored per memory cell, and a semiconductor memory device of enlarged capacity can be provided.

In one embodiment of the semiconductor memory element, at least a portion of the gate insulating film and at least a portion of the memory functional unit may be each made of an oxide film, and the gate insulating film may have an oxide film equivalent thickness larger than that of a path extending through the memory functional unit from the side wall of the gate electrode opposed to the memory functional unit to the surface of the substrate located below the memory functional unit.

In the aspect described above, by way of example, information can be written by impressing potentials of 10 volts and 0 volt on the gate electrode and the source and drain diffused regions, respectively, information can be erased by impressing potentials of −10 volts and 0 volt on the gate electrode and the source and drain diffused regions, respectively, and a drain current does not flow because the potentials of one of the source and drain diffused regions and the other are equal. Moreover, the gate insulating film is thick, and a leakage current to pass through the gate insulating film is suppressed. Therefore, a semiconductor memory device of lowered power consumption is provided. Furthermore, hot carriers are not generated, and any charge is not injected into the gate insulating film, so that the discrepancy of a threshold voltage attributed to the injection of charges into the gate insulating film is suppressed, and a semiconductor memory device of high reliability can be provided.

Further, in the semiconductor memory element, at least a part of the source and drain regions may be arranged below the gate electrode.

In one embodiment of the aspect described above, since at least a part of the source and drain regions may be arranged below the gate electrode, the semiconductor memory element has the same structure as that of an ordinary field-effect transistor, so that the manufacturing process thereof can be made an ordinary field-effect transistor process having hitherto given actual results, and a semiconductor memory device of low manufacturing cost can be provided.

In one embodiment of the semiconductor memory element, the uppermost position of the charge retaining portion may be lower than that of the gate electrode.

In the aspect described above, the charge retaining portion can be arranged only in the vicinity of the channel. Consequently, electrons which are injected by writing are limited into the vicinity of the channel, so that they are easily removed by erasing. Therefore, erroneous erasing can be prevented. Moreover, assuming that the number of injection electrons is not changed by limiting the charge retaining portion, the density of electrons heightens, so that the electrons can be efficiently written/erased, and a semiconductor memory device of high writing/erasing speeds can be formed.

In one embodiment of the semiconductor memory element, the uppermost position of the charge retaining portion may be lower than that of the first insulating film.

In the aspect described above, since the uppermost position of the charge retaining portion is lower than that of a first insulating film, the shortest distance between the gate electrode and the charge retaining portion becomes long. Consequently, the gate electrode and the region which is made of the material having the function of storing charges can be restrained from short-circuiting at siliciding, a wiring step, etc., so that a semiconductor memory device of high available percentage can be formed.

In one embodiment of the semiconductor memory element, the charge retaining portion may consist of a plurality of grains which have the function of storing charges.

In the aspect described above, the charge retaining portion can be limited to a minuter region, so that erroneous erasing can be prevented more effectively. Moreover, since the charge retaining portion is divided into the grains, a leaking region consists only of the grains nearby even in case of the occurrence of leakage, and retaining characteristics are enhanced. Furthermore, since the region made of the material having the function of storing charges can be formed in the shape of nanometer dots by way of example, a memory effect can be extraordinarily enhanced owing to a coulomb blockade effect, and a semiconductor memory element of very high long-term reliability can be formed.

In one embodiment of the semiconductor memory element, it is also allowed that the anti-dissipation insulator consists of a first insulating film which separates the charge retaining portion from the gate electrode and which separates the charge retaining portion from the semiconductor substrate, and a sidewall insulator which is formed at a sidewall part of the charge retaining portion on a side opposite to the first insulating film, and that the charge retaining portion is sandwiched in between the first insulating film and the sidewall insulator.

In the aspect described above, electrons injected by writing are limited into the charge retaining portion, so that they are easily removed by erasing, and that erroneous erasing can be prevented. Furthermore, the volume of the charge retaining portion decreases without changing the quantity of injection charges, so that the quantity of the charges per unit volume can be increase, the electrons can be efficiently written/erased, and a semiconductor memory device of high writing/erasing speeds can be provided.

Further, in one embodiment of the semiconductor memory element, the charge retaining portion may be covered with a first insulating film and a second sidewall insulator.

In the aspect described above, since the charge retaining portion is covered with the second sidewall insulator, the charge retaining portion and a contact can be prevented from short-circuiting at the step of forming the contact for the gate electrode. Accordingly, the design margin of the size of the contact portion can be made still smaller, so that a semiconductor device can be made still finer. Therefore, a semiconductor memory device of curtailed cost can be provided.

Alternatively, in one embodiment of the semiconductor memory element, it is also allowed that the anti-dissipation insulator in the memory functional unit is made of a silicon oxide film or a silicon oxynitride film, and the charge retaining portion in the memory functional unit is made of a silicon nitride film.

In this regard, since the silicon nitride film includes therein a large number of levels trapping charges, it can attain large hysteresis characteristics. Furthermore, the silicon nitride film has a long charge-holding time and is less liable to the problem of charge leakage attributed to the appearance of a leakage path, so that favorable retaining characteristics are attained. Moreover, the material is a material which is used very commonly in an LSI process, so that a manufacturing cost can be suppressed low.

In one embodiment of the semiconductor memory element, the charge retaining portion may consist of a plurality of grains which have the function of storing charges, and a film of semiconductor or conductor which is located between the plurality of grains and the gate electrode and between the plurality of grains and the semiconductor substrate.

In the aspect described above, influence which the dispersions of the positions and sizes of the grains exert on the threshold voltage of a field effect transistor can be suppressed by the interposition of the semiconductor or conductor, so that a semiconductor memory device less liable to readout errors can be provided.

Alternatively, in one embodiment of the semiconductor memory element, at least a part of the charge retaining portion in the memory functional unit may be arranged above the source or drain region.

In the aspect described above, a current value in the readout operation of a semiconductor memory device may be remarkably enhanced, and also the readout speed of the device is remarkably enhanced, so that a semiconductor memory device of high readout speed can be provided.

Further, in one embodiment of the semiconductor memory element, the charge retaining portion in the memory functional unit may have a surface substantially parallel to a surface of the gate insulating film.

In the aspect described above, the facility of the formation of an inversion layer in an offset region can be effectively controlled in accordance with the quantity of charges held in the charge retaining portion, and a memory effect can be intensified. Besides, even in a case where an offset magnitude is discrepant, the change of the memory effect can be kept comparatively small, and the dispersion of the memory effect can be suppressed.

Further, in one embodiment of the semiconductor memory element, the charge retaining portion in the memory functional unit may include a portion extending substantially in parallel with a side surface of the gate electrode.

In the aspect described above, charges injected into the charge retaining part increase in a rewriting operation, so that a rewriting speed is heightened.

Further, in one embodiment of the semiconductor memory element, it is also allowed that the semiconductor memory device comprises an insulating film separating the charge retaining portion in the memory functional unit from the substrate, and the insulating film is thinner than the gate insulating film and is 0.8 nm or more in thickness.

In the aspect described above, the injection of charges into the charge retaining portion may be facilitated, and it is permitted to lower the voltages of writing and erasing operations or to heighten the speeds of them. In addition, the quantity of charges which are induced in the channel region or a well region when charges are held in the charge retaining portion increases, so that a memory effect can be intensified.

Moreover, since the thickness of the insulating film separating the charge retaining portion and the semiconductor substrate is at least 0.8 nm, the extreme degradation of retaining characteristics is suppressed.

Alternatively, it is also allowed that the semiconductor memory device according to an aspect of the invention comprises an insulating film separating the charge retaining portion in the memory functional unit from the substrate, the insulating being thicker than the gate insulating film and 20 nm or less in thickness.

In the aspect described above, since the thickness of the insulating film separating the charge retaining portion and the semiconductor substrate is larger than that of the gate insulating film and is at most 20 nm, the retaining characteristics of a memory can be improved without worsening the short channel effect thereof.

Moreover, since the thickness of the insulating film separating the charge retaining portion and the semiconductor substrate is at most 20 nm, the lowering of a rewriting speed can be suppressed.

An embodiment of the present invention further provides a semiconductor device of the present invention including a semiconductor memory cell and a semiconductor element, each of the semiconductor memory cell and the semiconductor element comprising: a gate insulating film formed on a semiconductor substrate; a gate electrode formed on the gate insulating film; a channel region located below the gate electrode; a pair of source and drain regions arranged on opposite sides, respectively, of the channel region, the source and drain regions having a conductive type opposite to that of the channel region; and memory functional units located on opposite sides, respectively, of the gate electrode, each memory functional unit including a charge retaining portion and an anti-dissipation insulator, the charge retaining portion being made of a material serving to store charges, the anti-dissipation insulator serving to prevent the stored charges from being dissipated, wherein a distance between a sidewall of the gate electrode and a side of the charge retaining portion facing each other is adapted to differ from a distance between a bottom of the first charge retaining portion and a surface of the substrate, wherein the source and drain regions in the memory cell are arranged outside a region below the gate electrode of the memory cell, and a part of the source and drain regions in the semiconductor element is arranged below the gate electrode of the semiconductor element.

Thus, the semiconductor element in which the source and drain diffused regions are not offset with respect to the end parts of the gate electrode, and the semiconductor memory element in which they are offset, coexist on the identical substrate, and the memory functional units having the function of storing charges are arranged at the sidewalls of the gate electrode, in each of both the semiconductor element and the semiconductor memory element. Since, however, the fabricating processes of both the elements do not differ greatly, the coexistence of, for example, a nonvolatile memory formed of the semiconductor memory element, and a logic circuit formed of the semiconductor element can be realized very easily. Moreover, since the thickness of the gate insulating film is not limited, a semiconductor device to which the most advanced MOSFET manufacturing process is easily applicable can be provided.

Further, in one embodiment of the semiconductor device of this invention, a nonvolatile memory portion may include the semiconductor memory element.

In the aspect described above, the nonvolatile memory portion is constructed of a plurality of such semiconductor memory elements, and a logic circuit portion is constructed of such semiconductor elements. It is therefore possible to realize a semiconductor device which includes the nonvolatile memory portion and the logic circuit portion that are easily mounted in coexistence on the identical substrate.

Further, the semiconductor device of one embodiment of this invention may include the logic circuit portion which is driven by a supply voltage that is lower than a supply voltage fed to the nonvolatile memory portion.

In the aspect described above, a high supply voltage can be fed to the nonvolatile memory portion by way of example, so that writing/erasing speeds can be remarkably enhanced. Further, the logic circuit portion can be fed with a low supply voltage, so that the degradations of transistor characteristics attributed to the breakdown of the gate insulating film, etc. can be suppressed, and lowered power consumption can be achieved. It is therefore possible to realize a semiconductor device which includes the logic circuit portion of high reliability and the nonvolatile memory portion of especially high writing/erasing speeds that are easily mounted in coexistence on the identical substrate.

Moreover, the semiconductor device of one embodiment of this invention may further include a static random access memory whose circuit is constructed of such semiconductor elements.

In the aspect described above, the logic circuit portion and the static random access memory are constructed of the semiconductor elements, and the nonvolatile memory portion is constructed of the semiconductor memory elements. It is therefore possible to realize a semiconductor device which includes the logic circuit portion, the static random access memory and the nonvolatile memory portion that are easily mounted in coexistence on the identical substrate. Further, the static random access memory is mounted in coexistence as a high-speed operation memory or a temporary storage memory, whereby more enhancements in performance can be achieved.

According to the present invention, an IC card of this invention includes the semiconductor memory device or the semiconductor device mentioned above.

Thus, the IC card can include the semiconductor device in which the nonvolatile memory and its peripheral circuit portion, the logic circuit portion, the SRAM portion, etc. are easily mounted in coexistence and whose cost can be lowered, so that an IC card of low cost can be provided.

Further, the portable electronic equipment of one embodiment of this invention include the semiconductor memory device or the semiconductor device mentioned above.

Thus, a portable telephone, for example, can include the semiconductor device in which the nonvolatile memory and its peripheral circuit portion, the logic circuit portion, the SRAM portion, etc. are easily mounted in coexistence and whose cost can be lowered, so that a portable telephone of low cost can be provided.

In another aspect, the present invention provides a production method of a semiconductor memory device, comprising the steps of: forming a gate insulating film on the semiconductor substrate and a gate electrode on the gate insulating film; forming a first insulating film on the gate electrode and on the semiconductor substrate; partially removing the first insulating film so that the first insulating film is left on at least sidewalls of the gate electrode; forming a second insulating film on the substrate and on the sidewalls of the gate electrode by either an oxidizing or oxynitriding process, so that a portion of the second insulating film covering the gate electrode sidewalls is thicker than a portion of the second insulating film covering the substrate; forming charge storing regions on the sidewalls of the gate electrode via the second insulating film; and forming source and drain regions by implanting impurities into the substrate by using the gate electrode, the first and second insulating films present on the side walls of the gate electrode, and the charge storing regions, as an implantation mask.

Thus, the thickness of that part of the insulating film of the semiconductor memory element which lies in touch with the gate electrode can be made much different from the thickness of that part thereof which lies in touch with the semiconductor substrate, whereby defective erasing in an erasing mode can be suppressed, or heightened writing/erasing speeds are realized. More specifically, in a case where the insulating film at the part lying in touch with the semiconductor substrate is formed to be thinner relative to the insulating film at the part lying in touch with the gate electrode, the defective erasing in the erasing mode can be suppressed, or charges injected from the semiconductor substrate can be restrained from penetrating the insulating film to the gate electrode, so that a semiconductor memory device of good charge injection efficiency and high writing/erasing speeds can be provided. Conversely, in a case where the first insulating film at the part lying in touch with the semiconductor substrate is formed to be thicker relative to the first insulating film at the part lying in touch with the gate electrode, charges injected from the gate electrode can be restrained from penetrating the first insulating film to the semiconductor substrate, so that a semiconductor memory device of good charge injection efficiency and high writing/erasing speeds can be provided.

Moreover, the source and drain diffused regions of the semiconductor memory element can be formed so as to be offset with respect to the gate electrode, and to be overlapped by the charge storing regions, so that a memory effect is favorable, and a current value in the readout operation of the semiconductor memory device is remarkably enhanced more than in a case where the source and drain diffused regions are not overlapped by the charge storing regions. Consequently, also a readout speed is remarkably enhanced, so that a semiconductor memory device of high readout speed is provided.

The present invention further provides in another aspect, a production method of a semiconductor memory device, comprising the steps of: forming a gate insulating film on a semiconductor substrate and a gate electrode on the gate insulating film, the gate electrode being made of a different composition of material from the substrate; forming an insulating film on the substrate and on sidewalls of the gate electrode using a heat treatment, so that a portion of the insulating film covering the substrate is different in thickness from a portion of the insulating film covering the gate electrode sidewalls; forming charge storing regions on the sidewalls of the gate electrode via the insulating film; and forming source and drain regions by implanting impurities into the substrate by using the gate electrode, the insulating film present on the gate electrode sidewalls, and the charge storing regions, as an implantation mask.

Thus, since the semiconductor substrate and gate electrode of the semiconductor memory element are formed using the materials of different compositions, the thickness of that part of the insulating film which lies in touch with the gate electrode can be made much different from the thickness of that part of the insulating film which lies in touch with the semiconductor substrate, whereby defective erasing in an erasing mode can be suppressed, or heightened writing/erasing speeds are realized.

Moreover, the step of forming the insulating films of the first semiconductor memory element so that the part lying in touch with the gate electrode, and the part lying in touch with the semiconductor substrate may have the different film thicknesses, can be performed by only an ordinary insulating-film forming step without employing an etching step or the like, so that a semiconductor memory device which does not require any complicated step and whose manufacturing cost is low can be provided.

Moreover, the source and drain diffused regions of the semiconductor memory element can be formed so as to be offset with respect to the gate electrode, and to be overlapped by the charge storing regions, so that a memory effect is favorable, and a current value in the readout operation of the semiconductor memory device is remarkably enhanced more than in a case where the source and drain diffused regions are not overlapped by the charge storing regions. Consequently, also a readout speed is remarkably enhanced, so that a semiconductor memory device of high readout speed is provided.

In another aspect, the present invention still further provides a production method of a semiconductor memory device, comprising the steps of: forming a gate insulating film on a semiconductor substrate made of silicon; forming a gate electrode made of silicon, the gate electrode having a larger impurity concentration than that of a region of the substrate located near a surface thereof and having an impurity concentration of $5 \times 10^{19}$ cm$^{-3}$ or more; forming an insulating film on the substrate and on sidewalls of the gate electrode using a heat treatment, so that a portion of the insulating film covering the substrate is different in thickness from that of a portion covering the gate electrode sidewalls; forming charge storing regions on the sidewalls of the gate electrode via the insulating film; and forming source and drain regions by implanting impurities into the substrate by using the gate electrode, the insulating film present on the gate electrode sidewalls, and the charge storing regions, as an implantation mask.

Thus, since the impurity concentration of the gate electrode of the semiconductor memory element is at least $5 \times 10^{19}$ cm$^{-3}$, the effect of impurity-enhanced oxidation appears remarkably. Besides, the semiconductor substrate is formed with a region whose impurity concentration is lower than the impurity concentration of the gate electrode, and the insulating films based on the heat treatment are formed on the semiconductor substrate and the gate electrode, whereby the thickness of that part of the first insulating film which lies in touch with the gate electrode can be made much different from the thickness of that part of the insulating film which lies in touch with the semiconductor substrate, so that a semiconductor memory device which does not require any complicated step such as etching and whose manufacturing cost is low can be provided.

Furthermore, in a case where the first insulating film at the part lying in touch with the semiconductor substrate of the semiconductor memory element is formed to be thinner relative to the first insulating film at the part lying in touch with the gate electrode, charges injected from the semiconductor substrate can be restrained from penetrating the first insulating film to the gate electrode, so that a semiconductor memory device of good charge injection efficiency and high writing/erasing speeds can be provided.

In another aspect, the present invention still further provides a production method of a semiconductor memory device, comprising the steps of: forming a gate insulating film on a semiconductor substrate made of silicon, the substrate having an impurity region with an impurity concentration of $5 \times 10^{19}$ cm$^{-3}$ or more near a surface of the substrate; forming a gate electrode made of silicon, the gate electrode having a smaller impurity concentration than that of the impurity region near the surface of the substrate and having an impurity concentration of $1 \times 10^{20}$ cm$^{-3}$ or less; forming an insulating film on the substrate and on sidewalls of the gate electrode using a heat treatment, so that a portion of the insulating film covering the substrate is different in thickness from that of a portion covering the gate electrode sidewalls; forming charge storing regions on the sidewalls of the gate electrode via the insulating film; and forming source and drain regions by implanting impurities into the substrate by using the gate electrode, the insulating film present on the gate electrode sidewalls, and the charge storing regions, as an implantation mask.

Thus, since the gate electrode of the semiconductor memory element has the impurity concentration which is at most $1 \times 10^{20}$ cm$^{-3}$ and which is lower than that of the semiconductor substrate, a condition under which the effect of impurity-enhanced oxidation does not appear can be set for the gate electrode, whereas the effect of impurity-enhanced oxidation begins to conspicuously appear in the semiconductor substrate when the impurity concentration thereof is higher than that of the gate electrode and is at least $5 \times 10^{19}$ cm$^{-3}$. Therefore, when insulating films based on the heat treatment are formed on the semiconductor substrate and the gate electrode, the thickness of that part of the first insulating film which lies in touch with the gate electrode can be consequently made much different from the thickness of that part of the first insulating film which lies in touch with the semiconductor substrate, so that a semiconductor memory device which does not require any complicated step and whose manufacturing cost is low can be provided. In addition, the thickness of the part of the first insulating film lying in touch with the gate electrode is much different from the thickness of the part of the first insulating film lying in touch with the semiconductor substrate, so that a semiconductor memory device of remarkably high writing/erasing speeds can be provided.

Moreover, the first insulating film of the semiconductor memory element is thicker at the part lying in touch with the semiconductor substrate, than at the part lying in touch with the gate electrode, and hence, charges injected from the gate electrode can be restrained from penetrating the first insulating film to the semiconductor substrate, so that a semiconductor memory device of good charge injection efficiency and high writing/erasing speeds can be provided.

Further, in a case where the thickness of the first insulating film at the part lying in touch with the semiconductor substrate of the semiconductor memory element is made smaller than the thickness of the first insulating film at the part lying in touch with the gate electrode of the element, charges injected from the semiconductor substrate can be restrained from penetrating the first insulating film to the gate electrode, so that a semiconductor memory device of good charge injection efficiency and high writing/erasing speeds can be provided.

With reference to the attached drawings, the present invention will hereinafter be described in detail by way of embodiments thereof. Incidentally, the invention shall not be restricted by the embodiments.

(First Embodiment)

As shown in FIG. 1(a), the semiconductor memory device of this embodiment is characterized by chiefly comprising a gate electrode 3 which is formed above a semiconductor substrate 1 through a gate insulating film 2, a channel region 19 which is arranged under the gate electrode 3, a pair of source and drain diffused regions 13 which are respectively arranged on both the sides of the channel region 19 and which has an opposite conductivity type to that of the channel region 19, and memory functional units 30 which are respectively formed on both the sides of the gate electrode 3 and each of which has the function of storing charges, wherein each of the memory functional units 30 includes a charge retaining portion 31 capable of retaining charges, and a anti-dissipation insulator 32 capable of suppressing the scattering of charges, the charge retaining portion 31 is separated from the gate electrode 3 and the semiconductor substrate 1 by the anti-dissipation insulator 32, the semiconductor substrate 1 and the gate electrode 3 are formed of materials of different compositions, and the distance T2 between the charge retaining portion 31 and the gate electrode 3 is different from the distance T1 between the charge retaining portion 31 and the semiconductor substrate 1. Here, in a case where the distance T2 between the gate electrode 3 and the charge retaining portion 31 is not constant, the distance of the nearest part of the charge retaining portion 31 is set as the distance T2.

Further, one aspect of this invention corresponds to a case where the gate electrode 3 and the semiconductor substrate 1 are made of silicon, and where they have impurity concentrations different from each other. In that case, films can be easily formed to thicknesses affording the different distances T1 and T2, without requiring any special step such as etching, by utilizing the fact that a film formation rate is influenced by the silicon impurity concentration of an oxide film which is to be formed on silicon (what is called "impurity-enhanced oxidation").

Here, the designations of the memory functional units and the constituents thereof shall be defined as stated below.

As shown in FIG. 1(a), the "memory functional units 30" indicate regions which have the function of storing charges, and which are respectively formed sideward of the gate electrode 3. Further, each of the memory functional units 30 consists of the charge retaining portion 31 which is a portion capable of retaining charges, and the anti-dissipation insulator 32 which is a portion for suppressing the scattering of charges.

Incidentally, numeral 8 in FIG. 1(a) denotes a gate stack which includes the gate insulating film 2 and the gate electrode 3. Numerals 20 denote offset regions. Sign TG denotes the thickness of the gate insulating film 2.

Besides, as shown in FIG. 1(b), one aspect of each memory functional unit 30 corresponds to a case where the anti-dissipation insulator 32 is divided into a first insulator 32a and a second insulator 32b. Here, for the sake of convenience, the region of the memory functional unit 30 except the first insulator 32a, that is, the region which consists of the charge retaining portion 31 and the second insulator 32b shall be termed a "charge storing region 33". The charge storing region 33, however, sometimes consists only of the charge retaining portion 31 as stated below.

As shown in FIG. 1(c), each memory functional unit 30 comprises the first insulator 32a and the charge retaining portion 31, without including the second insulator 32b. In such a case, the charge storing region 33 consists only of the charge retaining portion 31.

As illustrated in the figure, the charge storing region is not formed in the gate insulating film portion of a field effect transistor as stated in the prior art, but it is formed sideward of the gate electrode, so that the problem of over-erasure involved in the prior art is substantially eliminated.

Moreover, the first insulator 32a can form the different film thicknesses by a very simple step without requiring, for example, the etching step for especially endowing the film with the different thicknesses.

Besides, owing to a variable resistance effect based on the memory functional units, the semiconductor memory device can function as a memory cell which has both the functions of a selection transistor and a memory transistor.

Besides, the semiconductor substrate and the gate electrode should preferably be formed of materials composed of silicon. In that case, since the semiconductor substrate and the gate electrode are made of silicon which is currently often employed as the material of semiconductor devices, a semiconductor process which is highly affinitive with a prior-art semiconductor manufacturing process can be constructed, and hence, a semiconductor memory device of low manufacturing cost can be provided.

Besides, in the embodiment of the semiconductor memory device of this invention, when one element stores information of 2 or more bits therein, it can also function as a memory element for storing information of four or more values.

Besides, the semiconductor memory element shown in FIG. 1 is in a shape in which the distance T2 widens more with a distance from the semiconductor substrate. Thus, the upper part of the charge retaining portion is formed to be remoter from the gate electrode than the lower part thereof, so that the injection of unnecessary charges into the upper part of the charge retaining portion can be suppressed. By way of example, it is possible to sharply suppress the injection of electrons from the gate electrode as might occur in an erasing mode. Further, since the lower part is not so remote as the upper part, charges to be held are formed without becoming unnecessarily remote from a channel region, and hence, an effect which the quantity of held charges gives to a drive current quantity can be satisfactorily kept. Owing to the above, the injection and scattering of the unnecessary charges can be suppressed without decreasing the difference between readout currents in writing/erasing modes. Meanwhile, in FIG. 1, the state of the different distances is explicitly illustrated in order to explain the distance T2 in detail, but also in the other embodiments, it is needless to say that the same aspect can be adopted even when not especially illustrated, and that the attendant advantages can be similarly achieved.

Besides, the semiconductor memory device of an embodiment of this invention may well be constructed as stated below.

The semiconductor memory element functions as a semiconductor memory element for storing information of four or more values therein, in such a way that information of two or more values is stored in one memory functional unit. Moreover, owing to a variable resistance effect based on the memory functional units, the semiconductor memory element can function as a memory cell which has both the functions of a selection transistor and a memory transistor. However, the semiconductor memory element need not always function by storing the information of four or more values, but it may well function by storing, for example, information of two values.

The semiconductor memory device of this invention should preferably be formed on a semiconductor substrate, or on a well region of the same conductive type as that of a channel region formed within the semiconductor substrate.

The semiconductor substrate is not especially restricted as long as it is used for semiconductor devices. Mentioned as the semiconductor substrate is, for example, one which is made of an element semiconductor such as silicon or germanium; or a compound semiconductor such as silicon germanium, GaAs, InGaAs, ZnSe or GaN. It is also allowed to employ a semiconductor substrate having a semiconductor layer at its front surface, for example, any of various substrates such as an SOI (Silicon On Insulator) substrate or multilayer SOI substrate, or a glass or plastics substrate overlaid with the semiconductor layer. Among them, the silicon substrate or the SOI substrate formed with a silicon layer at its front surface is favorable. The semiconductor substrate or the semiconductor layer may be any of a single crystal (based on, for example, epitaxial growth), a polycrystal and an amorphous substance though the quantities of currents to flow therein are somewhat different. When the SOI substrate is employed, the capacities of source and drain diffused regions and the semiconductor substrate can be restrained to the minimum, so that a semiconductor device capable of high speed operation can be provided.

An element isolation region should preferably be formed on the semiconductor substrate or the semiconductor layer. Further, a semiconductor device may well be formed of a single-layer or multilayer structure by combining the semiconductor substrate or layer with elements such as transistors, capacitors and resistors, circuits formed of the elements, another semiconductor device, and inter-layer insulating films. Incidentally, the element isolation region can be formed of any of various element isolation films such as a LOCOS film, a trenched oxide film and an STI film. The semiconductor substrate may have the conductive type of either the P-type or the N-type, and at least one well region of the first conductive type (P-type or N-type) should preferably be formed in the semiconductor substrate. The impurity concentrations of the semiconductor substrate and the well region may be within ranges known in the pertinent field. By the way, in the case of employing the SOI substrate as the semiconductor substrate, the well region may be formed in the surface semiconductor layer, and a body region may well be held under a channel region. In this manner, the well region and the body region which are formed in the semiconductor substrate and the surface semiconductor layer have the opposite conductive type to that of the impurity of the source and drain diffused regions, and they are adjusted to appropriate impurity concentrations. More specifically, current which leaks from one of the source and drain diffused regions to the other can be decreased by forming the well region and the body region. Thus, it is also possible to relieve a substrate floating effect which poses a problem in the case of employing the SOI substrate.

However, in order that an insulating film for a gate electrode and an insulating film on the semiconductor substrate may be formed having different thicknesses, the impurity concentration of the well region in insulating-film forming regions in the case of forming the insulating films is recommended to be set to differ from the impurity concentration of the gate electrode. Preferably, when the impurity concentration is set to be lower, it is at most $1 \times 10^{20}$ cm$^{-3}$, and when it is set to be higher, it is at least $5 \times 10^{19}$ cm$^{-3}$. In that case, the insulating film for the gate electrode and the insulating film on the semiconductor substrate can be effectively formed so as to have the different thicknesses.

In this regard, in case of forming an impurity region which is formed in the vicinity of the front surface of the substrate and which utilized for, for example, a threshold voltage adjustment by channel implantation or the like, the concentration of the impurity region may satisfy the above conditions.

The gate insulating film or insulating film is not especially restricted as long as it is usually used for semiconductor devices. It is possible to use, for example, a single-layer film or stacked-layer film which consists of any of insulating films such as a silicon oxide film and a silicon nitride film, and highly dielectric films such as an aluminum oxide film, a titanium oxide film, a tantalum oxide film and a hafnium oxide film. Among them, the silicon oxide film is favorable. The gate insulating film should suitably be formed to a thickness of, for example, about 1–20 nm, preferably about 1–6 nm. This gate insulating film may be formed only directly under the gate electrode, or it may well be formed to be larger (wider) than the gate electrode. The wider gate insulating film can serve also as an insulating film under a charge storing region, depending upon a structure and a process, so that the manufacturing process of the semiconductor memory device can be simplified.

The gate electrode or electrode is formed on the gate insulating film in a shape which is usually used for semiconductor devices, or in a shape which has a recess at a lower end part. Incidentally, the "single gate electrode" signifies a gate electrode which is formed in an integral shape without being separated by a single-layer or multi-layer conductive film. Besides, the gate electrode may well have sidewall insulating films on sidewalls. Further, the gate electrode is formed on the gate insulating film. In addition, the gate electrode is formed using a material being a conductive film which is usually used for semiconductor devices, for example, a single-layer film or stacked-layer film which is made of any of polysilicon, a metal such as copper or aluminum, a refractory metal such as tungsten, titanium or tantalum, and a silicide with the refractory metal. In particular, the material of the gate electrode may be selected so as to differ from that of the semiconductor substrate. Usually, the silicon substrate is employed for the semiconductor substrate. In this case, therefore, the gate electrode material should preferably be the single-layer film or stacked-layer film which is made of any of the metal such as copper or aluminum, the refractory metal such as tungsten, titanium or tantalum, and the silicide with the refractory metal. In that case, the insulating film for the gate electrode and the insulating film on the semiconductor substrate can be formed so as to have much different thicknesses.

The gate electrode should suitably be formed so as to have a thickness of, for example, about 50–400 nm. Incidentally, a channel region is formed under the gate electrode. The channel region should preferably be formed under a region which includes, not only the gate electrode, but also outer sides of gate ends in the direction of a gate length. In a case where those parts of the channel region which are not covered with the gate electrode exist in this manner, they should preferably be covered with the gate insulating film or with charge storing regions to be explained later.

Further, it is important that the gate electrode differs from the semiconductor substrate in a formation rate during the formation of the first insulator 32a. More specifically, the gate electrode material, in turn, the semiconductor substrate material are determined so that, when processing for forming the insulating film has been conducted for a desired time period, the thickness T1 of the insulating film formed on the semiconductor substrate may differ from the thickness T2 of this insulating film formed on the sidewall parts of the gate electrode. Thus, the film thicknesses can be made different in self-alignment fashion by a simple step, so that a semiconductor memory device which requires no complicated step and whose manufacturing cost is low can be provided.

Further, the insulators 32a may be such that the thickness T1 of the part lying in touch with the semiconductor substrate is smaller relative to the thickness T2 of the part lying in touch with the gate electrode 3. Thus, charges injected from the semiconductor substrate can be restrained from penetrating the insulators to the gate electrode, so that a semiconductor memory device of good charge injection efficiency and high writing/erasing speeds can be provided.

Besides, in the first embodiment of this invention, the insulators 32a, 32b may well be such that the thickness T1 of the part lying in touch with the semiconductor substrate is larger relative to the thickness T2 of the part lying in touch with the gate electrode 3. Thus, charges injected from the gate electrode can be restrained from penetrating the insulators to the semiconductor substrate, so that a semiconductor memory device of good charge injection efficiency and high writing/erasing speeds can be provided.

Each memory functional unit is constructed including, at least, a film or region which has the function of retaining charges, or storing and retaining charges, or which has the function of trapping charges, or retaining a charge polarization state. Mentioned as a material fulfilling such a function is silicon nitride; silicon; silicate glass containing an impurity such as phosphorus or boron; silicon carbide; alumina; a highly dielectric substance such as hafnium oxide, zirconium oxide or tantalum oxide; zinc oxide; ferroelectrics; metal; or the like. The memory functional unit can be formed of, for example, a single-layer or stacked-layer structure which is made of any of an insulator film including a silicon nitride film; an insulator film including a conductive film or a semiconductor layer therein; an insulator film including at least one conductor or semiconductor dot; and an insulating film including a ferroelectrics film in which internal charges are polarized by an electric field, and in which the polarized state is held. Among them, the silicon nitride film can attain large hysteresis characteristics owing to the existence of a large number of levels trapping charges. Moreover, it exhibits a long charge retaining time period and is free from the problem of charge leakage ascribable to the appearance of leakage paths, so that it has good retaining characteristics. Furthermore, since it is a material commonly used in LSI processes, it is favorable.

When an insulating film which includes therein an insulating film, such as the silicon nitride film, having the charge retaining function is employed for the memory functional unit, reliability concerning storage retention can be enhanced. The reason therefor is that the silicon nitride film is an insulator, so even when the leakage of charges has occurred at a part thereof, the charges of the whole silicon nitride film are not immediately lost. Furthermore, in case of arraying a plurality of semiconductor memory elements, even when the distance between the semiconductor memory elements shortens to bring the adjacent memory functional units into touch, information items stored in the respective memory functional units are not lost as in the case of memory functional units made of a conductor. Moreover, a contact plug can be arranged nearer to the memory functional unit and can be sometimes arranged so as to overlap the memory functional unit, so that the microfabrication of a semiconductor memory device is facilitated.

Further, in order to enhance the reliability concerning storage retention, the insulating "film" having the charge retaining function is not always required, but an insulator having the charge retaining function should preferably be discretely existent in an insulating film. Concretely, the insulator should preferably be dispersed in the shape of dots in a material difficult of retaining charges, for example, silicon oxide.

Besides, a conductor or a semiconductor may well be employed as the material of the charge storing region. Thus, the quantity of injection of charges into the conductor or semiconductor can be freely controlled, to bring forth the advantage that a semiconductor memory device can be easily constructed as a multivalued one.

Further, when the insulator film which includes at least one conductor or semiconductor dot therein is employed as the material of the charge storing region, charges can be easily written/erased by direct tunneling, to bring forth the advantage of lowering power dissipation.

Besides, the ferroelectrics film, such as PZT or PLZT, the polarization direction of which is changed by an electric field may well be employed as the material of the charge storing region. In this case, charges are, in effect, generated in the front surface of the ferroelectrics film by polarization, and the charged state is held. Accordingly, the ferroelectrics film can attain hysteresis characteristics similar to those of a film which has the memory function and which is supplied with charges from outside so as to trap the charges. Moreover, the ferroelectrics film retains charges without requiring charge injection from outside it, and it can attain the hysteresis characteristics by only the polarization of the charges within the film, to bring forth the advantage that information can be written/erased at high speed.

Besides, each memory functional unit should preferably further include a region which makes charges difficult of escaping, or a film which has the function of making charges difficult of escaping. A silicon oxide film, or the like is mentioned as the film which fulfills the function of making charges difficult of escaping.

The charge retaining portions included in the memory functional units are formed on both the sides of the gate electrode directly, or through the insulating film, and they are directly arranged over the semiconductor substrate (well region, body region, or source and drain regions or diffused regions) through the gate insulating film or the insulating film. The charge retaining portions on both the sides of the gate electrode should preferably be formed so as to cover the sidewalls of the gate electrode entirely or partly, directly or through the insulating film. As an example of application, in a case where the gate electrode has a recess at its lower end part, the charge retaining portions may well be formed so as to fill up the recess completely or partly, directly or through the insulating film. It is favorable that the gate electrode is formed on only the sidewalls of the memory functional units, or that it does not cover the upper parts of the memory functional units. Owing to such an arrangement, a contact plug can be located nearer to the gate electrode, so that the microfabrication of a semiconductor memory device is facilitated. Moreover, the semiconductor memory device having such a simple arrangement is easy of manufacture, and it can enhance available percentage.

In case of employing a conductive film as each charge retaining portion, the charge retaining portion should preferably be arranged through the insulating film so as not to come into direct touch with the semiconductor substrate (well region, body region, or source and drain region or diffused region) or with the gate electrode. Mentioned as the charge retaining portion is, for example, a stacked structure which consists of the conductive film and the insulating film, a structure in which the conductive film is dispersed in the shape of dots or the like in the insulating film, or a structure in which the conductive film is arranged in part of a sidewall insulating film formed on the sidewall of the gate.

The source and drain diffused regions are respectively arranged on the opposite sides of the charge storing regions with respect to the gate electrode, as diffused regions which have the conductive type opposite to that of the semiconductor substrate or the well region. The junction between each of the source and drain diffused regions and the semiconductor substrate or well region should preferably have an abrupt impurity gradient. The reason therefor is that hot electrons or hot holes are efficiently generated in a low voltage, so a high speed operation is realized by a lower voltage. The junction depth of each of the source and drain diffused regions is not especially restricted, but it can be appropriately adjusted in accordance with the performance, etc. of a semiconductor memory device intended to be obtained. By the way, in case of employing an SOI substrate as the semiconductor substrate, each of the source and drain diffused regions may well have a junction depth smaller than the thickness of the surface semiconductor layer of the SOI substrate, but it should preferably have a junction depth substantially equal to the thickness of the surface semiconductor layer.

The source and drain regions may well be arranged so as to overlap the ends of the gate electrode, so as to register with the gate electrode ends, or so as to lie offset with respect to the gate electrode ends. Particularly in the case of the offset arrangement, when a voltage is applied to the gate electrode, the facility of the inversion of offset regions under the charge retaining portions changes greatly, depending upon the quantities of charges stored in the memory functional units. Favorably, accordingly, a memory effect increases, and a short channel effect decreases. However, when the source and drain regions offset excessively, the drive current between the source and the drain becomes conspicuously small. Therefore, the magnitude of the offset, that is, a distance from either gate electrode end to the nearer one of the source and drain regions as viewed in the gate length direction should preferably be shorter than the thickness of the charge retaining portion in the gate length direction. Especially important is that at least a part of the charge retaining portion in the memory functional unit overlaps the source and drain region being the diffused region. This is because the essence of the semiconductor memory element constituting the semiconductor memory device of this embodiment of the invention is that storage is rewritten by an electric field which traverses the memory functional unit on the basis of the voltage difference between the gate electrode existing at only the sidewall part of the memory functional unit and the source and drain region.

Each of the source and drain regions may well be partly extended to a position which is higher than the front surface of the channel region, that is, the lower surface of the gate insulating film. In this case, a conductive film integral with the source and drain region should suitably be stacked and formed on, the source and drain region formed in the semiconductor substrate. Mentioned as the material of the conductive film is, for example, a semiconductor such as polysilicon or amorphous silicon, silicide, or the metal or refractory metal mentioned before. Among them, the polysilicon is favorable. The reason therefore is that, since the polysilicon is much higher in the rate of impurity diffusion as compared with the semiconductor substrate, the junction depth of the source and drain region in the semiconductor substrate is readily shallowed, so the short channel effect is easily suppressed. By the way, in this case, part of the source and drain region should preferably be located so as to sandwich at least part of the memory functional unit together with the gate electrode.

The semiconductor memory device of this invention can be formed by an ordinary semiconductor process, for example, a method which is similar to a method wherein sidewall spacers of single-layer or stacked-layer structure are formed on the sidewalls of a gate electrode. Concretely mentioned is a method wherein, after a gate electrode or an electrode has been formed, a single-layer film including charge retaining portions, or a stacked-layer film including charge retaining portions, such as charge retaining portions/insulating film, insulating film/charge retaining portions, or insulating film/change retaining portions/insulating film, is formed, and the film is etched back under suitable conditions so as to be left behind in the shape of sidewall spacers. Also mentioned is a method wherein an insulating film or a charge retaining portion is formed, and it is etched back under suitable conditions so as to be left behind in the shape of a sidewall spacer, and further, an insulating film or a charge retaining portion is formed, and it is similarly etched back so as to be left behind in the shape of a sidewall spacer. Also usable is a method wherein an insulating film material in which a charge retaining material being granular is dispersed is applied or deposited on a semiconductor substrate including a gate electrode, and it is etched back under suitable conditions so as to be left behind in the shape of sidewall spacers. Also possible is a method wherein, after a gate electrode has been formed, the single-layer film or stacked-layer film mentioned above is formed and is patterned using a mask. Another concrete method is one wherein, before a gate electrode or an electrode is formed, a film including charge retaining portions, or such a film including charge retaining portions as charge retaining portions/insulating film, insulating film/charge retaining portions, or insulating film/charge retaining portions/insulating film, is formed, an opening is formed in the region of the film to become a channel region, a gate electrode material film is formed on the whole area of the resulting structure, and the gate electrode material film is patterned in a shape which includes the opening and which is larger than the opening.

In a case where a memory cell array is constructed by arraying the semiconductor memory elements of this invention, the best mode of a semiconductor memory device satisfies the following requisites by way of example: (1) The gate electrodes of a plurality of semiconductor memory elements are integral, and have the function of a word line. (2) Memory functional units are formed on both the sides of the word line. (3) It is an insulator, especially a silicon nitride film that retains charges in a memory functional unit. (4) A memory functional unit is made of an ONO (Oxide Nitride Oxide) film, and a silicon nitride film has a surface which is substantially parallel to the surface of a gate insulating film. (5) A silicon nitride film in a memory functional unit is separated from a word line and a channel region by a silicon oxide film. (6) A silicon nitride film in a memory functional unit overlaps a diffused layer. (7) The thickness of an insulating film which separates a channel region or a semiconductor layer and a silicon nitride film having a surface substantially parallel to the surface of a gate insulating film is different from the thickness of the gate insulating film. (8) The writing and erasing operations of one semiconductor memory element are performed by a single word line. (9) An electrode (word line) which has the function of assisting in writing and erasing operations is not existent over a memory functional unit. (10) A region of high impurity concentration in the opposite conductive type to the conductive type of a diffused region, is existent at a part which lies directly under a memory functional unit and which is in touch with the diffused region.

Although the satisfaction of all the requisites affords the best mode, it is a matter of course that all the requisites need not always be met.

In a case where two or more of the requisites are satisfied, especially favorable combinations are existent. An examples of the combinations corresponds to cases where (3) it is an insulator, especially a silicon nitride film that retains charges in a memory functional unit, (9) an electrode (word line) which has the function of assisting in writing and erasing operations, is not existent over the memory functional unit, and (6) the insulating film (silicon nitride film) in the memory functional unit overlaps a diffused layer. In a case where it is an insulator that retains charges in a memory functional unit, and where an electrode which has the function of assisting in writing and erasing operations, is not existent over the memory functional unit, it has been found out that the writing operation is favorably executed only in a case where the insulating film (silicon nitride film) in the memory functional unit overlaps a diffused layer. That is, in the case where the requisites (3) and (9) are satisfied, it is especially favorable to satisfy the requisite (6). On the other hand, in a case where it is a conductor that retains charges in a memory functional unit, or where an electrode which has the function of assisting in writing and erasing operations, is existent over the memory functional unit, the writing operation has been executable even in a case where the insulating film in the memory functional unit does not overlap a diffused layer. However, in a case where it is an insulator, not a conductor, that retains charges in a memory functional unit, or where an electrode which has the function of assisting in writing and erasing operations, is not existent over the memory functional unit, very great advantages can be brought forth as stated below. A contact plug can be located nearer to the memory functional unit, or even when a plurality of memory functional units interfere due to the shortened distance between semiconductor memory elements, stored information can be held, so that the microfabrication of a semiconductor memory device is facilitated. Moreover, since an element structure is simple, the number of steps decreases, and available percentage is enhanced, so that a semiconductor memory device can easily coexist with transistors which constitute a logic circuit or an analog circuit. Furthermore, it has been verified that writing and erasing operations are executed at a voltage as low as 5 V or below. In view of the above, it is especially favorable to satisfy the requisites (3), (9) and (6).

The semiconductor memory device of this invention or a semiconductor memory device combined with logic elements is applicable to battery-driven portable electronic equipment, particularly a portable information terminal. The portable information terminal, a portable telephone, a game machine, or the like is mentioned as the portable electronic equipment.

Now, several embodiment of this invention will be illustrated and described in detail. Needless to say, this invention is not restricted to the embodiments described below.

In the ensuing embodiments, there will be explained a case where an N-channel type element is employed as a memory, but a P-channel type element may well be employed as a memory. In this case, all the conductive types of impurities may be reversed.

Besides, in the illustration of the drawings of this invention, identical signs are assigned to portions which employ the same materials and substances, and the portions do not always indicate similar shapes.

Besides, the drawings of this invention is schematic, and it is to be noted that the relations between thicknesses and planar dimensions, the ratios of the thicknesses and sizes of individual layers or individual portions, etc. are different from actual ones. Accordingly, the dimensions of practicable thicknesses or sizes shall be judged in consideration of the ensuing description. It is also a matter of course that the drawing contains parts where the relations or ratios of dimensions differ among them.

(Second Embodiment)

The second embodiment of this invention will be described with reference to FIG. 2(a)–FIG. 2(d). As shown in FIG. 2(d), a memory element constituting a semiconductor memory device in this embodiment is such that a gate electrode 3 is formed above a semiconductor substrate 1 through a gate insulating film 2, that first insulators 32a each having at least two sorts of film thicknesses are formed on the semiconductor substrate 1 and the side surfaces of a gate stack 8 which consists of the gate insulating film 2 and the gate electrode 3, and that charge storing regions 33 of sidewall shape are respectively formed on both the sides of the gate electrode 3 through the first insulators 32a each having at least two sorts of film thicknesses. Besides, a pair of source and drain diffused regions 13 are formed below the charge storing regions 33.

The first insulators 32a each having at least two sorts of film thicknesses can be endowed with the two or more sorts of film thicknesses by a very simple step without especially requiring the addition of, for example, an etching step for working the two or more sorts of film thicknesses.

Further, the source and drain diffused regions 13 are offset with respect to the end parts of the gate electrode 3. That is, in the front surface of the semiconductor substrate 1, the source and drain diffused regions 13 do not lie under the gate electrode 3, but each of them is spaced from the gate electrode 3 the width of a corresponding offset region 20. In other words, the channel region 19 between the source and drain diffused regions 13 is arranged under the charge storing regions 33 to the amounts of the widths of the offset regions 20, in the front surface of the semiconductor substrate 1. Thus, the injection of electrons and the injection of holes into the charge storing regions 33 are efficiently performed, so that a memory element of high writing and erasing speeds can be formed.

Besides, since the source and drain diffused regions 13 are offset from the gate electrode 3 in the memory element, the facility of the inversion of the parts of the offset regions 20 under the charge retaining portions 33 upon the application of a voltage to the gate electrode 3 can be greatly changed, depending upon the quantities of charges stored in the charge storing regions 33, so that a memory effect can be increased. Further, the memory element can intensely prevent a short channel effect as compared with a MOSFET of ordinary structure, and a gate length can be shortened still further. Moreover, since the memory element is suited to suppress the short channel effect owing to its structure, it can adopt a gate insulating film thicker than that of a logic transistor and can enhance its reliability.

Besides, the charge storing regions 33 of the memory transistor are formed independently of the gate insulating film 2. Accordingly, a memory function borne by the charge storing regions 33, and a transistor operation function borne by the gate insulating film 2 are separated from each other. Moreover, the charge storing regions 33 can be formed by selecting a material suitable for the memory function.

The memory element can be formed via steps similar to those of an ordinary logic transistor.

Now, a manufacturing process will be described in due course along FIG. 2(*a*)–FIG. 2(*d*).

Figure 2:
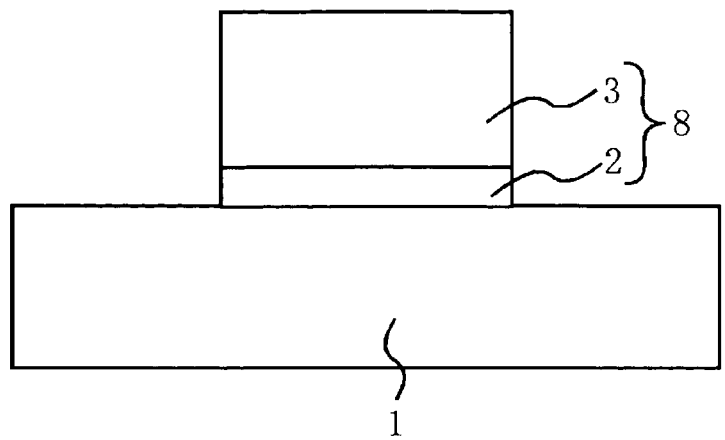
FIGS. 2a–2d are schematic sectional views showing a production process of a semiconductor memory device according to the second embodiment of the present invention.
Figure 2:
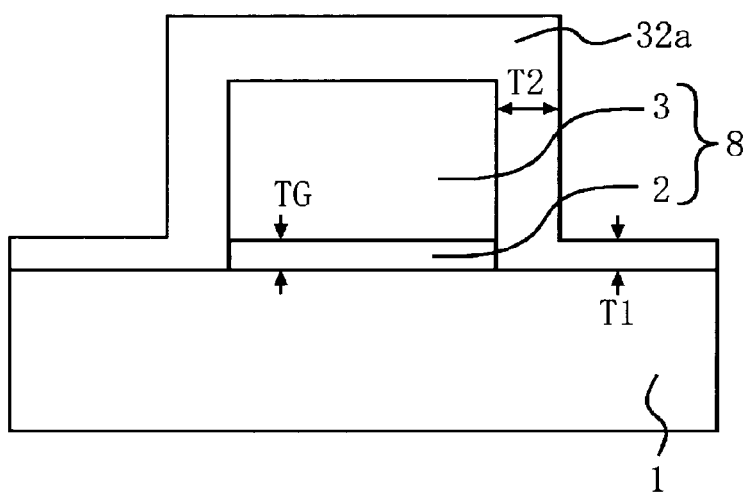
Figure 2:
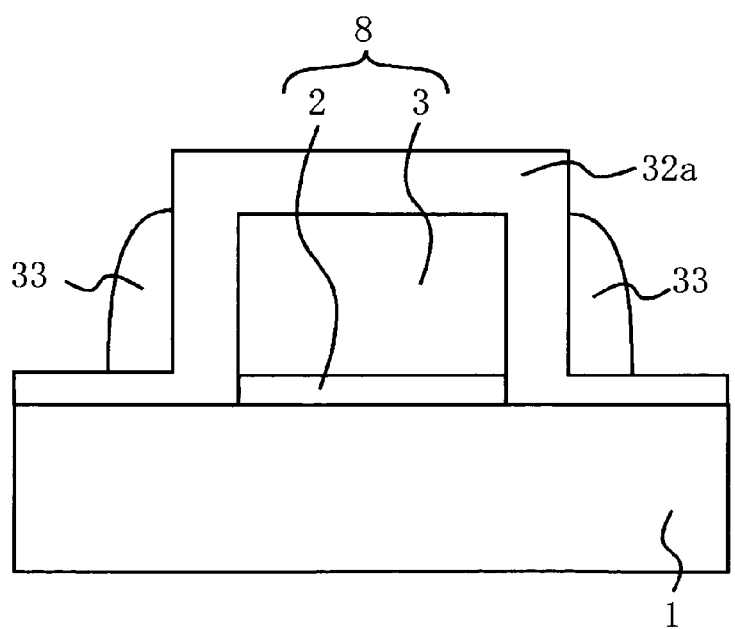
Figure 2:
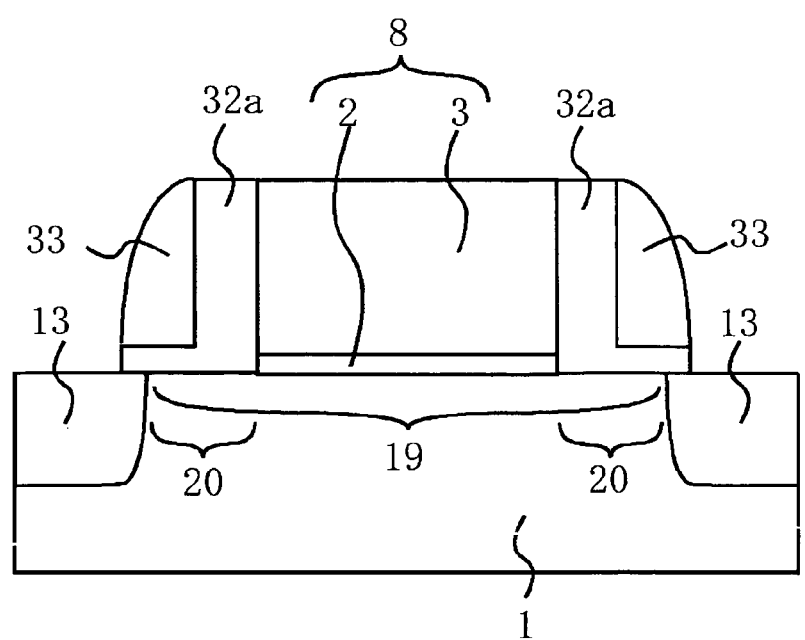

As shown in FIG. 2(*a*), a gate insulating film 2 and a gate electrode 3, namely, a gate stack 8, which have/has a MOS (Metal-Oxide-Semiconductor) structure and which have/has undergone a MOS formation process are/is formed on a semiconductor substrate 1 having the P-conductive type.

A typical MOS formation process is as stated below.

First, an element isolation region is formed by a known method in the semiconductor substrate 1 which is made of silicon and which has a P-type semiconductor region. The element isolation region can prevent a leakage current from flowing between adjacent elements through the substrate. However, such an element isolation region need not be formed in a device in which source and drain diffused regions are shared between the adjacent elements. The "known method of forming the element isolation region" may be a known method which employs a LOCOS oxide film, a known method which employs a trenched isolation region, or any other known method as long as it can achieve the purpose of isolating elements. The element isolation region is not especially shown.

Subsequently, although not especially shown, impurity diffused regions are formed in the vicinities of the front surfaces of the denuded parts of the semiconductor substrate 1. The impurity diffused regions serve to adjust a threshold voltage, and heightens the impurity concentration of a channel region. Besides, as an especially important reason, in order that an insulating film for a gate electrode and an insulating film on the semiconductor substrate 1 may be formed having different thicknesses, the impurity concentration of the semiconductor substrate surface in insulating-film forming regions in the case of forming the insulating films is set to differ from the impurity concentration of the gate electrode 3. Preferably, when the impurity concentration is set to be lower, it may be at most $1 \times 10^{20}$ cm$^{-3}$, and when it is set to be higher, it may be at least $5 \times 10^{19}$ cm$^{-3}$. In that case, the insulating film for the gate electrode 3 and the insulating film on the semiconductor substrate 1 can be effectively formed so as to have the different thicknesses.

Subsequently, an insulating film is formed on the whole denuded surface of the semiconductor region. Since the insulating film may be capable of suppressing leakage, it is also allowed to employ any of an oxide film, a nitride film, a composite film consisting of an oxide film and a nitride film, a highly dielectric insulating film such as hafnium oxide film or zirconium oxide film, and a composite film consisting of a highly dielectric insulating film and an oxide film. Further, since the insulating film becomes the gate insulating film of a MOSFET, a film affording a good performance as the gate insulating film should desirably be formed by employing a step which includes N$_2$O oxidation, NO oxidation, nitriding after oxidation, or the like. The "film affording a good performance as the gate insulating film" signifies an insulating film which can suppress all inconvenient factors in promoting the microfabrication and enhanced performance of the MOSFET, and which can suppress, for example, the short channel effect of the MOSFET, a leakage current which is a current unnecessarily flowing through the gate insulating film, and the diffusion of a gate electrode impurity into the channel region of the MOSFET while suppressing the depletion of the impurity of the gate electrode. As typical examples of the film and its thickness, a thickness within a range of 1 to 6 nm is suitable in an oxide film such as thermal oxide film, N$_2$O oxide film or NO oxide film.

Subsequently, polysilicon doped with an impurity is formed on the gate insulating film. The impurity is added in order to heighten an electric conductivity for allowing the polysilicon to act as the gate electrode, and as an important point, in order to attain the effect of so-called "impurity-enhanced oxidation" which is the increase of the oxidation rate of silicon based on doping with an impurity. More specifically, a first insulator 32*a* (refer to FIG. 2(*b*)) to be formed on the semiconductor substrate 1 and the gate electrode 3 are endowed with different thicknesses by utilizing the difference between the effects of the impurity-enhanced oxidation of the semiconductor substrate 1 and the gate electrode 3. Therefore, it is also necessary to endow the polysilicon with an impurity concentration different from that of the semiconductor substrate 1. Herein, the impurity concentration of the gate electrode 3 may be higher as compared with that of the semiconductor substrate 1. Preferably, the impurity concentration of the semiconductor substrate 1 may be at most $1 \times 10^{20}$ cm$^{-3}$, and that of the gate electrode 3 may be at least $5 \times 10^{19}$ cm$^{-3}$, subject to the condition that the impurity concentration of the gate electrode 3 is higher as compared with that of the semiconductor substrate 1. Thus, since the impurity concentration of the gate electrode 3 is at least $5 \times 10^{19}$ cm$^{-3}$, the effect of impurity-enhanced oxidation begins to appear remarkably. Besides, since the impurity concentration of the channel region is at most $1 \times 10^{20}$ cm$^{-3}$, the effect of impurity-enhanced oxidation does not appear under some conditions of an oxidation time period, etc. Moreover, since the impurity concentration of the gate electrode 3 is higher as compared with that of the semiconductor substrate 1, the thickness T2 of the part of the above insulating film lying in touch with the gate electrode 3, and the thickness T1 of the part thereof lying in touch with the semiconductor substrate 1 can be made different in self-alignment fashion, and the former T2 can be made larger than the latter T1. Accordingly, charges injected from the semiconductor substrate 1 can be restrained from penetrating the insulating film to the gate electrode 3, so that a semiconductor memory device of good charge injection efficiency and high writing/erasing speeds can be provided at a low cost without requiring any complicated step.

Here, the thickness of the polysilicon film should preferably be about 50–400 nm.

Besides, although only the doped polysilicon is employed as the material of the gate electrode 3 here, the doped polysilicon may well be overlaid with a film made of undoped polysilicon, a film made of a metal such as Al, Ti or W, or a film made of a compound of the above metal and silicon. The undoped polysilicon may well be stacked and formed on the doped polysilicon.

Subsequently, a desired photoresist pattern is formed on the gate electrode material by a photolithographic step, and gate etching is performed using the photoresist pattern as a mask, so as to etch the gate electrode material and the gate insulating film, thereby forming a structure shown in FIG. 2(*a*). That is, the gate insulating film 2 and the gate electrode 3 are formed, and accordingly, a gate stack 8 consisting of them is formed. Although no illustration is given, the gate insulating film need not be etched on this occasion. In a case where the gate insulating film is utilized as implantation protection films at the impurity implantation of the next step without being etched, the step of forming the implantation protection films can be omitted.

Incidentally, the materials of the gate insulating film 2 and gate electrode 3 may be materials which are used in logic processes conforming to the scaling rule of the times, as stated above, and the invention is not restricted to the materials.

Figure 3:
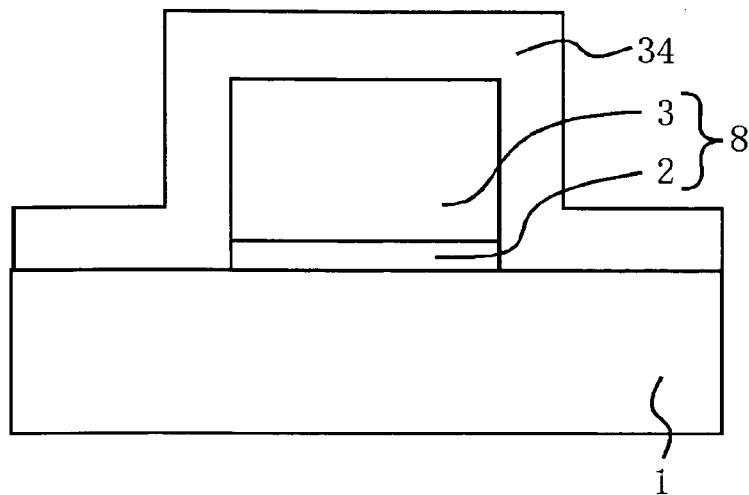
FIGS. 3a–3b are schematic sectional views showing a structural outline of a semiconductor memory device according to the third embodiment of the present invention.
Figure 3:
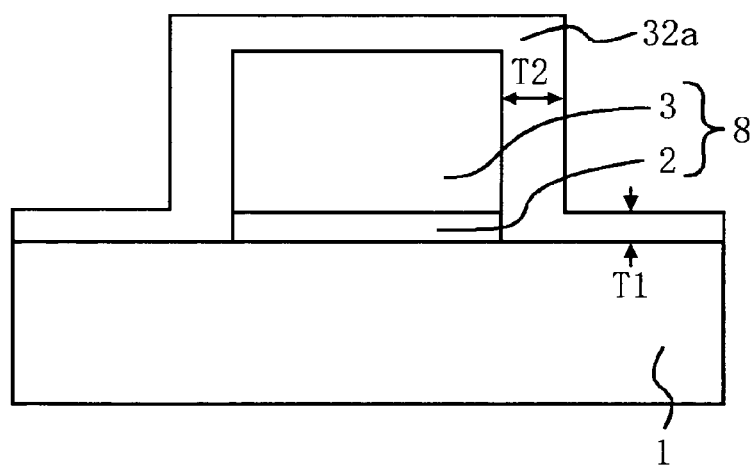

Besides, the gate stack 8 may well be formed by a method as indicated below. A gate insulating film similar to the above is formed on the whole denuded surface of a semiconductor substrate 1 having a P-type semiconductor region. Subsequently, a gate electrode material similar to the above is formed on the gate insulating film. Subsequently, a mask insulating film such as oxide film, nitride film or oxynitride film is formed on the gate electrode material. Subsequently, a photoresist pattern similar to the above is formed on the mask insulating film, and the mask insulating film is etched. Subsequently, the photoresist pattern is removed, and the gate electrode material is etched using the mask insulating film as an etching mask. Subsequently, the mask insulating film and the denuded part of the gate insulating film are etched, thereby forming a structure shown in FIG. 3(*a*). In the case where the gate stack 8 is formed in this way, a selection ratio at etching, namely, the selection ratio between the gate electrode material and the gate insulating film material can be set large, and the etching of the gate insulating film being a thin film can be realized without etching the substrate 1. Although no illustration is made, the gate insulating film need not be etched on this occasion for the same reason.

Subsequently, as shown in FIG. 2(*b*), the film of the first insulator 32*a* is formed on the gate stack 8 and the denuded surface of the semiconductor substrate 1.

Here, a thermal step based on a furnace is employed as a film formation method, whereby the first insulator 32*a* is formed so that the thickness T1 of its part formed on the semiconductor substrate 1 and the thickness T2 of its part formed on the gate electrode 3 may be different, and that the thickness T1 may be smaller than the thickness T2, under the impurity concentration conditions as mentioned above. These facts utilize the effect that the rate of the formation of an insulating film thickness employing a thermal step is changed by an impurity, and the film thicknesses can be endowed with the difference by the simple step without requiring any special step such as etching. Therefore, the invention can be performed without increasing a manufacturing cost.

Besides, since the first insulator 32*a* may be capable of suppressing leakage, it may well be made of an oxide film, a nitride film, a composite film consisting of an oxide film and a nitride film, or a highly dielectric insulating film such as hafnium oxide film or zirconium oxide film. Further, since the first insulator 32*a* becomes an insulating film through which electrons pass, it should preferably be a film of high withstand voltage, low leakage current and high reliability. By way of example, the first insulator 32*a* is made of an oxide film such as thermal oxide film, $N_2O$ oxide film or NO oxide film, likewise to the material of the gate insulating film 2. In case of the oxide film, its thickness is recommended to be about 1 to 20 nm. Further, in a case where the thickness T1 of the part for injecting/erasing charges, namely, the part lying in touch with the semiconductor substrate 1, is made small to the extent that a tunnel current flows through the insulating film, a voltage necessary for injecting/erasing the charges can be lowered, whereby power dissipation can be lowered. A typical thickness in that case should preferably be about 1–6 nm. Here, owing to the formation of the first insulator 32*a*, each memory functional unit includes the insulating film without being in direct touch with the semiconductor substrate 1 and the gate electrode 3, so that the leakage of held charges can be suppressed by the insulating film. In consequence, a memory element of good charge retaining characteristics and high long-term reliability is formed.

Subsequently, polysilicon which is a material for forming charge storing regions 33 is deposited substantially uniformly. Herein, the material of the charge storing regions 33 may be material which can retain or induce charges, for example, a material such as a nitride film or oxynitride film capable of retaining electrons and holes, or an oxide film having charge traps; a material such as ferroelectrics including PZT or PLZT, capable of inducing charges in the surfaces of the charge storing regions by polarization or the like phenomenon; or a material whose structure has a substance capable of retaining charges, such as floating polysilicon or silicon dots, in an oxide film. The film thickness of the material for forming the charge storing regions 33 may be about 2–100 nm in case of employing, for example, a nitride film or polysilicon. The film thickness is a parameter which is important for forming source and drain diffused regions 13 in offset with respect to the gate electrode 3. Therefore, the film thickness may be adjusted within the above range considering the magnitude of the offset, and also considering the film thickness of the first insulator 32*a*.

Subsequently, as shown in FIG. 2(*c*), the material for forming the charge storing regions 33 is anisotropically etched, thereby forming the charge storing regions 33 on the sidewalls of the gate stack 8. The etching may be capable of selectively etching the material for forming the charge storing regions 33, and may be carried out under conditions which afford a large etching selection ratio relative to the first insulator 32*a*. On this occasion, the etching may be done so that the uppermost part of each charge storing region 33 may become flush with or lower than the uppermost part of the gate electrode 3. The reason therefore is that, although the gate electrode 3 and the charge storing region 33 are apprehended to short-circuit by etching the first insulator 32*a* at a later step, the shortest distance between the gate electrode 3 and the charge storing region 33 is enlarged by the previous etching specified above, so the short-circuiting can be suppressed. The "short-circuiting" termed here includes also short-circuiting at the silicide step and contact step of the gate electrode 3.

Besides, when the anisotropic etching is performed so that the uppermost parts of the charge storing regions 33 may become lower than the uppermost part of the gate electrode 3, the charge storing regions 33 may be arranged only in the vicinities of a channel. The anisotropic etching may well be more performed so as to make the charge storing regions 33 still smaller. Owing to such an aspect, electrons which are injected by writing are limited into the vicinities of the channel, so that the electrons are more easily removed by erasing. Therefore, erroneous erasing can be prevented. Besides, assuming that the number of injection electrons does not change due to the limitation of each charge retaining portion, an electron density in the charge retaining portion heightens, and hence, the writing/erasing of electrons can be efficiently executed, so that a semiconductor memory device of high writing/erasing speeds is formed. However, in a case where the offset magnitudes between the gate electrode 3 and the source and drain diffused regions 13 cannot be sufficiently held on account of the above arrangement, the step of forming sidewall spacers must be further performed.

In this regard, in a case where a substance having an electrical conductivity, such as conductor or semiconductor, or polysilicon as a typical example is employed as the material of the charge storing regions 33, the right and left charge storing regions 33 need to be electrically insulated after the formation thereof. As shown in FIG. 21(a), therefore, parts (removal regions) of the charge storing regions 33 are removed by etching. As a removal method, a photoresist is patterned by a known photolithographic step so as to cover the parts of the regions 33 other than the removal regions 21 thereof. Thereafter, anisotropic etching is performed to removed the removal regions which are the denuded parts of the charge storing regions 33. The etching need not always be the anisotropic etching, but wet etching may well be employed as long as the charge storing regions 33 can be selectively etched and can be performed under conditions which afford a large etching selection ratio relative to the first insulator 32a. However, the removal regions 21 should preferably be located over the element isolation region in order to prevent the element from damaging due to the etching.

Subsequently, as shown in FIG. 2(d), the first insulator 32a is anisotropically etched, thereby selectively etching only its denuded part and to finish up the first insulator 32a. The etching may be capable of selectively etching the first insulator 32a, and may be performed under conditions which afford the large etching selection ratios of the material of the gate electrode 3 and the material of the semiconductor substrate 1 relative to the material for forming the charge storing regions 33.

Here at this step, parts of the first insulator 32a (parts lying in touch with the semiconductor substrate 1) as correspond to parts not covered with the charge storing regions 33, that is, the corresponding portion of the removal region 21 in the charge storing regions 33 at the preceding step are removed by the etching. In contrast, parts (parts lying in touch with gate sidewalls) are left behind in a state shown in FIG. 21(b). Here, the parts of the first insulator 32a remain in the state of FIG. 21(b) and cover the outer periphery of the gate electrode 3, so that the short-circuiting between source and drain contacts and the gate electrode 3 can be suppressed. Thus, microfabrication is facilitated, and the high density packaging of a memory is realized.

Besides, the step of forming the charge storing regions 33 and the step of forming the first insulator 32a may well be carried out by a single step. More specifically, anisotropic etching which can selectively etch both the first insulator 32a and the material for forming the charge storing regions 33 and which employs conditions affording large etching selection ratios relative to the material of the gate electrode 3 and the material of the semiconductor substrate 1 is carried out, whereby the two steps ordinarily required can be performed by the single step, and hence, the number of steps can be decreased. Also in that case, however, when a material which contains an electrically conductive substance such as conductor or semiconductor is employed as the material of the charge storing regions 33, the right and left charge storing regions 33 need to be electrically insulated. As shown in FIG. 21(b) therefore, parts (removal regions) of the charge storing regions 33 are removed by etching. A method for the removal may be similar to the foregoing.

Subsequently, source and drain impurity implantation is performed using as a mask a source and drain implantation mask region which consists of the gate electrode 3, first insulator 32a and charge storing regions 33, and a well-known heat treatment is performed, thereby forming the source and drain diffused regions 13. When implantation projection films, not shown, are formed on the denuded parts of the semiconductor substrate 1 in case of the ion implantation beforehand, preferably the semiconductor substrate surface can be restrained from roughening due to the ion implantation, and unnecessary deep implantation can be suppressed.

According to this semiconductor memory device, the first insulator 32a is so formed that the film thickness T1 of the part formed on the semiconductor substrate 1 differs from the film thickness T2 of the part formed in touch with the gate electrode 3, and that the former T1 is smaller than the latter T2. Further, these facts utilize the effect that the rate of the formation of an insulating film thickness employing a thermal step is changed by an impurity, and the film thicknesses can be endowed with the difference by the simple step without requiring any special step such as etching. Therefore, the invention can be performed without increasing a manufacturing cost.

Moreover, according to this semiconductor memory device, the storage of 2 bits per transistor can be incarnated. Here, the principles of writing/erasing and readout methods for incarnating the storage of 2 bits per transistor will be elucidated below. A case where the memory element is of N-channel type, shall be described here. In a case where the memory element is of P-channel type, the description may be similarly applied by reversing the signs of voltages. Incidentally, a ground potential may be impressed on nodes (the source and drain, gate and substrate) for which applied voltages are not especially designated.

In case of writing information into the memory element, a positive voltage is applied to the gate, and a positive voltage nearly equal to or greater than the gate voltage is applied to the drain. Charges (electrons) supplied from the source on this occasion are accelerated in the vicinity of a drain end, to become hot electrons, which are injected into the charge storing region on the drain side. At this time, no electrons are injected into the charge storing region existent on the source side. In this way, the information can be written into the charge storing region on the specified side. Besides, the writing of 2 bits can be easily executed by replacing the drain with the source.

In order to erase information written in the memory element, hot hole injection is utilized. A positive voltage may be applied to the diffused layer region (source or drain) on the side on which the charge storing region to be erased is located, while a negative voltage may be applied to the gate. On this occasion, holes are created by inter-band tunneling in the PN-junction between the semiconductor substrate and the diffused layer region to which the positive voltage is applied. The holes are drawn toward the gate having a negative potential, and are injected into the charge storing region to be-erased. In this way, the information on the specified side can be erased. By the way, in order to erase information written in the charge storing region on the opposite side, a positive voltage may be applied to the charge storing region on the opposite side.

Next, in order to read out information written in the memory element, the diffused region on the side of the charge storing region to be read out is set as the source, and the diffused region on the opposite side is set as the drain. That is, a positive voltage may be applied to the gate, while a positive voltage equal to or greater than the gate voltage may be applied to the drain (set as the source in the writing mode). The voltage on this occasion, however, needs to be sufficiently small lest information should be written. A drain current changes depending upon the quantity of charges stored in the charge storing region, and the stored information can be detected. By the way, in order to read out information written in the charge storing region on the opposite side, the source and the drain may be replaced with each other.

The above writing/erasing and readout methods are examples in the case of using a nitride film for each charge storing region, and other methods can also be employed. Further, even in case of any other material, the above methods or different writing/erasing methods can be employed. Owing to the above, according to this semiconductor memory device, the storage of 2 bits per transistor can be incarnated, so that the occupation area of the memory element per bit can be reduced, and a nonvolatile memory of large capacity can be formed.

Besides, according to this semiconductor memory device, the charge storing regions are arranged on both the sides of the gate electrode, not under the gate electrode. Therefore, the gate insulating film need not function as a charge storing region, and it is permitted to be separated from the charge storing region and to be used only for the function as the simple gate insulating film, so that a design conforming to the scaling rule of an LSI can be made. Therefore, it is unnecessary to insert a floating gate between a channel and a control gate as in a flash memory, it is also unnecessary to adopt an ONO film endowed with a memory function, as a gate insulating film, and it becomes possible to adopt a gate insulating film complying with microfabrication. Simultaneously, the influence of the electric field of the gate electrode on the channel becomes intense, and the semiconductor memory device having the memory function immune against the short channel effect can be incarnated. Accordingly, the density of integration can be enhanced by the microfabrication, and an inexpensive semiconductor memory device can be provided.

Besides, in a case where charges are held in the charge storing region, part of the channel region is intensely influenced by the charges, and hence, a drain current value changes. Thus, a semiconductor memory device which discriminates the presence or absence of charges is formed.

Besides, since each charge storing region lies in touch with the semiconductor substrate and the gate electrode through the insulating film, the leakage of held charges can be suppressed by the insulating film. Thus, a semiconductor memory device of good charge retaining characteristics and high long-term reliability is formed.

Besides, according to the method of forming the semiconductor memory device, the first insulator 32a in which the film thickness (T1) on the semiconductor substrate is smaller as compared with the film thickness (T2) at the sidewall parts of the gate electrode can be formed by the simple step without employing any complicated step such as etching, or etching as well as oxidation.

(Third Embodiment)

The third embodiment of this invention will be described with reference to FIGS. 3(a) and 3(b). This embodiment employs steps different from those of the second embodiment, regarding the method of forming the first insulator 32a which has the different film thicknesses. Therefore, a semiconductor memory device can be formed by employing steps stated in the second embodiment, as to the other steps. The points of the third embodiment different from the second embodiment will be chiefly described in detail in due course.

First, as shown in FIG. 3(a), a gate electrode 3 is formed above a semiconductor substrate 1 through a gate insulating film 2, that is, a gate stack 8 is formed. Thereafter, an initial insulating film 34 having a substantially uniform thickness is formed so as to cover the front surface of the semiconductor substrate 1 and the gate stack 8. Methods of forming the respective constituents are as stated below.

The method of forming the gate electrode 3 above the semiconductor substrate 1 through the gate insulating film 2, that is, the gate stack 8, may be the same formation method as in FIG. 2(a) in the second embodiment. In this embodiment, however, even when any impurity is not contained in the gate electrode 3, the same effect as in the case where it is contained can be achieved, so that the method becomes simpler.

Besides, the method of forming the initial insulating film 34 on the semiconductor substrate 1 and the denuded surface of the gate stack 8 may be an ordinary oxide-film formation method utilizing thermal oxidation. Here, in a case where a so-called oxynitride film in which an oxide film is doped with nitrogen is employed as the insulating film 34, the effect of suppressing leakage within the film is enhanced. Moreover, owing to the employment of a heat treatment, interface characteristics with the semiconductor substrate 1 are bettered as compared with those of a film employing CVD (Chemical Vapor Deposition) or the like. Therefore, a driving current becomes larger.

Alternatively, a substantially uniform oxide film or nitride film may well be formed by employing CVD. In this regard, the initial insulating film 34 finally becomes an insulating film of that thickness in a first insulating film which is formed at each sidewall part of the gate electrode 3, and it needs to suppress the leakage of stored charges. Therefore, when the same formation method as the formation method of the gate insulating film in the second embodiment is employed, the leakage suppressing effect is enhanced. Here, in a case where an $N_2O$ film, for example, is formed as the initial insulating film 34, its thickness should preferably be substantially uniform within a range of 1 to 20 nm. The film thickness of any other material may be adjusted so as to become about 1 to 20 nm in terms of an equivalent thickness of an oxide film.

Subsequently, as shown in FIG. 3(b), a film to become a first insulator 32a, that is, an insulating film in which a film thickness (T1) on the semiconductor substrate 1 is formed smaller as compared with a thickness (T2) at each sidewall part of the gate electrode 3 is formed on the semiconductor substrate 1 and the denuded surface of the gate stack 8. The insulating film is formed as stated below.

The initial insulating film 34 is etched by employing an anisotropic etching method, thereby working the initial insulating film 34 so that the film thickness at the sidewall parts of the gate stack 8 may become substantially equal to or smaller than the thickness of the initial insulating film 34, and that the film thickness on the semiconductor substrate 1 may become smaller than the thickness of the initial insulating film 34 or may be completely removed. Thus, the first insulator 32a in which the film thickness (T1) on the semiconductor substrate 1 is smaller than the thickness (T2) at the sidewall parts of the gate electrode 3 is formed. In this regard, the step of forming an insulating film again may well be added here. Thus, the damages of the semiconductor substrate 1 attributed to the above etching can be decreased, and the first insulator 32a capable of relieving leakage can be formed. In that case, the additional step of forming the insulating film may be performed by employing the same method as the formation method for the gate insulating film as stated in the second embodiment.

In the way stated above, a structure shown in FIG. 3(b) has been formed. The structure has the same external appearance as that of the structure in FIG. 2(b) in the second embodiment, and a semiconductor memory device can be formed by employing the steps shown in the second embodiment, as the subsequent steps.

Owing to the semiconductor memory element or the manufacturing method therefor, the same advantages as in the second embodiment can be achieved. Regarding the method of forming the first insulating film, however, different advantages are achieved. More specifically, according to the third embodiment, any impurity need not be contained in the gate electrode beforehand, and the method becomes a simpler step in that point. Furthermore, it is possible to employ a dual gate CMOS step often employed in an ordinary CMOS formation process, that is, the step of implanting an impurity into the gate electrode simultaneously with an impurity implantation step for forming source and drain diffused regions, and hence, the conventional CMOS formation process can be applied, so that a semiconductor memory device of high reliability is formed. Moreover, a semiconductor memory device which is easy of coexistence with a CMOS device is formed.

(Fourth Embodiment)

The fourth embodiment of this invention will be described with reference to FIGS. 4(a)–4(d). This embodiment elucidates novel structures and formation methods which can achieve the new advantage of solving a problem ascribable to asperity, concerning the structure and formation method of the insulating film formed at the sidewall parts of the gate electrode in the semiconductor memory device described in each of the foregoing embodiments.

Shown in FIG. 4(a) is a semiconductor memory element which has been formed by the formation method described in the second embodiment, and in which the first insulator 32a has been especially formed by a heat treatment. Besides, shown in FIG. 4(b) is a model diagram in which a region indicated by a circle of broken line in FIG. 4(a) is enlarged. It is seen from FIG. 4(b) that the side surface of a gate electrode 3 is formed with asperity 40. The "asperity" appears at a polysilicon surface as shown in FIG. 4(b) in a case, for example, where the gate electrode 3 is made of polysilicon and where a anti-dissipation insulator or a first insulator is formed by a thermal oxidation step. More specifically, the "asperity" is considered to be ruggedness which has appeared at the polysilicon surface on account of the discrepancy of the facility of oxidation at the polysilicon surface, the discrepancy occurring for such a reason that the grain boundary of the polysilicon undergoes enhanced oxidation in the thermal oxidation of the polysilicon.

Figure 4:
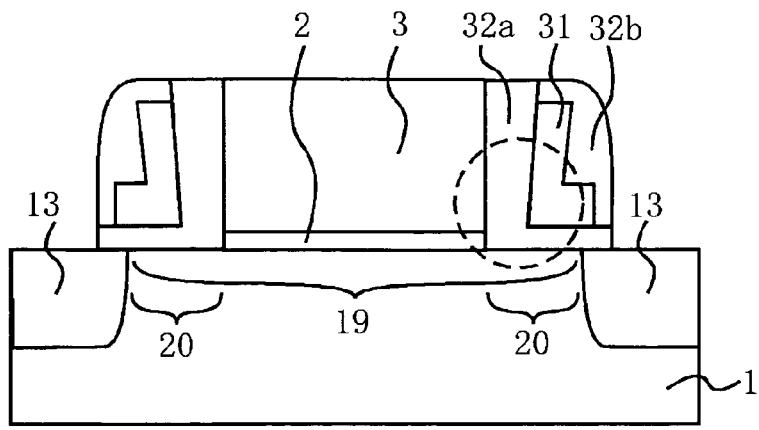
FIGS. 4a–4d are schematic sectional views showing a structural outline of the semiconductor memory device according to a fourth embodiment of the present invention.
Figure 4:
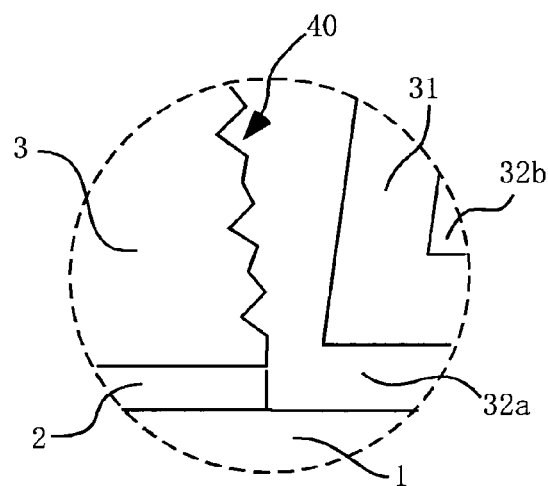
Figure 4:
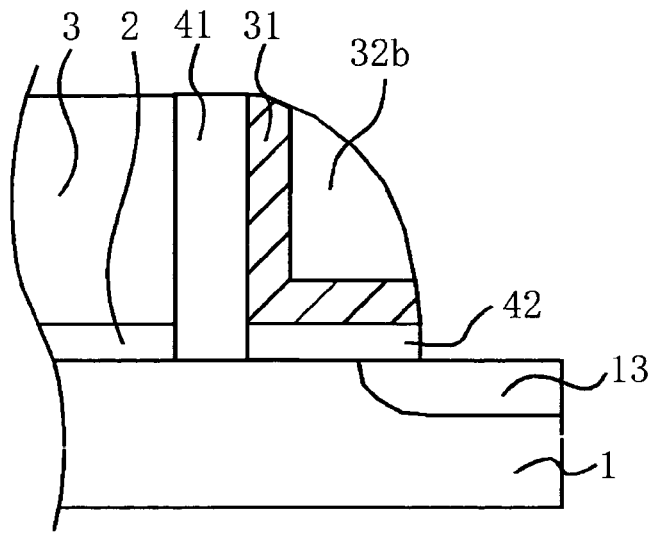
Figure 4:
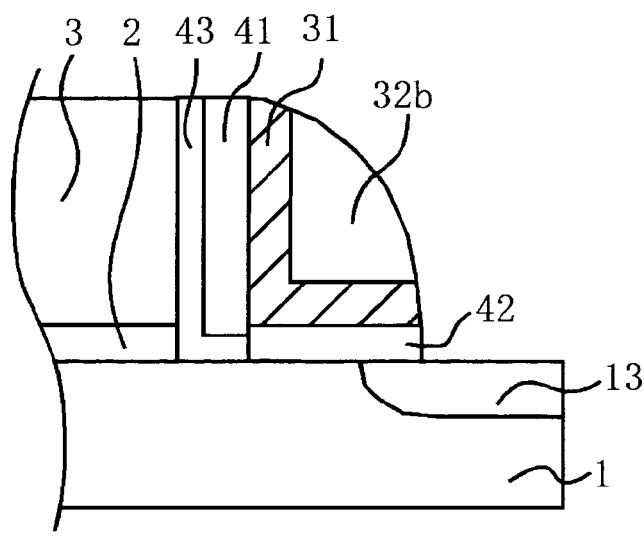

In FIG. 4(a), the asperity is omitted from illustration. Although the asperity is not shown in the drawings other than FIG. 4, this does not indicate that the asperity is not formed, but the asperity is omitted as in FIG. 4(a). In a case where the asperity might appear due to the above cause, it ought to be considered that the asperity is formed, irrespective of whether or not it is illustrated.

In a case where the asperity has appeared due to the formation method in the second embodiment, the injection of charges from the gate electrode 3 into a charge retaining portion 31 becomes easier than in a case where the asperity does not appear. Accordingly, inferior erasing in the erasing mode of the semiconductor memory element is more liable to occur. More specifically, in a case where the situation of applying potentials in the erasing mode is to apply a negative potential to the gate electrode 3 and to apply a positive potential to a source and drain diffused region 13, whereby electrons held in the charge retaining portion 31 are emitted onto the side of the source and drain diffused region 13, the leakage is liable to occur that electrons are injected from the gate electrode 3 into the charge retaining portion 31 simultaneously with the emission of the electrons from the charge retaining portion 31. Therefore, an erasing efficiency worsens, and the inferior erasing is liable to occur.

In contrast, when a structure as shown in FIG. 4(c) or FIG. 4(d) is formed, the above problem of the liability to the occurrence of the inferior erasing can be solved. The details of the structure will be described below.

The structure in FIG. 4(c) is such that a deposited insulator 41 is formed on each side surface of the gate electrode 3, that a third insulator 42 is formed on the front surface of a semiconductor substrate 1 outside the deposited insulator 41, and that the charge retaining portion 31 and a second insulator 32b are formed on the surfaces of the deposited insulator 41 and the third insulator 42. Thus, the insulator at the part lying in touch with the gate electrode 3 is the deposited insulator 41 based on CVD, unlike the first insulator 32a shown in FIG. 4(b) and based on the insulator formation method employing the heat treatment. Therefore, the insulator 41 in FIG. 4(c) is free from the asperity which is ascribable to the formation of the insulator by the heat treatment as shown in FIG. 4(b). Accordingly, the leakage caused by the asperity is suppressed, and the inferior erasing can be suppressed. Since, however, the third insulator 42 is formed by a heat treatment, some asperity appears, but the appearance of the asperity can be suppressed much more than in the case shown in FIG. 4(b). Consequently, the inferior erasing can be suppressed.

The structure in FIG. 4(d) includes the deposited insulator 41 formed in FIG. 4(c), at each side surface of the gate electrode 3, but it is especially different from the FIG. 4(c) structure in that a thermal insulator 43 which is an insulator based on a heat treatment is formed between the deposited insulator 41 and the gate electrode 3 and between the deposited insulator 41 and the semiconductor substrate 1. Here, the FIG. 4(d) structure is more advantageous than the FIG. 4(c) structure in the point that the thermal insulator 43 suppresses the decrease of a driving current attributed a phenomenon in which a mobility in a channel degrades due to the inferior interface characteristics between the semiconductor substrate 1 and the deposited insulator 41. In order to relieve the influence of the asperity, the film thickness of the thermal insulator 43 should be made small. In case of forming a thermal oxide film as the thermal insulator 43, the thickness thereof should preferably be about 1 to 20 nm, and it should especially desirably be about 10 nm. Thus, the shape of the interface between the thermal insulator 43 and the semiconductor substrate 1 is favorable, and the mobility degradation of current to flow through the interface can be suppressed, so that a greater driving current is obtained, and a semiconductor memory device of more enhanced readout speed can be provided. In particular, since the thermal oxide film is at least 1 nm thick, the interface characteristics can be satisfactorily enhanced, and when it is at most 10 nm thick, the occurrence of the degradation ascribable to the asperity can be suppressed.

Next, a method of forming the structure in FIG. 4(c) will be described. Part of the process employs the same manufacturing method as part of the manufacturing method described in the second embodiment.

First, using the same method as in the second embodiment, a gate stack 8 which consists of a gate insulating film 2 and a gate electrode 3 is formed on a semiconductor substrate 1 as shown in FIG. 2(a).

Subsequently, using CVD, an insulating film is formed substantially uniformly. The thickness of the insulating film may be nearly equal to a first insulator 32a in the second embodiment, in terms of an oxide film. Besides, anisotropic etching is performed until the semiconductor substrate 1 is denuded, whereby a deposited insulator 41 is formed at gate sidewalls. Regarding the material of the insulating film, it is allowed to use an insulating film, such as oxide film or oxynitride film, which is usually employed for the sidewalls of the gate electrode 3.

Subsequently, a thermal oxide film is formed in order to form a third insulator 42. On this occasion, since the deposited insulator 41 has already been formed on the side surfaces of the gate electrode 3, the thermal oxide film is not so thickly formed on the gate side surfaces as on denuded semiconductor substrate surfaces. In the drawing, therefore, the thermal oxide film is shown as being formed on the part of the semiconductor substrate 1 outside the deposited insulator 41, but it is omitted on the gate side surface. Besides, since a thermal oxidation step is employed as the step of forming the insulator, the gate electrode 3 is thermally oxidized in correspondence with the increase of the thickness of the insulating film on the gate side surface. Since, however, the thickness of the thermal oxidation is much smaller as compared with the thickness of the first insulator 32a in the second embodiment; the formation of asperity is suppressed conspicuously. Here, the film thickness of the third insulator 42 may be nearly equal to that of the first insulator 32a, and the formation method thereof may be either CVD or a heat treatment. In this regard, when the insulating film is formed by the heat treatment, the interface characteristics between the semiconductor substrate 1 and the insulating film become favorable, so that mobility heightens, and a driving current increases.

Next, a method of forming the structure in FIG. 4(d) may be the same as the formation method of the FIG. 4(c) structure, but it differs in the point that a thermal insulator 43 is formed before the formation of the deposited insulator 41. The difference brings forth the advantage that the interface characteristics between the insulating film and the semiconductor substrate 1 are enhanced to increase a driving current. Therefore, the thermal insulator 43 may be based on oxidation or oxynitriding (oxynitride film) employing a heat treatment, and especially oxynitriding with $N_2O$ gas or NO gas is favorable because leakage can also be suppressed. The film thickness of the thermal insulator 43 should preferably be about 1 to 20 nm in terms of an oxide film, and should especially desirably be about 10 nm. Thus, the shape of the interface between the thermal insulator 43 and the semiconductor substrate 1 is favorable, and the mobility degradation of current to flow through the interface can be suppressed, so that a greater driving current is obtained, and a semiconductor memory device of more enhanced readout speed can be provided. In particular, since the thermal oxide film is at least 1 nm thick, the interface characteristics can be satisfactorily enhanced, and when it is at most 10 nm thick, the occurrence of the degradation ascribable to the asperity can be suppressed.

Further, apart from the above structure and method, a method which suppresses inferior erasing by suppressing leakage ascribable to asperity is as stated below. The first insulator 32a in the second embodiment is formed as a thermal oxide film by employing $N_2O$ gas or NO gas as an oxidizing gas. Thus, an oxynitride film, that is an oxide film containing nitrogen is formed, whereby the leakage current of the insulating film is suppressed.

(Fifth Embodiment)

The fifth embodiment of this invention will be described with reference to FIG. 5. This embodiment employs substantially the same steps as those of the second embodiment. Especially different points are the following two: The first point is that, at the step of forming charge storing regions 33, each charge storing region can be made higher than in the second embodiment. The second point is that, at the step of etching a first insulator 32a so as to form L-shaped first insulator members 32a, the step of etching the first insulator 32a until a semiconductor substrate 1 or a gate electrode 3 is denuded is removed. The steps stated in the second embodiment are performed in consideration of the above points, whereby a structure shown in FIG. 5 is formed.

Figure 5:
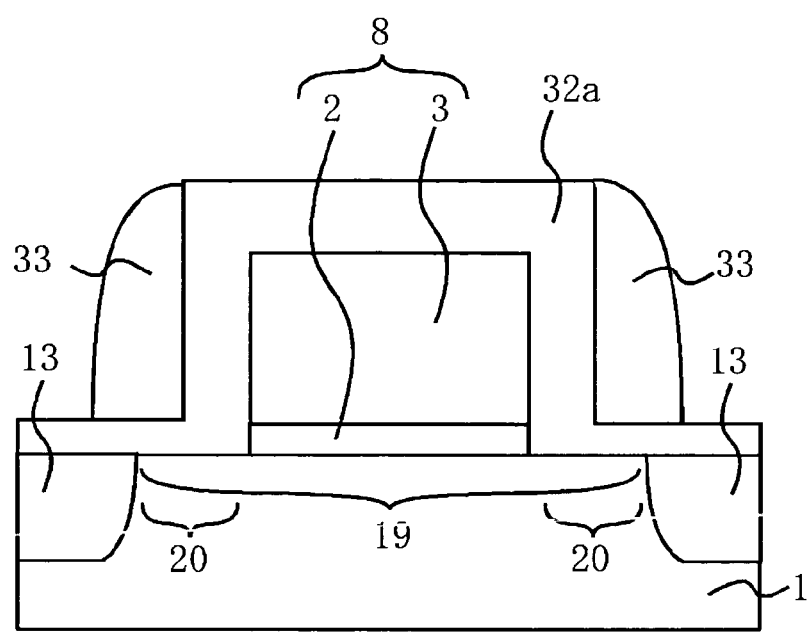
FIG. 5 is a schematic sectional view showing a structural outline of a semiconductor memory device according to a fifth embodiment of the present invention.

As shown in FIG. 5, the uppermost position of each charge storing region 33 may be made flush with or lower than that of the first insulator 32a.

Besides, the step of forming the first insulator 32a may well be the method indicated in the third or fourth embodiment. In that case, it is needless to say that the advantages stated in the corresponding embodiment are achieved.

Besides, the first insulator 32a is etched by a later contact step in order that a gate electrode 3 and source and drain diffused regions 13 may be connected with wiring lines. Here, in order to make the first insulator 32a easy of etching, a material the composition of which is chiefly the same as that of a material for an inter-layer insulating film may be used. By way of example, an oxide film is often employed as the inter-layer insulating film, so that the oxide film may be used as the material of the first insulator 32a. The contact etching may be performed under conditions in which the oxide film is etched, and in which the selection ratios of the oxide film to the silicon of a substrate 1 and the polysilicon of the gate electrode 3 are high. Besides, even in a case where the first insulator 32a is made of, for example, a silicon nitride film, it functions an etching stopper at the contact etching step, and it is avoided to meaninglessly etch the semiconductor substrate 1 formed with the source and drain diffused regions 13, whereby the source and drain diffused regions 13 and the semiconductor substrate 1 are advantageously prevented from short-circuiting.

In addition, the first insulator 32a can be used as implantation protection films at the impurity implantation of the source and drain diffused regions 13, so that the step of forming the implantation protection films is dispensed with.

Further, even in a case where contacts with the source and drain diffused regions 13 are partly arranged over the gate electrode 3 on account of misregistration, the insulation between the source and drain diffused regions 13 and the gate electrode 3 can be held owing to the different film thicknesses of the first insulator 32a. More specifically, the insulating film on the gate electrode 3 is formed to be thicker as compared with the insulating film on the source and drain diffused regions 13. It is therefore possible that, although contact holes are formed on the source and drain diffused regions 13, they are not formed on the gate electrode 3, and hence, the insulation can be held. Accordingly, a registration allowance can be designed small, so that microfabrication and a high density of packaging are possible.

(Sixth Embodiment)

The sixth embodiment of this invention will be described with reference to FIGS. 6(a) and 6(b). A structure shown in FIG. 6(a) in this embodiment can be formed using substantially the same steps as in the second embodiment. Besides, a structure shown in FIG. 6(b) can be formed using substantially the same steps as in the second embodiment.

Especially different points are the following: The thickness TG of a gate oxide film 2 is made larger in terms of the equivalent thickness of an oxide film, than the sum between the thickness T1 of the part of a first insulator 32a lying in touch with a semiconductor substrate 1 and the thickness T2 of the part thereof lying in touch with a gate electrode 3. Further, the impurity implantation of source and drain diffused regions 13 is performed after the formation of the gate electrode 3.

Owing to the above steps, the semiconductor memory element of this embodiment can be driven by a tunneling operation scheme stated below.

Besides, the step of forming the first insulator 32a may well be the method indicated in the third or fourth embodiment. In that case, it is needless to say that the advantages stated in the corresponding embodiment are achieved.

Figure 6:
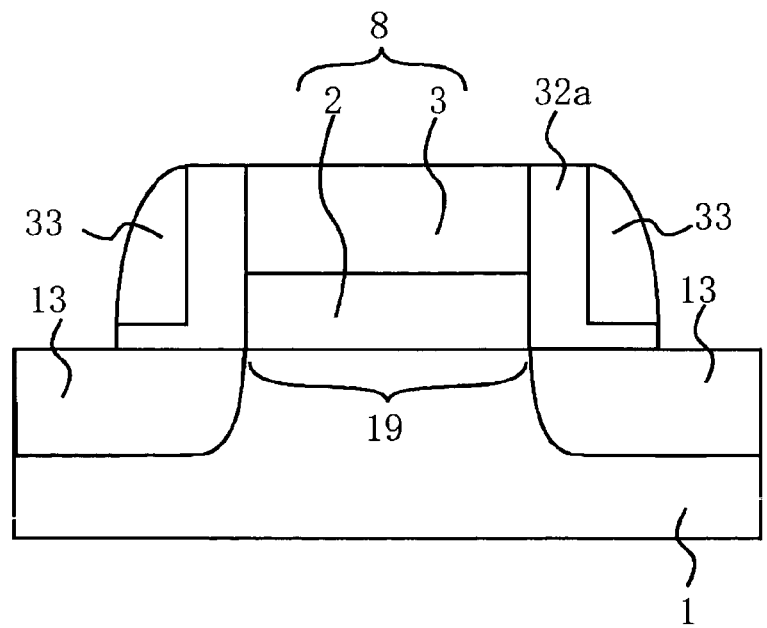
FIGS. 6a–6b are schematic sectional views showing a structural outline of a semiconductor memory device according to a sixth embodiment of the present invention.
Figure 6:
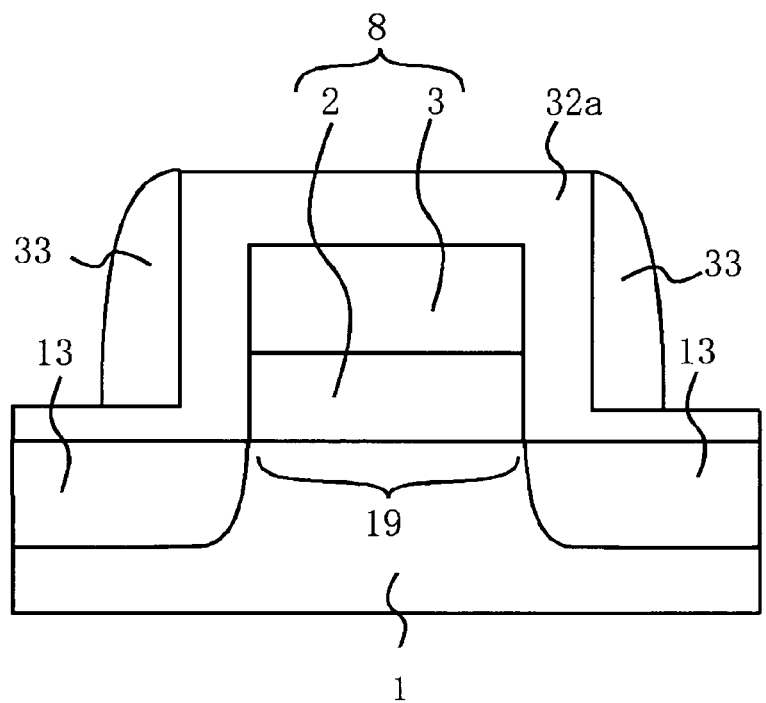

However, when the formation method of the first insulator 32a as described in the second embodiment is employed at this step, the first insulator 32a shown in FIG. 6(a) or the first insulator 32a shown in FIG. 6(b) can be endowed with the different film thicknesses by the simple step without requiring any special step such as etching, for the same reason as stated in the second embodiment. Therefore, the semiconductor memory element can be manufactured by a comparatively small number of manufacturing steps, so that a semiconductor memory element of lower cost can be provided.

Further, the film thickness T1 of the part of the first insulator 32a lying in touch with the semiconductor substrate 1 and the film thickness T2 of the part thereof lying in touch with the gate electrode 3 may be different, and either may well be thicker. A driving method in the case where the thickness T1 is smaller than the thickness T2 will be explained here, but in the opposite case, the conditions of voltages to be applied to the gate electrode 3 and the source and drain diffused regions 13 may be reversed so as to inject/remove charges from the thinner side. Thus, advantages stated below are brought forth. In the case where the thickness of the insulating film at the part lying in touch with the semiconductor substrate 1 is made smaller than that of the insulating film at the part lying in touch with the gate electrode 3, charges injected from the semiconductor substrate 1 can be restrained from penetrating the first insulator 32a to the gate electrode 3, so that a semiconductor memory device of good charge injection efficiency and high writing/erasing speeds can be provided. To the contrary, in the case where the thickness of the insulating film at the part lying in touch with the semiconductor substrate 1 is made larger than that of the insulating film at the part lying in touch with the gate electrode 3, charges injected from the gate electrode 3 can be restrained from penetrating the first insulator 32a to the semiconductor substrate, so that a semiconductor memory device of good charge injection efficiency and high writing/erasing speeds can be provided.

Further, the source and drain diffused regions 13 can be partly arranged under the gate electrode 3, so that a semiconductor memory device can be formed without requiring a step for forming offset regions. Still further, since the structure is the same as that of an ordinary field-effect transistor, a conventional field-effect transistor process having hitherto given actual results can be employed, and a semiconductor memory device of low manufacturing cost can be provided. Moreover, in a case where the source and drain diffused regions 13 are formed in offset with respect to the gate electrode 3, the same advantages as stated in the second embodiment can be achieved.

The semiconductor memory element of the specified structure employs writing/erasing conditions which are different from those of the elements described in the first to fifth embodiments. That is, it employs the tunneling drive method wherein writing/erasing are executed in such a way that charges are tunneled through the thinner parts of the first insulator 32a lying in touch with the semiconductor substrate 1, by the potential difference between the source and drain diffused regions 13 and the gate electrode 3. Examples of the writing/erasing/readout methods of the semiconductor memory element of the specified structure will be described below.

First, the writing operation will be explained. Potentials of 10 volts and 0 volt are respectively impressed on the gate electrode 3 and the source and drain diffused regions 13. Then, the potential of the gate electrode 3 relative to the source and drain diffused regions 13 rises to 10 volts. The potential of charge storing regions 33 increases to a level necessary for tunnel current generation, owing to the capacitive coupling thereof with the gate electrode 3. More concretely, when the potential of the gate electrode 3 is raised from 0 volt to 10 volts in, for example, a rise time of about 1 to 2 nanoseconds, the potential of the charge storing regions 33 temporarily rises to about 15 volts by "overshoot". As a result, electrons in the source and drain diffused regions 13 tunnel through the thinner parts of the first insulator 32a lying in touch with the semiconductor substrate 1, respectively, and they are injected into the charge storing regions 33 located on both the sides of the gate electrode 3. Even when the potential of the gate electrode 3 is made below 10 volts after the injection of the electrons into the charge storing regions 33, the injected electrons are held in the charge storing regions 33 because each of these regions 33 is surrounded with the insulating film.

According to this writing method, the potentials of one of the source and drain diffused regions 13 and the other of them are equal, so that a drain current does not flow. Accordingly, a semiconductor memory element of lowered power dissipation is provided. Further, hot carriers are not generated, and charges are not injected into the gate insulating film 2, so that the discrepancy of a threshold voltage attributed to the injection of the charges into the gate insulating film 2 can be suppressed, and a semiconductor memory element of high reliability is provided.

The potential of 10 volts is selectively impressed on the gate electrode 3 of any specified memory cell among a plurality of memory cells, and the potential of 0 volt is impressed on the gate electrodes 3 of memory cells not selected. Thus, electrons can be stored in only the charge storing regions 33 of the selected memory cell.

Next, the readout operation will be explained. Potentials of 5 volts, 0 volt and 1 volt are respectively impressed on the gate electrode 3, one of the source and drain diffused regions 13 (assumed to be the source region, for the sake of convenience), and the other of them (assumed to be the drain region, for the sake of convenience). In this embodiment, the threshold voltage of the semiconductor memory element is set at a value (for example, 1 volt) lower than 5 volts, and hence, a conduction channel is formed between the source region and the drain region. As a result, electrons migrate from the source region into the drain region, and a drain current of certain magnitude is obtained.

In this embodiment, the charge storing regions 33 are located outside a channel region 19, so that the threshold voltage of the semiconductor memory element in the case where the charge storing regions 33 do not store electrons is substantially equal to the threshold voltage in the case where the charge storing regions 33 store electrons. In both the cases, therefore, similar conduction channels are formed between the source region and the drain region, and electrons migrate from the source region into the drain region, so that drain currents are obtained. However, in the case where the charge storing region 33 stores electrons, the existence of the stored electrons increases the diffused layer resistance (parasitic resistance) of the source and drain diffused region 13. As a result, the drain current in the case where the charge storing region 33 stores electrons becomes lower than the drain current in the case where the charge storing region 33 does not store electrons.

As stated before, in the sidewall storage type nonvolatile memory cell according to this invention, information of 1 bit is not stored in accordance with the magnitude of the threshold voltage of the semiconductor memory element. In this invention, information of 1 bit is stored in accordance with the magnitude of the parasitic resistance of the source and drain diffused region 13 located directly under each memory functional unit. When the charge storing region stores large numbers of electrons, it is considered that electrons in the source and drain diffused region 13 in the vicinity of the charge storing region 33 will decrease under the influence of an electric field established by the electrons, and will increase the electric resistance of the region. Since the magnitude of the drain current changes depending upon the magnitude of the parasitic resistance of the source and drain diffused region, data can be identified by the magnitude of the drain current.

In order to execute the readout of data in practical use, the drain current in a state where data is written will need to have a magnitude of at most 80% of the drain current in a state where data is not written. Besides, in order to execute the readout of data without any error, the drain current in the state where data is written should preferably have a magnitude of at most 70% of the drain current in the state where data is not written.

In order to enlarge the change of the drain current in accordance with the accumulation/non-accumulation of charges in the charge storing region 33, it is recommended by way of example to increase the width of the charge storing region 33 and to decrease the film thickness T1 of the part of the first insulator 32a lying in touch with the semiconductor substrate 1.

Next, the erasing operation will be explained. Potentials of −10 volts and 0 volt are respectively impressed on the gate electrode 3 and the source and drain diffused regions 13. Then, the potential of the charge storing regions 33 lowers to a sufficiently low level, owing to the capacitive coupling thereof with the gate electrode 3. As a result, electrons stored in the charge storing region 33 migrate (are emitted) from this region 33 into the source and drain diffused region 13.

According to this erasing method, the potentials of one of the source and drain diffused regions 13 and the other are equal, so that a drain current does not flow. Therefore, a semiconductor memory element of lowered power dissipation is provided. Further, hot carriers are not generated, and charges are not injected into the gate insulating film 2, so that the discrepancy of a threshold voltage attributed to the injection of the charges into the gate insulating film 2 can be suppressed, and a semiconductor memory element of high reliability is provided.

Owing to the above, according to the semiconductor memory element of this embodiment, a semiconductor memory element of lowered power dissipation and high reliability is provided. The semiconductor memory element can be manufactured by a smaller number of manufacturing steps than in case of forming the element by employing an etching process or the like, so that a semiconductor memory element of lower cost can be provided.

(Seventh Embodiment)

The seventh embodiment of this invention will be described with reference to FIGS. 7(a)–7(d). Each of structures shown in FIGS. 7(a) and 7(b) in this embodiment can be formed using substantially the same steps as in the second embodiment, and it has the same advantages. Besides, structures shown in FIGS. 7(c) and 7(d) can be formed using substantially the same steps as those of the structures shown in FIGS. 6(a) and 6(b), in the sixth embodiment, respectively, and they have the same advantages.

Besides, the step of forming the first insulator 32a may well be the method indicated in the third or fourth embodiment. In that case, it is needless to say that the advantages stated in the corresponding embodiment are achieved.

An especially different point is that, after impurity ion implantation for forming the source and drain diffused regions 13, the charge storing regions 33 are further etched, whereby ranges in which charges can be held are limited onto the side of the semiconductor substrate 1 still more.

Figure 7:
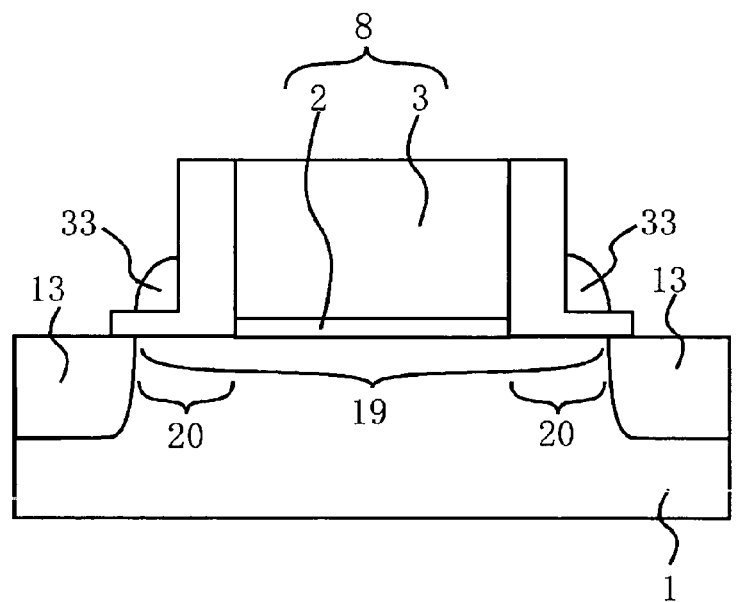
FIGS. 7a–7d are schematic sectional views showing a structural outline of a semiconductor memory device according to a seventh embodiment of the present invention.
Figure 7:
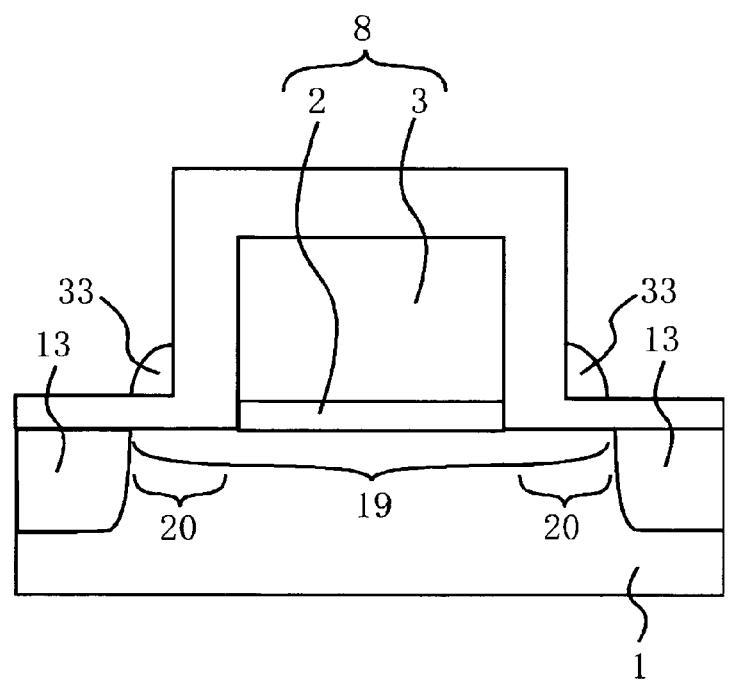
Figure 7:
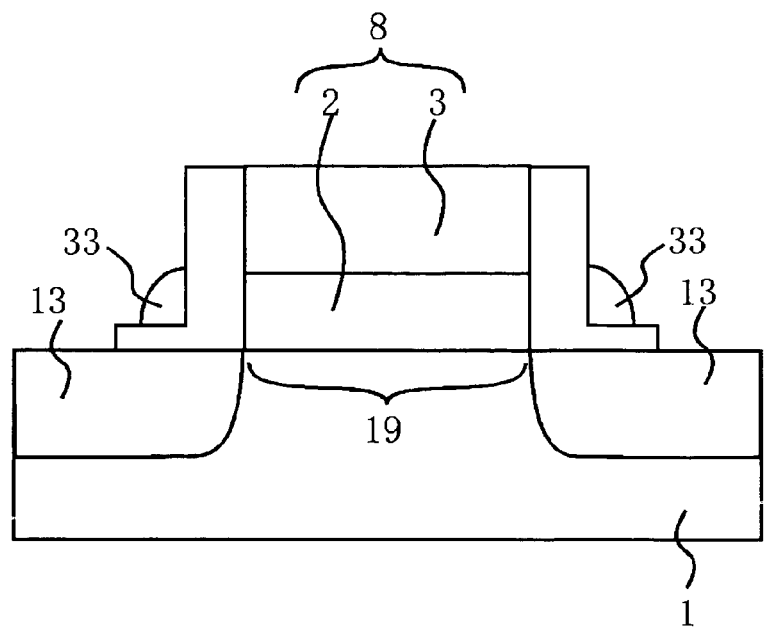
Figure 7:
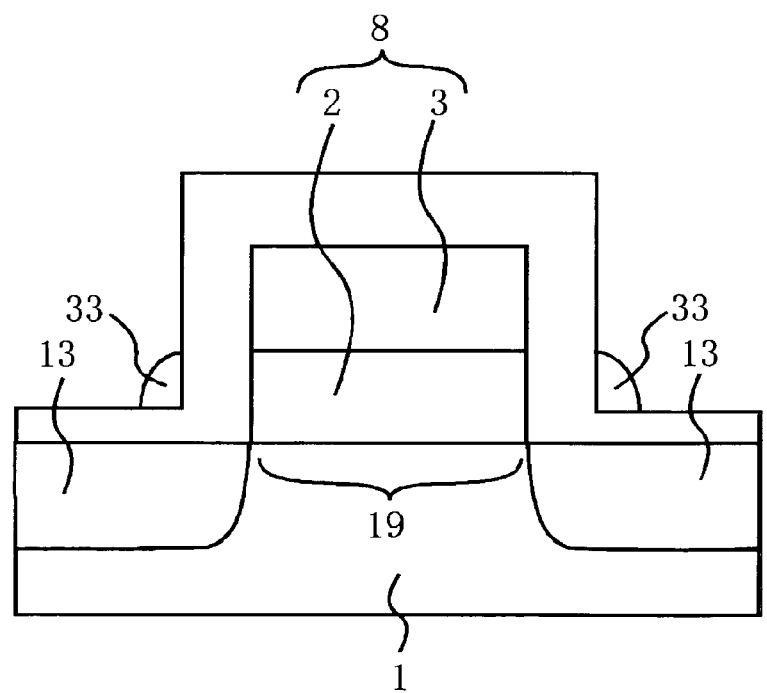

That is, the charge storing regions 33 are further etched, thereby making the charge storing regions 33 very small as shown in FIG. 7. More preferably, in FIG. 7(a) or 7(b), the charge storing regions 33 may overlie the offset regions 20, so that the size of the structure can be reduced by laterally etching the charge storing regions 33 in correspondence with the lateral diffusion widths of the source and drain implantation regions 13.

Owing to the above, electrons which are injected by writing are limited into the vicinities of a channel, so that the electrons are easily removed by erasing, and erroneous erasing can be prevented. Furthermore, the volume of each charge storing region which can retain charges decreases without changing the quantity of injection charges, and hence, the quantity of charges per unit volume can be increased, so that electrons can be efficiently written/erased, and a semiconductor memory device of high writing/erasing speeds is formed.

(Eighth Embodiment)

Figure 22:
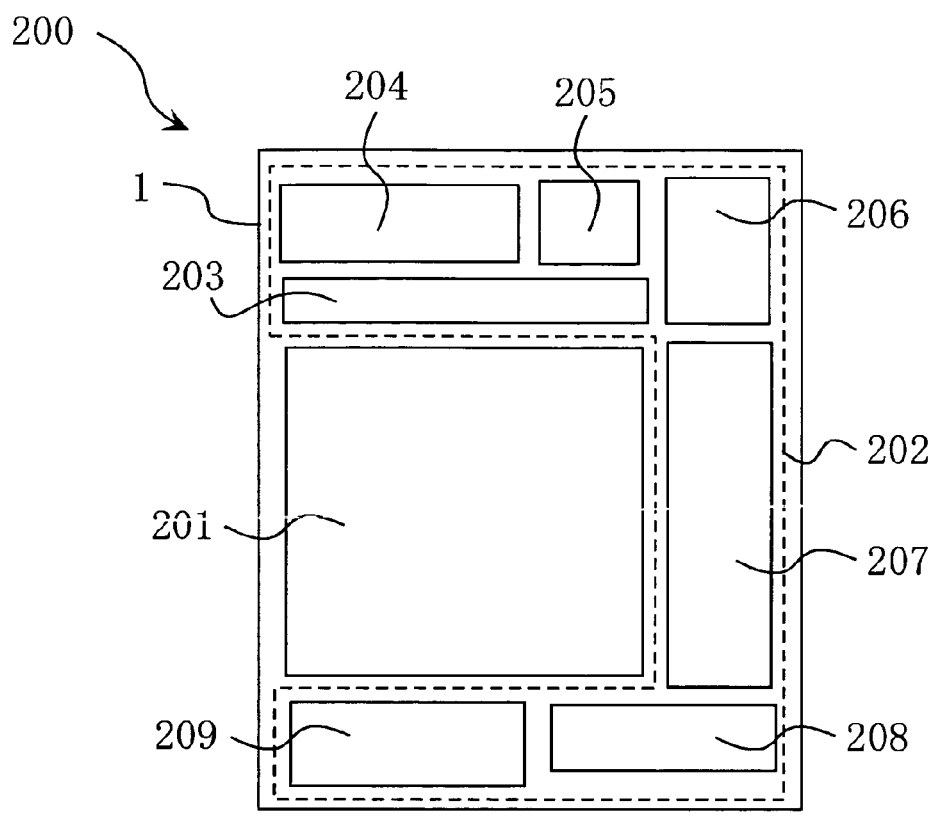
Figure 22:
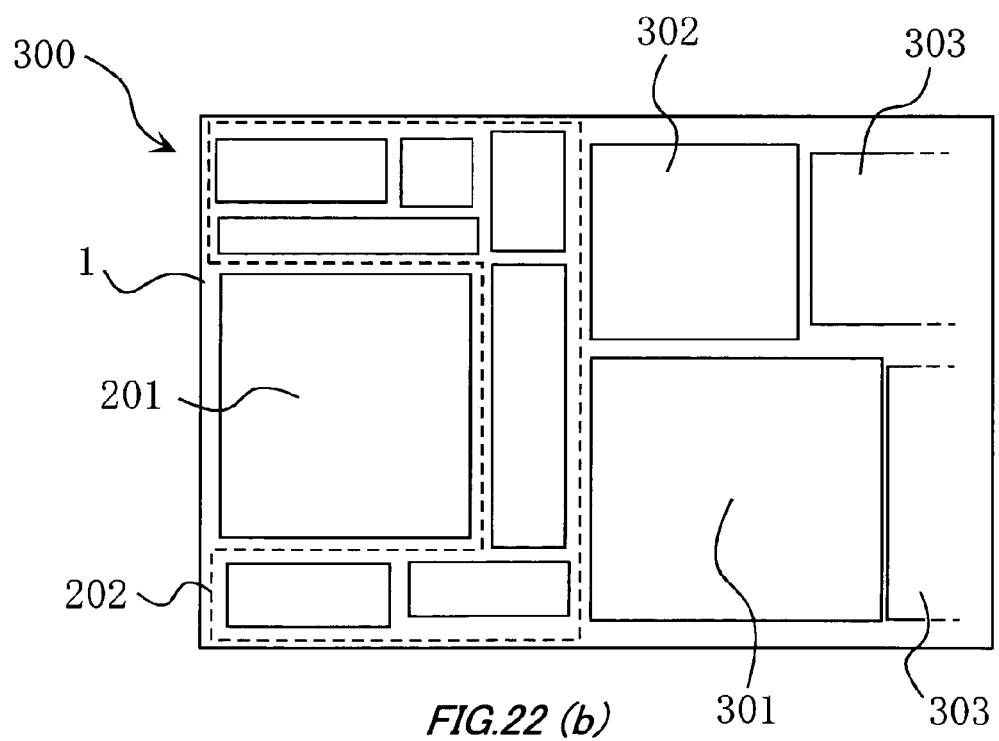

FIG. 22(a) shows the plan layout of a memory unit 200 which is an embodiment of a semiconductor device in this invention. In the memory unit 200, a memory cell array 201 which includes semiconductor memory elements, and peripheral circuitry 202 which includes semiconductor switching elements are arranged on an identical semiconductor substrate 1. The memory cell array 201 is such that semiconductor memory elements to be described later are arranged in the shape of an array. The peripheral circuitry 202 is formed with peripheral circuits each of which can be constructed of ordinary MOSFETs (field effect transistors), such as decoders 203, 207, a writing/erasing circuit 209, a readout circuit 208, an analog circuit 206, a control circuit 205, and several I/O circuits 204.

Further, in order that the memory device 300 of an information processing system such as personal computer or portable telephone may be constructed of a single chip as shown in FIG. 22(b), logic circuit regions for an MPU (micro processing unit) 301, a cache SRAM (static RAM) 302, logic circuits 303, analog circuits (not shown), etc. need to be arranged on the identical semiconductor substrate 1, in addition to the memory unit 200.

Heretofore, for the purpose of the coexistence of the memory cell array 201, the peripheral circuitry 202, . . . , a manufacturing cost has increased much more than in case of forming standard CMOS. In this regard, the increase of the manufacturing cost can be suppressed by this invention as clarified from the ensuing description.

As understood from the procedure of steps stated in the second embodiment, the procedure of steps for forming the semiconductor memory element of this invention is highly affinitive with a known general MOSFET formation process. As apparent from FIG. 2, the construction of the memory element is close to a known general MOSFET. In order to alter the general MOSFET into the memory element, it suffices, for example, that the sidewall spacers of the general MOSFET are employed as the memory functional units, and that LDD regions are not formed. Even when the sidewall spacers of the general MOSFET constituting a memory peripheral circuit portion, a logic circuit portion, an SRAM portion, or the like have the function of the memory functional units, a transistor performance is not spoilt as long as a sidewall spacer width is appropriate, and besides, the MOSFET is operated within a voltage range in which a rewriting operation does not occur. Accordingly, the general MOSFET and the memory element can use common sidewall spacers. Besides, the coexistence of the memory element with the general MOSFET constituting the memory peripheral circuit portion, the logic circuit portion, the SRAM portion, or the like is permitted by further forming an LDD structure only in the memory peripheral circuit portion, the logic circuit portion, the SRAM portion, or the like. In order to form the LDD structure, impurity implantation for forming LDD regions may be performed after the formation of the gate electrode and before the deposition of a material for constructing the charge storing regions. Accordingly, the memory element and the ordinary-structure MOSFET constituting the memory peripheral circuit portion, the logic circuit portion, the SRAM portion, or the like can be easily caused to coexist, merely by masking only the memory area with a photoresist in the case of performing the impurity implantation for the LDD formation. Further, when an SRAM is constructed of the memory elements and the ordinary-structure MOSFETs constituting the memory peripheral circuit portion, the logic circuit portion, the SRAM portion, etc., a semiconductor memory device, a logic circuit and the SRAM can be easily caused to coexist.

Meanwhile, in a case where a voltage higher than an allowable voltage in the logic circuit portion, the SRAM portion, or the like needs to be applied in the memory element, a high-withstand-voltage well forming mask and a high-withstand-voltage gate-insulating-film forming mask may be merely added to a standard-MOSFET forming mask. Heretofore, a process for the coexistence of an EEPROM (electrically erasable and programmable ROM) and a logic circuit portion on a single chip has been greatly different from the standard MOSFET process, and it has conspicuously increased the number of necessary masks and the number of processing steps. It is therefore permitted to sharply decrease the number of masks and the number of processing steps as compared with those in the case of the prior art where the EEPROM and the circuit of the memory peripheral circuit portion, the logic circuit portion, the SRAM portion, or the like coexist. It is accordingly possible to curtail the cost of the chip on which a semiconductor memory device coexists with the general MOSFET of the memory peripheral circuit portion, the logic circuit portion, the SRAM portion, or the like. Further, since the memory element can be fed with a high supply voltage, writing/erasing speeds can be remarkably enhanced. Moreover, since the logic circuit portion, the SRAM portion, or the like can be fed with a low supply voltage, the degradation of transistor characteristics attributed to the breakdown of the gate insulating film, or the like can be suppressed, and still lower power dissipation is achieved. It is accordingly possible to realize the logic circuit portion of high reliability and the semiconductor device having the memory elements of especially high writing/erasing speeds, the logic circuit portion and the semiconductor device being easily caused to coexist on an identical substrate.

The eighth embodiment of this invention will be described in detail with reference to FIG. 8(*a*)–FIG. 9(*e*).

In this embodiment, it will be indicated that a general MOSFET in a peripheral circuit, or the like and a semiconductor memory device can respectively be easily formed on an identical substrate at the same time without requiring any complicated process. In more detail, it will be indicated that a photolithographic step is added to the steps of forming the semiconductor memory device described in the second embodiment, so as to separate an area where LDD diffused regions are formed and an area where not, whereby a general MOSFET and a semiconductor memory element can be automatically fabricated on an identical substrate.

Now, manufacturing steps will be described in due course in conjunction with the drawings.

The left and right sides of each of the drawings show separate devices, and the left side shows a general MOSFET in a peripheral circuit area 4, while the right side shows a memory element in a memory area 5.

A process before the step of forming LDD regions may employ the same steps as in the second embodiment. That is, as shown in FIG. 8(*a*), the structure shown in FIG. 2(*a*) is formed in each of the peripheral circuit area 4 and the memory area 5.

Figure 8:
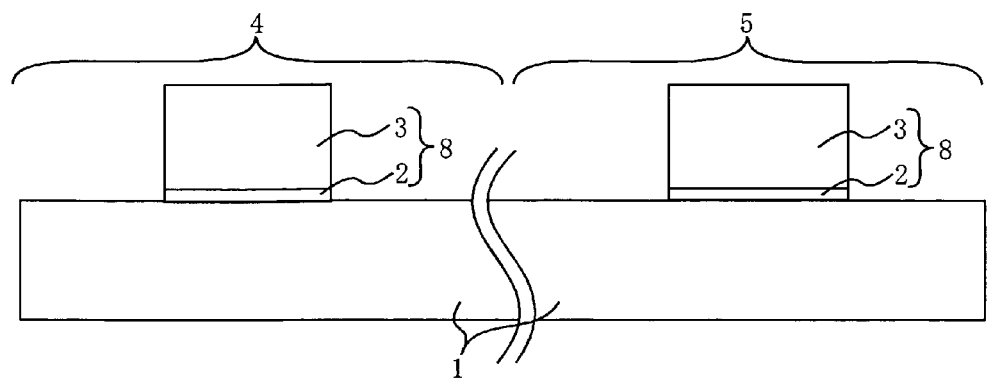
FIGS. 8a–8c are schematic sectional views showing a production process of a semiconductor memory device according to an eighth embodiment of the present invention.
Figure 8:
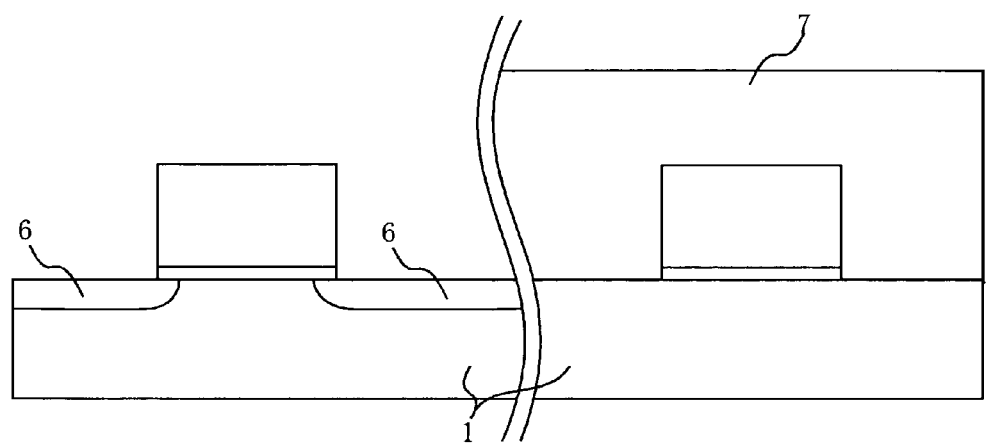
Figure 8:
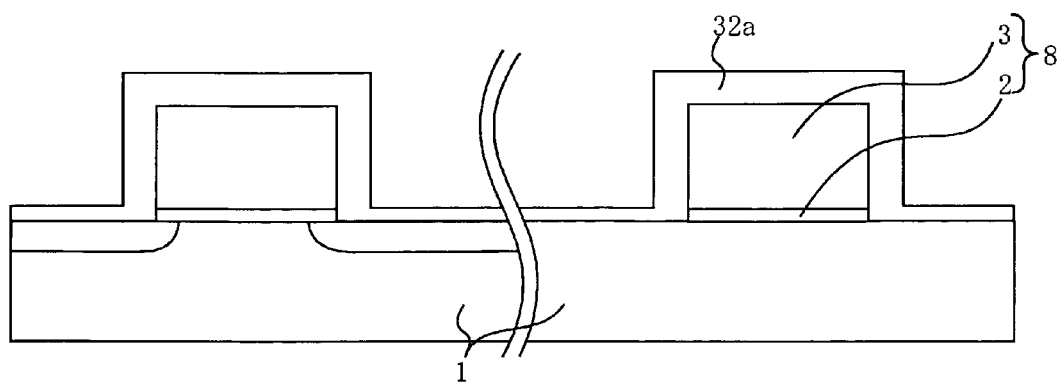

Subsequently, as shown in FIG. 8(*b*), the LDD regions 6 are formed in only the peripheral circuit area 4. On this occasion, a photoresist 7 is formed in the memory area 5, and LDD regions are not formed. Here, the LDD regions 6 have been successfully formed in the peripheral circuit area 4 for forming the general transistor of ordinary structure, without forming the LDD regions 6 in the memory area 5. The photoresist serves to prevent implantation, and it may be any being selectively removable, for example, an insulating film such as nitride film. Only this step is a special step different from the steps of the second embodiment, and thenceforth, the same steps as in the second embodiment may be used.

Subsequently, as shown in FIG. 8(*c*), a first insulator 32*a* is formed using the same step as in FIG. 2(*b*) in the second embodiment.

Figure 9:
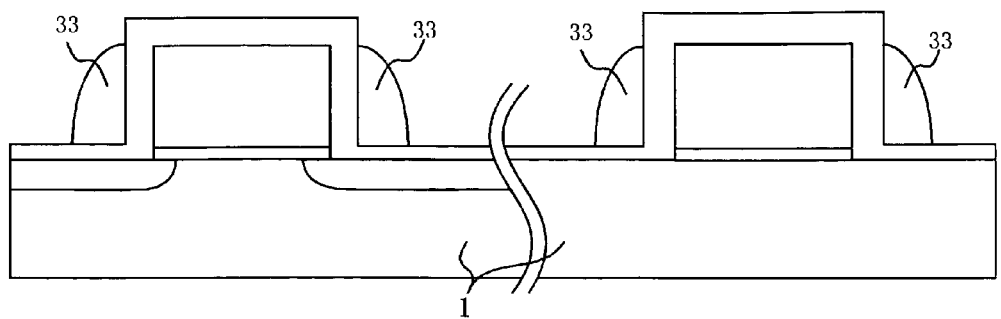
FIGS. 9d–9e are schematic sectional views showing a subsequent production process of the semiconductor memory device according to the eighth embodiment of the present invention.
Figure 9:
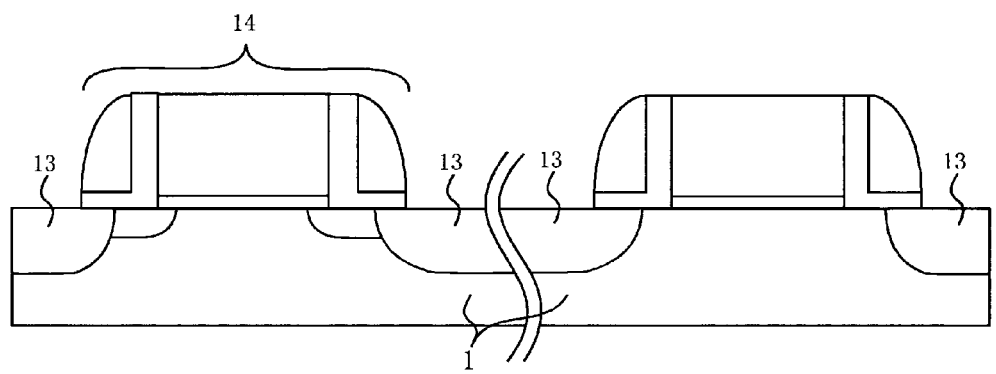

Further, as shown in FIG. 9(*d*), charge storing regions 33 are formed using the same step as in FIG. 2(*c*) in the second embodiment.

Still further, as shown in FIG. 9(*e*), source and drain diffused regions 13 are formed using the same step as in FIG. 2(*d*) in the second embodiment.

Owing to the above, the photolithographic step is added to the steps of forming the semiconductor memory device described in the second embodiment, and the area in which the LDD diffused regions 6 are formed is separated from the area in which they are not formed, whereby the general MOSFET and the semiconductor memory element have successfully been automatically fabricated on an identical substrate 1 with ease without requiring any complicated process.

(Ninth Embodiment)

The ninth embodiment of this invention will be described with reference to FIGS. 10(a)–10(i). This embodiment indicates aspects of the construction of each charge storing region 33 in any of all the above embodiments. It has advantages to be stated below, in addition to the advantages of the corresponding embodiment.

Figure 10:
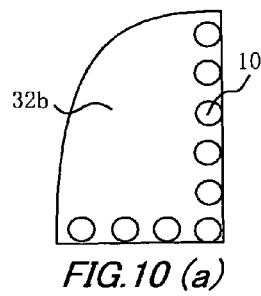
FIGS. 10a–10i are schematic sectional views showing a structural outline of a charge storing regions in a semiconductor memory device according to a ninth embodiment of the present invention.
Figure 10:
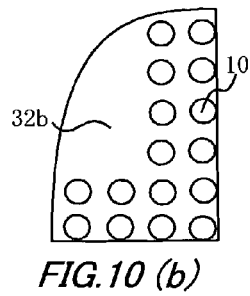
Figure 10:
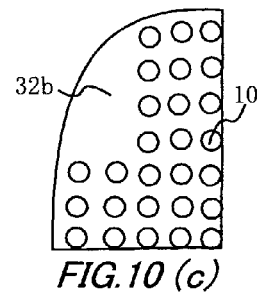
Figure 10:
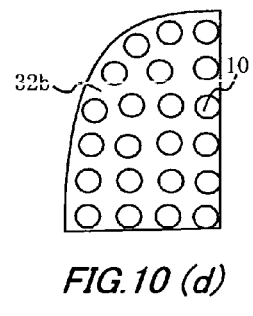
Figure 10:
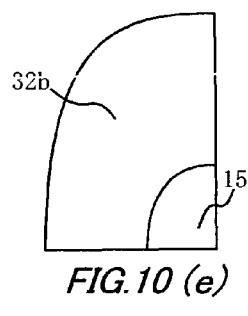
Figure 10:
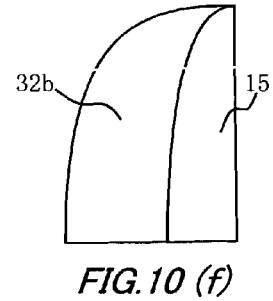
Figure 10:
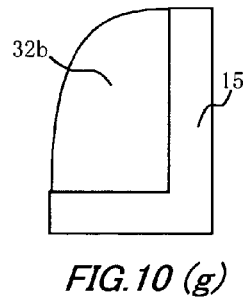
Figure 10:
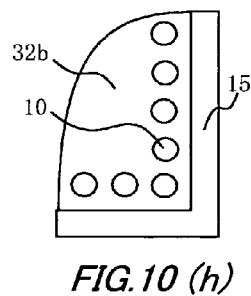
Figure 10:
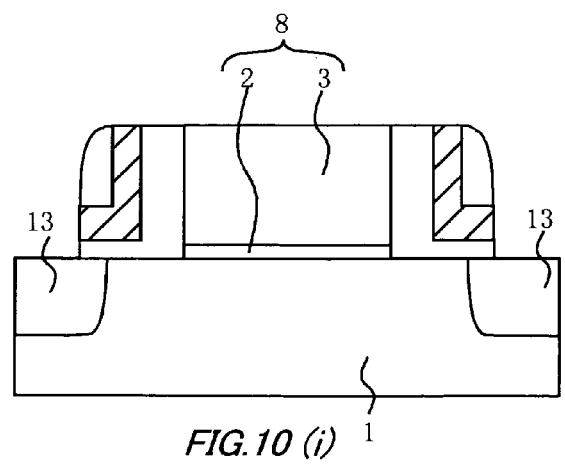

A charge storing region shown in FIG. 10(a) is such that silicon dots 10 of one layer are contained in a second insulator 32b.

As a fabricating method, silicon dots 10 are formed after the formation of a first insulator 32a, whereupon a deposited insulating film is formed and is subjected to an etching-back step and a residue removal step, whereby the illustrated structure is fabricated. The details of the individual steps will now be explained.

A method of forming the silicon dots 10 is as stated below. Using CVD, the silicon dots 10 are grown for 2 minutes by employing disilane as a raw material gas and under conditions of a pressure of 1 Torr and a substrate temperature of 700° C. The size of each silicon dot is about 5 nm. In this regard, the size of each silicon dot on this occasion should preferably be about 1–50 nm. It should more preferably be about 1–15 nm being a size which is adapted to demonstrate quantum effects such as coulomb blockade. Here, the respective conditions of the raw material gas, pressure, substrate temperature, growing time period, etc. in the CVD are appropriately altered and adjusted, whereby the silicon dots 10 can be formed by optimizing the size, density, etc.

Besides, the silicon dots 10 are formed to an appropriately larger size beforehand in consideration of the fact that the dot diameter becomes smaller due to the oxidation of the next step, whereby the silicon dots 10 of optimal shape can be formed.

Further, although no illustration is made, the surfaces of the silicon dots 10 formed should desirably be oxidized. The step of the oxidation may be thermal oxidation. In this case, as the size of each silicon dot becomes smaller, the rate of the oxidation becomes lower, so that dispersion in the sizes of the silicon dots 10 is suppressed. Besides, since the oxide film of the surface of the silicon dot serves as an insulating film through which electrons pass, it may be film of high withstand voltage, low leakage current and high reliability. The oxide film may well be, for example, an $N_2O$ oxide film or an NO oxide film. In the case of the oxide film, the thickness of the film in the final shape thereof is recommended to be about 1 to 20 nm in terms of the thickness of an equivalent oxide film including the first insulator 32a. More preferably, in a case where the size of each silicon dot is about 1–15 nm, the film thickness should desirably be about 1–10 nm. In the case where the silicon dots 10 are oxidized to a smaller size in this manner, it is needless to say that the silicon dots 10 need to be formed somewhat larger beforehand in consideration of the decrement of the size of each silicon dot while being formed. Further, in a case where the insulating film is formed so thinly that a tunnel current flows therethrough, and where charges are held by a coulomb blockade effect based on a dual tunnel junction, voltages required for injecting/erasing charges can be made low, so that power dissipation can be lowered. A typical oxide-film thickness in that case may be about 1–3 nm. Besides, the silicon dots 10 may well be deposited unevenly without presenting uniform heights as shown in the figure.

Next, a method of forming the deposited insulating film with CVD may employ a film of good step coverage utilizing HTO (High Temperature Oxide) or LPCVD (Low-Pressure Chemical Vapor Deposition). In case of employing the HTO film, its thickness may be about 20–100 nm. Incidentally, the deposited insulating film 15 is etched back into the shape of sidewall spacers at a subsequent step, and it functions as an implantation mask in the case of impurity implantation for forming source and drain diffused regions. That is, the deposited insulating film becomes an important factor for defining the shape of each of the source and drain diffused regions, particularly the offset width thereof with respect to a gate electrode end. Therefore, the optimal offset width can be attained in such a way that the thickness of the deposited insulating film is appropriately adjusted and altered, thereby forming each of the source and drain diffused regions into the optimal shape.

Subsequently, the deposited insulating film and the silicon dots 10 are anisotropically etched, whereby charge storing regions containing the silicon dots 10 and being in the shape of the sidewall spacers are formed at the sidewalls of a gate stack 8. On this occasion, different materials are selected as the materials of the first insulator 32a and the deposited insulating film, whereby the selection ratio between these films can be heightened, and the step can be performed efficiently and easily. By way of example, it is allowed to employ a nitride film as the material of the first insulator 32a, and an oxide film as the material of the deposited insulating film.

However, a silicon substrate is usually employed as a semiconductor substrate 1, and silicon is employed as the material of the dots in that case, so that the silicon dots sometimes fail to be etched and produce an etching residue. In this case, the silicon residue may be lifted off in such a way that, after the above anisotropic etching, the remaining insulating film is anisotropically etched by wet etching with hydrofluoric acid or the like. Further, in the case where the residue remains, it is allowed that oxidation is performed so as to oxidize the surface or entirety of the residue, whereupon the residue is removed by wet etching with hydrofluoric acid or the like.

The structure capable of retaining charges by the silicon dots is employed in this manner, so that even when the leakage of the insulating film degrading the retaining characteristics of a memory has occurred, all held charges do not leak, but only charges held in the silicon dots in the vicinity of the leaking part of the insulating film leak. Therefore, a semiconductor memory device of good retaining characteristics is provided.

Further, owing to the oxidation of the surfaces of the silicon dots, the dispersion of the sizes of the silicon dots can be suppressed, and a semiconductor memory device of little discrepancy in electric characteristics is provided.

Next, a charge storing region shown in FIG. 10(b) has such a structure that silicon dots 10 of two layers are contained in a second insulator 32b. As a fabricating method, the silicon dots 10 are formed by the method shown in FIG. 10(a), after the formation of a first insulator 32a, and the surfaces of the silicon dots 10 are oxidized. Thereafter, the silicon dots 10 are further formed by the same method. Subsequently, a deposited insulating film is formed, and it is subjected to an etching-back step and a residue removal step. Then, the illustrated structure is fabricated. The individual steps may be the methods explained with reference to FIG. 10(a).

Owing to the structure, the silicon dots 10 construct two or more multiple dots in a vertical direction, so that a memory retaining performance is enhanced much more than in the case of the dots of the single layer. Further, since the number of the silicon dots 10 in a memory function film becomes larger than in the case of the dots of the single layer, the number of held charges increases. Accordingly, the difference of threshold voltages and the difference of driving currents in writing and erasing increase, so that a semiconductor memory element of large voltage margin and enhanced reliability can be formed.

Next, a charge storing region shown in FIG. 10(c) has such a structure that silicon dots 10 of three layers are contained in a second insulator 32b. As a fabricating method, the silicon dots 10 are formed by the method shown in FIG. 10(a), after the formation of a first insulator 32a, and the surfaces of the silicon dots 10 are oxidized. Further, the silicon dots 10 are formed, and their surfaces are oxidized. Thereafter, the silicon dots 10 are further formed. Subsequently, a deposited insulating film is formed, and it is subjected to an etching-back step and a residue removal step. Then, the illustrated structure is fabricated. The individual steps may be the methods explained with reference to FIG. 10(a).

Owing to the structure, the silicon dots 10 construct three or more multiple dots in a vertical direction, so that a memory retaining performance is enhanced much more than in the case of the dots of the single layer or two layers. Further, since the number of the silicon dots 10 in a memory function film becomes larger than in the case of the dots of the single layer or two layers, the number of held charges increases. Accordingly, the difference of threshold voltages and the difference of driving currents in writing and erasing is increased, so that a semiconductor memory element of large voltage margin and enhanced reliability can be formed.

Shown in FIG. 10(d) is a charge storing region in the case where silicon dots 10 are stacked to a film thickness at which a memory function film is substantially filled up. As a fabricating method, the steps of forming and oxidizing the silicon dots 10 may be further repeated a plurality of appropriate times for the methods in FIGS. 10(a)–10(c). A memory retaining performance is enhanced much more than in the case of the dots of the single layer, two layers or three layers. Further, since the number of the silicon dots 10 in the memory function film becomes larger than in the case of the dots of the single layer, two layers or three layers, the number of held charges increases. Accordingly, the difference of threshold voltages and the difference of driving currents in writing and erasing increase, so that a nonvolatile memory of large voltage margin and enhanced reliability can be formed.

Shown in FIG. 10(e) is such a structure that a deposited insulating film 15 in the shape of a very small sidewall is contained near a charge injection portion in a second insulator 32b. As a fabricating method, after the formation of a first insulator 32a, polysilicon is deposited by a method of good step coverage, such as LPCVD, and it is etched back, whereby the deposited insulating film 15 is formed only at that corner part of a charge storing region into which charges are injected, as shown in the figure. Thereafter, a deposited insulating film is formed and is subjected to an etching-back step. Then, the illustrated structure is fabricated.

Owing to the structure, electrons which are injected by writing are limited into the vicinity of a channel, so that electrons are easily removed by erasing, and erroneous erasing can be prevented. Further, the volume of the charge retaining portion which can retain charges decreases without changing the quantity of injection charges, and hence, the quantity of charges per unit volume can be increased, so that electrons can be efficiently written/erased, and a semiconductor memory device of high writing/erasing speeds is provided. This advantage is the same as in the fifth embodiment. With the structure specified above, however, the second insulator 32b further covers the deposited insulating film 15, so that the deposited insulating film 15 and contacts can be prevented from short-circuiting at contact steps for a gate electrode and source and drain diffused regions. Here, it is important that the inter-layer insulating film and the sidewall insulator are made of different materials, for example, an oxide film and a nitride film, respectively. Therefore, a designed contact margin is small and favorable, so that the device is fined. Accordingly, a semiconductor memory device of lowered cost is provided.

Shown in FIG. 10(f) is such a structure that a deposited insulating film 15 in the shape of a narrow sidewall is contained near a charge injection portion in a second insulator 32b. A forming method may be the same as in FIG. 10(e), and the structure can be formed by adjusting the deposition film thickness and etching amount of polysilicon. Also, advantages are the same as in FIG. 10(e).

Shown in FIG. 10(g) is such a structure that a charge storing region consists of a second insulator 32b and an L-shaped deposited insulating film 15. As a forming method, after the formation of a first insulator 32a, polysilicon is deposited by a method of good step coverage, such as LPCVD, and the deposited insulating film is subsequently formed. Thereafter, the polysilicon and the deposited insulating film are etched. Then, the illustrated structure is formed. Owing to the structure, the same advantages as in FIG. 10(e) can be achieved.

Besides, in a semiconductor memory device which has the charge storing regions of the structure shown in FIG. 10(g), in a case as shown in FIG. 10(i) where the first insulator 32a is made of a silicon oxide film or a silicon oxynitride film and where the deposited insulating film 15 is altered to a silicon nitride film, a better semiconductor memory device is obtained owing to points as stated below.

Since a large number of levels trapping charges are existent, large hysteresis characteristics can be attained. Besides, a charge retaining time is long, and the problem of charge leakage ascribable to the appearance of leakage paths does not occur, so that retaining characteristics are favorable. Further, since the materials are used very commonly in LSI processes, a manufacturing cost lowers.

Methods of forming the individual films may conform to the forming methods described in the second embodiment or in this embodiment. The silicon nitride film, however, should preferably be deposited by a method of good step coverage, such as LPCVD.

Shown in FIG. 10(h) is such a structure that a charge storing region consists of a second insulator 32b, an L-shaped deposited insulating film 15 and silicon dots 10. As a forming method, after the formation of a first insulator 32a, polysilicon is deposited by a method of good step coverage, such as LPCVD, and its surface is oxidized, the silicon dots are thereafter formed, and the deposited insulating film is subsequently formed. The structure may be formed using the steps in FIG. 10(a) and FIG. 10(h). Owing to the structure, a semiconductor or conductor film exists between a semiconductor substrate and a plurality of grains, whereby influence which the dispersion of the positions or sizes of the grains exerts on the threshold voltage of a field effect transistor can be suppressed. Accordingly, a semiconductor memory device of suppressed erroneous readout can be provided.

Besides, steps as stated below can be employed. After the formation of a first insulator 32a, polysilicon is deposited by a method of good step coverage, such as LPCVD, and its surface is oxidized. Thereafter, a process under the same conditions as those for the deposition of the polysilicon is carried out. Owing to the difference of the roughnesses of underlying oxide films at the first polysilicon deposition step and at the step of this time, silicon dots are formed at the step of this time. In case of performing such silicon dot formation, when the silicon dots are too small, a coulomb blockade effect is too intense and makes the injection of charges difficult, and when the silicon dots are too large, they become filmy. Therefore, the optimal thickness of the polysilicon film is about 1 to 20 nm. As a typical example, likewise to the foregoing polysilicon film, a polysilicon film of 5 nm and silicon dots can be formed by low-pressure chemical vapor deposition (LPCVD) in an $SiH_4$ atmosphere at 620° C.

The charge storing regions shown in FIG. 10(e)–FIG. 10(h) require the removal of the circumventive parts of a gate (removal regions 21) as shown in FIGS. 21(a) and 21(b), for preventing the short-circuiting between the right and left charge storing regions.

Besides, regarding the polysilicon of the charge storing regions shown in FIG. 10(e)–FIG. 10(h), any substance other than the polysilicon achieves the same advantages as long as it has the function of retaining charges. It may well be, for example, a silicon nitride film, a conductor, or ferroelectrics such as PZT or PLZT.

(Tenth Embodiment)

Figure 11:
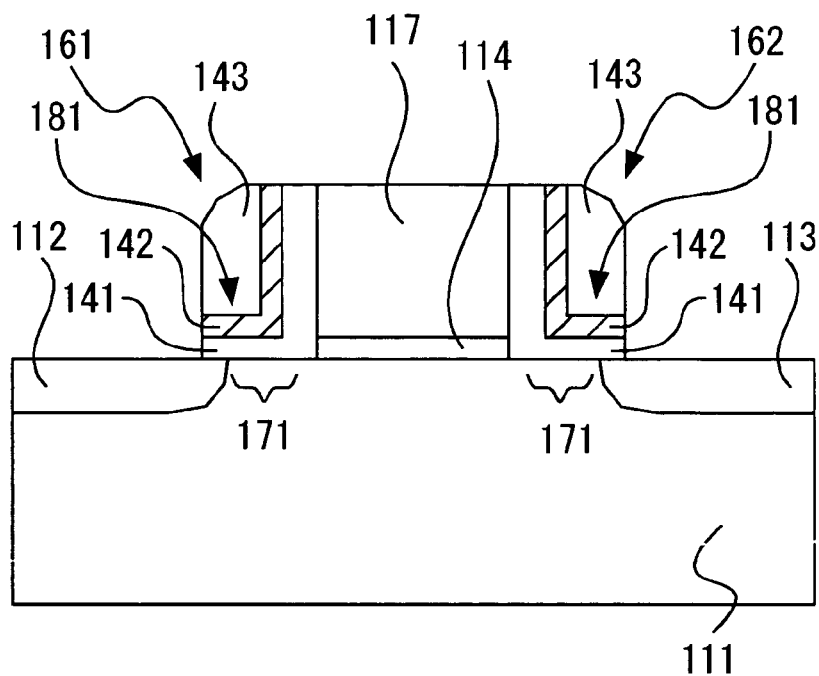
FIG. 11 is a schematic sectional view showing a structural outline of a semiconductor memory device according to a tenth embodiment of the present invention.

A semiconductor memory device in this embodiment is such that each of memory functional units 161, 162 includes a region which can retain charges (a region which stores charges, and which may well be film having the function of retaining charges), and a region which makes charges difficult to escape (which may well be a film having the function of making charges difficult to escape). By way of example, the device has an ONO structure as shown in FIG. 11. More specifically, a silicon nitride film 142 is interposed between a silicon oxide film 141 and a silicon oxide film 143, thereby constructing the memory functional unit 161 or 162. Here, the silicon nitride film 142 fulfills the function of retaining charges. Besides, the silicon oxide films 141, 143 play the role of films which has the function of making difficult the escape of the charges stored in the silicon nitride film 142.

Besides, the regions (silicon nitride films 142) capable of retaining charges, in the memory functional units 161, 162 overlap source and drain diffused regions 112, 113, respectively. Here, the "overlap" signifies that at least part of the region (silicon nitride film 142) capable of retaining charges exists over at least part of the corresponding source and drain diffused region 112 or 113. Incidentally, numeral 111 designates a semiconductor substrate, numeral 114 a gate insulating film, numeral 117 a gate electrode, and numeral 171 each offset region (between the gate electrode 117 and the diffused region 112 or 113). Although no illustration is made, the uppermost front surface part of the semiconductor substrate 111 under the gate insulating film 114 becomes a channel region.

There will be explained advantages based on the fact that the regions 142 capable of retaining charges, in the memory functional units 161, 162 overlap the source and drain diffused regions 112, 113, respectively.

Figure 12:
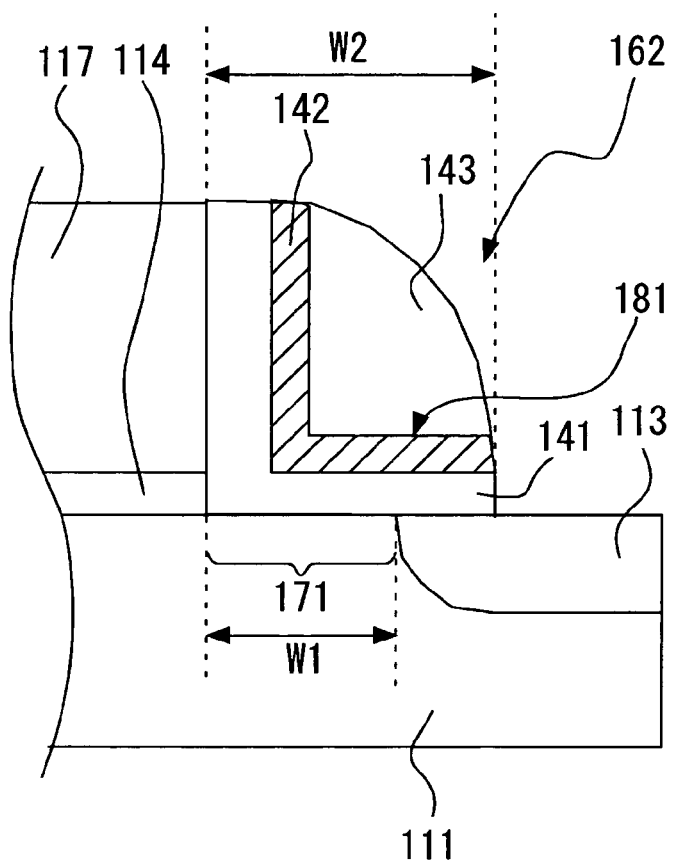
FIG. 12 is another schematic sectional view showing a structural outline of the semiconductor memory device according to the tenth embodiment of the present invention.

FIG. 12 is an enlarged view of the right memory functional unit 162 in FIG. 11 and the vicinity thereof. Sign W1 denotes the offset magnitude between the gate electrode 117 and the diffused region 113. Besides, sign W2 denotes the width of the memory functional unit 162 as viewed in the sectional plane of the gate electrode 117 in the channel length direction thereof. In the memory functional unit 162, the end of the silicon nitride film 142 remote from the gate electrode 117 coincides with the end of the memory functional unit 162 remote from the gate electrode 117, so that the width of the memory functional unit 162 is defined as W2. The overlap magnitude between the memory functional unit 162 and the diffused region 113 is represented by (W2−W1). Especially important is that, in the memory functional unit 162, the silicon nitride film 142 overlaps the diffused region 113, in other words, that the relation of W2>W1 is satisfied.

Figure 13:
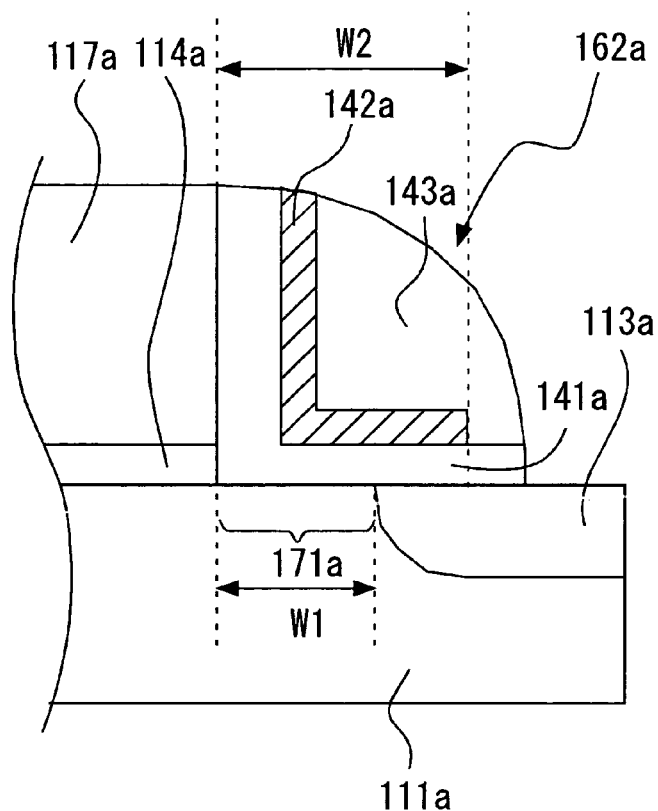
FIG. 13 is another schematic sectional view showing a structural outline of the semiconductor memory device according to the tenth embodiment of the present invention.

By the way, in a case as shown in FIG. 13 where, in a memory functional unit 162a, the end of a silicon nitride film 142a remote from a gate electrode 117a does not coincide with the end of the memory functional unit 162a remote from the gate electrode 117a, a width W2 may be defined as extend from the gate electrode end to the end of the silicon nitride film 142a remote from the gate electrode 117a.

As a drain current in an erased state (where holes are stored) in the structure shown in FIG. 12, a sufficient current value is obtained in the configuration in which the silicon nitride film 142 overlaps the diffused region 113. However, in a configuration in which the silicon nitride film 142 does not overlap the diffused region 113, a drain current decreases abruptly with the distance between the silicon nitride film 142 and the diffused region 113, and it decreases three orders or so at a distance of about 30 nm.

Since the drain current value is substantially proportional to the speed of a readout operation, the performance of the memory degrades rapidly with increase in the distance between the silicon nitride film 142 and the diffused region 113. In contrast, in the range in which the silicon nitride film 142 overlaps the diffused region 113, the decrease of the drain current is gentle. It is accordingly favorable that at least part of the silicon nitride film 142 which is the film having the function of retaining charges overlaps the source and drain region.

With the above result borne in mind, memory cell arrays were fabricated by fixing the width W2 at 100 nm and setting the width W1 at 60 nm and 100 nm as design values. In the case of the width W1 of 60 nm, the silicon nitride film 142 and the corresponding source and drain diffused region 112 or 113 overlap 40 nm as a design value, and in the case of the width W1 of 100 nm, they do not overlap as a design value. The readout times of the memory cell arrays were measured. As a result, in the worst cases with dispersions taken into consideration, the readout access time was 100 times shorter in the case where the width W1 was set as 60 nm as the design value. In practical use, the readout access time should preferably be 100 nanoseconds or below per bit, and it has been found that this requirement can be never achieved in the condition of W1=W2. It has also been revealed that, when even a manufacturing dispersion is considered, a condition of W2−W1>10 nm is more preferable.

In the readout of information stored in the memory functional unit 161 (region 181), it is favorable that, using the source and drain diffused region 112 for a source electrode and the diffused region 113 as a drain region, a pinch-off point is formed on the side of the channel region near to the drain region 113. That is, in reading out information stored in one of the two memory functional units, the pinch-off point should preferably be formed in the region of the channel region near the other memory functional unit. Thus, irrespective of the storage situation of the memory functional unit 162, the stored information of the memory functional unit 161 can be detected at a high sensitivity, and this forms an important factor for realizing a 2-bit operation.

Meanwhile, in a case where information is stored in only one of the two memory functional units, or where the memory is used by bringing the two memory functional units into an identical storage state, the pinch-off point need not always be formed in the readout mode.

Incidentally, although not shown in FIG. 11, a well region (P-type well in case of an N-channel element) should preferably be formed in the front surface of the semiconductor substrate 111. Owing to the formation of the well region, it is facilitated that, as the impurity concentration of the channel region is optimized to memory operations (rewriting operation and readout operation), the other electric characteristics (withstand voltage, junction capacitance, and short channel effect) are controlled.

From the viewpoint of enhancing the retaining characteristics of the memory, each memory functional unit should preferably include a charge retaining portion functionally capable of retaining charges, and insulating films. In this embodiment, the silicon nitride film 142 which has levels trapping charges is employed as the charge retaining portion, and the silicon oxide films 141, 143 which function to prevent the scatter of charges stored in the charge retaining portion are employed as the insulating films. Since the memory functional unit includes the charge retaining portion and the insulating films, the retaining characteristics can be enhanced by preventing the scatter of the charges. Further, the volume of the charge retaining portion can be made appropriately smaller than in a case where the memory functional unit is constructed only of the charge retaining portion. When the volume of the charge retaining portion is made appropriately small, the migration of charges within the charge retaining portion is limited, and it can be suppressed that any characteristics change ascribable to the charge migration takes place in a storage retaining state.

Figure 14:
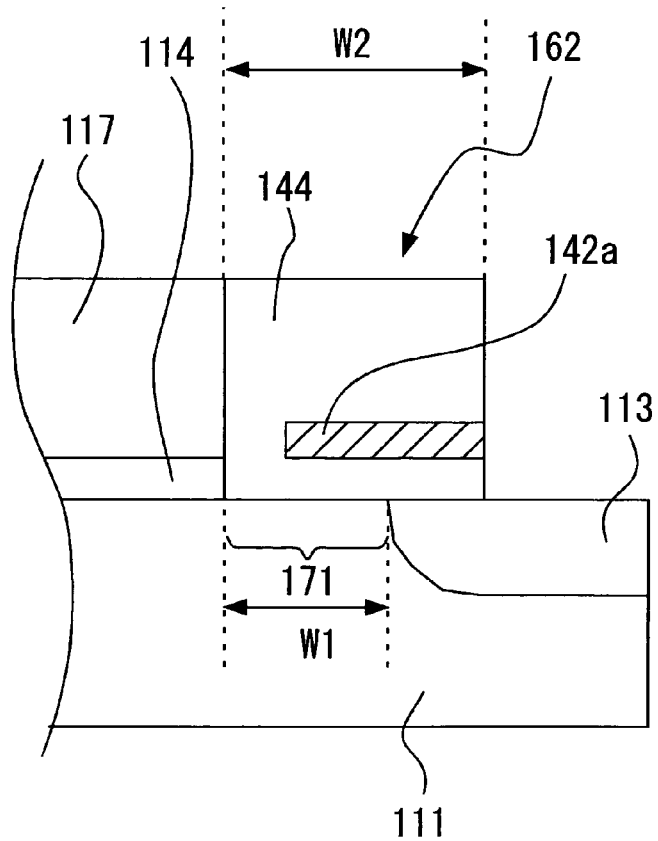
FIG. 14 is another schematic sectional view showing a structural outline of the semiconductor memory device according to the tenth embodiment of present invention.

Besides, it is favorable that each memory functional unit includes the charge retaining portion which is arranged substantially in parallel with the front surface of the gate insulating film, in other words, that the upper surface of the charge retaining portion in the memory functional unit is arranged so as to lie at equal distances from the upper surface of the gate insulating film. Concretely, as shown in FIG. 14, the charge retaining portion 142*a* of the memory functional unit 162 has a plane which is substantially parallel to the surface of the gate insulating film 114. In other words, the charge retaining portion 142*a* should preferably be formed at a: uniform height from a level which corresponds to the front surface of the gate insulating film 114.

Since the charge retaining portion 142*a* being substantially parallel to the front surface of the gate insulating film 114 exists in the memory functional unit 162, the facility of the formation of an inversion layer in the offset region 171 can be effectively controlled in accordance with the quantity of charges stored in the charge retaining portion 142*a*, and in turn, a memory effect can be intensified. Besides, since the charge retaining portion 142*a* is made substantially parallel to the front surface of the gate insulating film 114, the change of the memory effect can be held comparatively small even when the offset magnitude (W1) has dispersed, so that the dispersion of the memory effect can be suppressed. Moreover, the migration of charges upward of the charge retaining portion 142*a* is suppressed, and it can be suppressed that any characteristics change ascribable to the charge migration takes place in a storage retaining state.

Further, the memory functional unit 162 should preferably include an insulating film (for example, the part of a silicon oxide film 141 as lies on the offset region 171) which separates the charge retaining portion 142*a* being substantially parallel to the front surface of the gate insulating film 114, from the channel region (or the well region). Owing to the insulating film, the scatter of charges stored in the charge retaining portion 142*a* is suppressed, and a semiconductor memory device of still better retaining characteristics can be obtained.

Incidentally, distance from the front surface of the semiconductor substrate 111 to charges stored in the charge retaining portion 142*a* can be held approximately constant in such a way that the film thickness of the charge retaining portion 142*a* is controlled, and that the thickness of the insulating film under the charge retaining portion 142*a* (the part of the silicon oxide film 141 lying on the offset region 171) is controlled to be constant. That is, the distances from the semiconductor substrate surface to the charges stored in the charge retaining portion 142*a* can be controlled between the minimum thickness value of the insulating film under the charge retaining portion 142*a* and the sum of the maximum thickness value of the insulating film under the charge retaining portion 142*a* and the maximum film thickness value of the charge retaining portion 142*a*. Thus, it is permitted to approximately control the density of the lines of electric forces generated by the charges stored in the charge retaining portion 142*a*, and to make the dispersion of the intensity of the memory effect of the memory element very small.

(Eleventh Embodiment)

Figure 15:
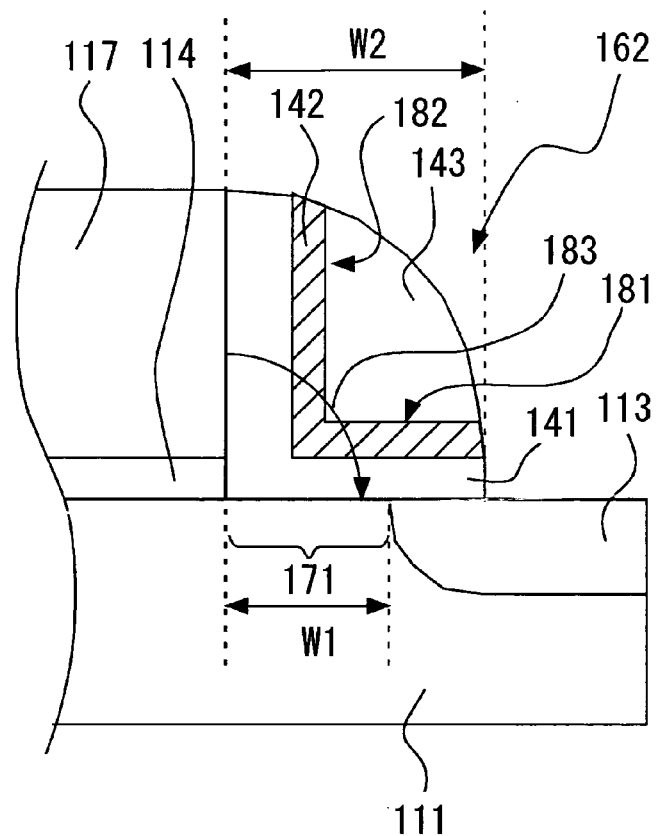
FIG. 15 is a schematic sectional view showing a structural outline of a semiconductor memory device according to an eleventh embodiment of the present invention.

In this embodiment, as shown in FIG. 15, the charge retaining portion 142 of a memory functional unit 162 has a substantially uniform film thickness, and it has a configuration in which it is arranged substantially in parallel with the front surface of a gate insulating film 114 (as indicated by an arrow 181) and is also arranged substantially in parallel with the side surface of a gate electrode 117 (as indicated by an arrow 182).

In a case where a positive voltage is applied to the gate electrode 117, a line of an electric force, i.e. an electric field, in the memory functional unit 162 passes through the silicon nitride film 142 twice as indicated by an arrow 183 (the parts indicated by the arrows 182 and 181). Incidentally, when a negative voltage is applied to the gate electrode 117, the sense of the line of an electric force becomes the opposite. Here, the relative dielectric constant of the silicon nitride film 142 is about 6, and that of silicon oxide films 141, 143 is about 4. Accordingly, the effective relative dielectric constant of the memory functional unit 162 in the direction of the line of the electric force (arrow 183) becomes larger, and the potential difference between both the ends of the line of the electric force can be made smaller, than in a case where only the charge retaining portion indicated by the arrow 181 exists. That is, the greater part of the voltage applied to the gate electrode 117 is used for intensifying an electric field in an offset region 171.

The reason why charges are injected into the silicon nitride film 142 in a rewriting operation is that generated charges are drawn by the electric field in the offset region 171. Owing to the inclusion of the charge retaining portion indicated by the arrow 182, accordingly, charges which are injected into the memory functional unit 162 in the rewriting operation increase, and a rewriting speed heightens.

By the way, in a case where the portion of the silicon oxide film 143 is also replaced with a silicon nitride film, that is, where a charge retaining portion is not uniform with respect to the level corresponding to the front surface of the gate insulating film 114, the migration of charges upward of the silicon nitride film becomes conspicuous, and retaining characteristics worsen.

It is more favorable for the same reason that the charge retaining portion is formed of a highly dielectric substance having a very large relative dielectric constant, such as hafnium oxide, instead of the silicon nitride film.

Besides, the memory functional unit should preferably further include an insulating film (the part of the silicon oxide film 141 lying on the offset region 171) which separates the charge retaining portion being substantially parallel to the front surface of the gate insulating film, from a channel region (or a well region). Owing to the insulating film, the scatter of charges stored in the charge retaining portion is suppressed, and retaining characteristics can be more enhanced.

Also, the memory functional unit should preferably further include an insulating film (the part of the silicon oxide film 141 lying electrode from the charge retaining portion extending substantially in parallel with the side surface of the gate electrode. Owing to the insulating film, electrical characteristics are prevented from changing due to the injection of charges from the gate electrode into the charge retaining portion, and the reliability of a semiconductor memory device can be enhanced.

Further, it is favorable that the thickness of the insulating film under the charge retaining portion 142 (the part of the silicon oxide film 141 lying on the offset region 171) is controlled to be constant, and that the thickness of the insulating film arranged on the side wall of the gate electrode (the part of the silicon oxide film 141 lying in touch with the gate electrode 117) is controlled to be constant. Thus, charges stored in the charge retaining portion 142 can be prevented from leaking.

According to the aspect of the present invention, at least a portion of the gate insulating film and at least a portion of the memory functional unit may be each made of an oxide film, and the gate insulating film may have an oxide film equivalent thickness smaller than that of a path extending through the memory functional unit from the side wall of the gate electrode opposed to the memory functional unit to the surface of the substrate located below the memory functional unit. Here, "the oxide film equivalent thickness" is one obtained by multiplying a thickness of an insulating film by the ratio of the dielectric constant of the oxide film to the dielectric constant of the insulating film. When the insulating film consists of some dielectric layers and one of the layers is not made of an oxide film, a nitride film for example, the equivalent thickness of the nitride film layer is taken into account for determining the oxide film equivalent thickness.

The above described structure means that the strength of an electric field in the path extending from the gate electrode to the substrate via the gate insulating film is smaller than that of an electric field in the path extending through the memory functional unit from the sidewall of the gate electrode opposing the memory functional unit to the surface of the substrate locating below the memory functional unit when a voltage is applied between the gate electrode and the substrate below the gate electrode. That is, in the case of a structure shown in FIG. 15, a gate insulating film 114 may have an oxide film equivalent thickness smaller than that of a path shown by arrow 183 and extending from a side wall of a gate electrode 117 opposed to a silicon nitride film 142 to a surface of a semiconductor substrate 111. The path extends through a silicon oxide film 141, the silicon nitride film 142 and the silicon oxide film 141 or through the silicon oxide film 141, the silicon nitride film 142, a silicon oxide film 143, the silicon nitride film 142 and the silicon oxide film 141.

In the aspect described above, since the oxide film equivalent thickness of the gate insulating film may be smaller than that of the path extending through the memory functional unit from the side wall of the gate electrode opposed to the memory functional unit to the semiconductor substrate, a threshold voltage in the case, for example, where the gate insulating film is employed as that of a MOSFET can be set low, and low voltage drive of low readout voltage can be realized. Accordingly, a semiconductor memory device of low power consumption can be provided.

Further, at least a portion of the gate insulating film and at least a portion of the memory functional unit may be each made of an oxide film, and the gate insulating film may have an oxide film equivalent thickness larger than that of a path extending through the memory functional gate electrode opposed to the memory functional unit to the surface of the substrate located below the memory functional unit. That is, in the case of the structure shown in FIG. 15, a gate insulating film 114 may have an oxide film equivalent thickness greater than that of the path shown by arrow 183.

In the aspect described above, by way of example, information can be written by impressing potentials of 10 volts and 0 volt on the gate electrode and the source and drain diffused regions, respectively, information can be erased by impressing potentials of −10 volts and 0 volt on the gate electrode and the source and drain diffused regions, respectively, and a drain current does not flow because the potentials of one of the source and drain diffused regions and the other are equal. Moreover, the gate insulating film is thick, and a leakage current to pass through the gate insulating film is suppressed. Therefore, a semiconductor memory device of lowered power consumption is provided. Furthermore, hot carriers are not generated, and any charge is not injected into the gate insulating film, so that the discrepancy of a threshold voltage attributed to the injection of charges into the gate insulating film is suppressed, and a semiconductor memory device of high reliability can be provided.

(Twelfth Embodiment)

Figure 16:
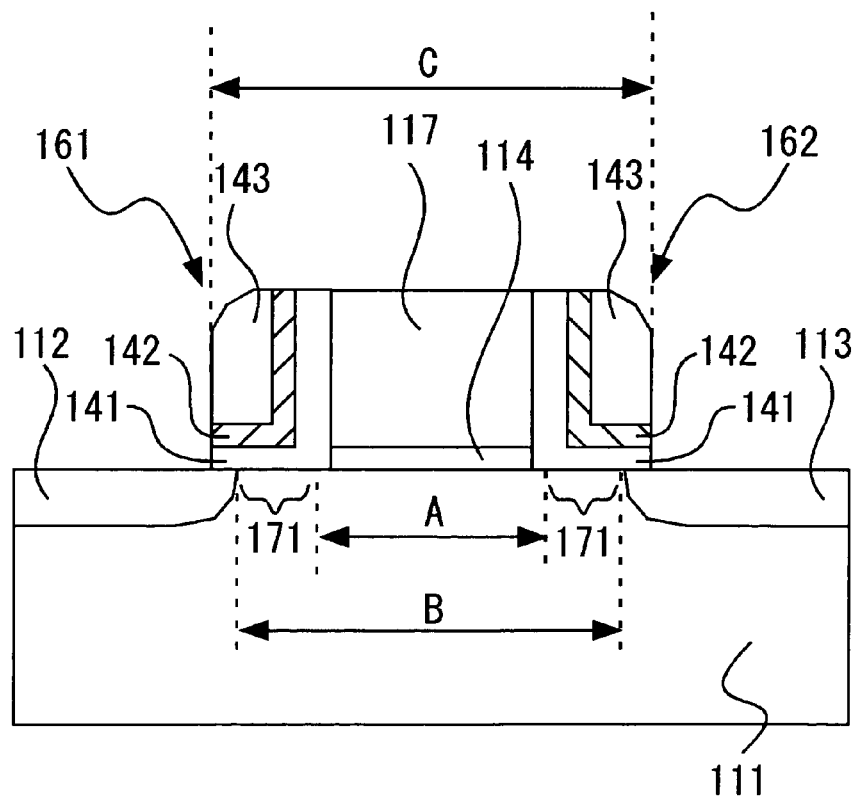
FIG. 16 is a schematic sectional view showing a structural outline of a semiconductor memory device according to a twelfth embodiment of the present invention.

This embodiment concerns the optimization of the distances among a gate electrode, memory functional units, and source and drain regions. As shown in FIG. 16, letter A indicates the length of the gate electrode as viewed in a sectional plane in a channel length direction, letter B indicates the distance between the source and drain regions (a channel length), and letter C indicates a distance from the end of one memory functional unit to the end of the other memory functional unit, that is, a distance from the end (remote from the gate electrode) of a film having the function of retaining charges, within one memory functional unit in the sectional plane in the channel length direction, to the end (remote from the gate electrode) of a film having the function of retaining charges, within the other memory functional unit.

First, it is favorable that B<C holds. In a channel region, offset regions 171 exist between a part under the gate electrode 117 and the source and drain diffused regions 112, 113. Owing to the relation of B<C, the facility of inversion effectively fluctuates in the whole offset regions 171 in accordance with charges stored in the memory functional units 161, 162 (silicon nitride films 142). Accordingly, a memory effect increases, and especially the higher speed of a readout operation is realized.

Besides, in a case where the source and drain diffused regions 112, 113 are offset with respect to the gate electrode 117, that is, in a case where A<B holds, the facility of the inversion of the offset regions 171 in the case of applying a voltage to the gate electrode 117 changes greatly in accordance with the quantities of charges stored in the memory functional units, so that the memory effect increases, and a short channel effect can be reduced. However, insofar as the memory effect arises, the offset regions 171 need not always exist. Even in the non-existence of the offset regions 171, the memory effect can arise in the memory functional units 161, 162 (silicon nitride films 142) if the impurity concentrations of the source and drain diffused regions 112, 113 are sufficiently low.

Accordingly, it is the most favorable that A<B<C holds.

(Thirteenth Embodiment)

Figure 17:
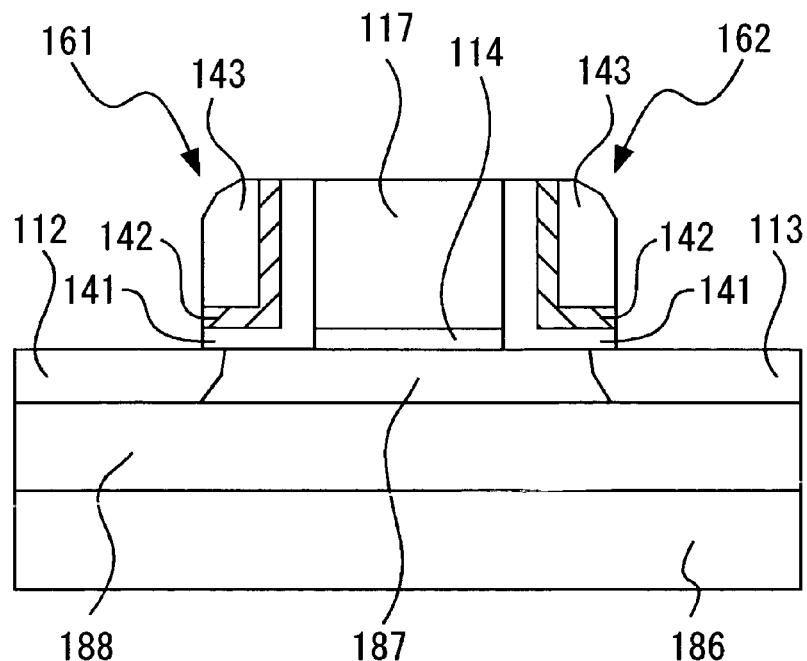
FIG. 17 is a schematic sectional view showing a structural outline of a semiconductor memory device according to a thirteenth embodiment of the present invention.

As shown in FIG. 17, a semiconductor memory device in this embodiment has substantially the same construction as in the eighth embodiment, except that the semiconductor substrate is replaced with an SOI substrate. Here, a substrate floating effect peculiar to the SOI substrate becomes easy of appearance, so that the generation efficiency of hot electrons can be enhanced, and a writing speed can be heightened.

The semiconductor memory device is such that a buried oxide film 188 is formed on a semiconductor substrate 186, and that it is further overlaid with an SOI layer. Source and drain diffused regions 112, 113 are formed in the SOI layer, and the other region forms a body region 187.

Also in the semiconductor memory device, the same operations and advantages as in the semiconductor memory device in the eighth embodiment are achieved. Further, the junction capacitances between the source and drain diffused regions 112, 113 and the body region 187 can be made conspicuously small, so that the heightened operating speeds and lowered power dissipation of the element become possible.

(Fourteenth Embodiment)

Figure 18:
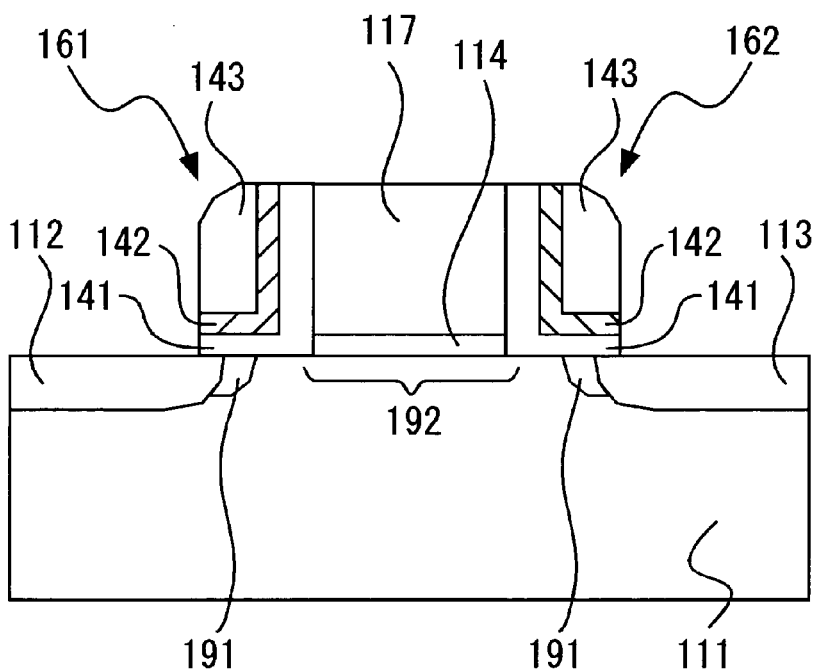
FIG. 18 is a schematic sectional view showing a structural outline of a semiconductor memory device according to a fourteenth embodiment of the present invention.

As shown in FIG. 18, a semiconductor memory device in this embodiment has substantially the same construction as that of the tenth embodiment, except that P-type high-concentration regions 191 are added in adjacency to the channel sides of the source and drain diffused regions 112, 113 of N-type.

More specifically, the concentration of an impurity (for example, boron) affording the P-type in each P-type high-concentration region 191 is higher than that of the impurity affording the P-type in a P-type region 192. The P-type impurity concentration in the P-type high-concentration region 191 should suitably be, for example, about $5 \times 10^{17} - 1 \times 10^{19}$ cm$^{-3}$. Besides, the P-type impurity concentration in the P-type region 192 can be set at, for example, $5 \times 10^{16} - 1 \times 10^{18}$ cm$^{-3}$.

When the P-type high-concentration regions 191 are disposed in this manner, the junctions between the source and drain diffused regions 112, 113 and the semiconductor substrate 111 become abrupt directly under the memory functional units 161, 162. Therefore, hot carriers are easily generated in writing and erasing operations, so that the voltages of the writing and erasing operations can be lowered, or the speeds of them can be heightened. Further, since the impurity concentration of the P-type region 192 is comparatively low, a threshold voltage in the erased state of a memory is low, and a drain current becomes large. Therefore, a readout speed is enhanced. It is accordingly possible to obtain a semiconductor memory device of low rewriting voltage or high rewriting speed and high readout speed.

Besides, referring to FIG. 18, the P-type high-concentration regions 191 are disposed under the memory functional units 161, 162 (that is, not directly under the gate electrode 117) in the vicinities of the source and drain regions 112, 113, whereby the threshold voltage of the whole transistor rises conspicuously. The degree of the rise is much higher than in a case where the P-type high-concentration regions 191 lie directly under the gate electrode 117. In a case where writing charges (electrons in the case where the transistor is of the N-channel type) have been stored in the memory functional units, the difference of the threshold voltages enlarges still more. On the other hand, in a case where sufficient erasing charges (holes in the case where the transistor is of the N-channel type) have been stored in the memory functional units, the threshold voltage of the whole transistor lowers to a value which is determined by the impurity concentration of the channel region (P-type region 192) under the gate electrode 117. That is, the threshold voltage in the erasing mode does not depend upon the impurity concentration of the P-type high-concentration regions 191, whereas the threshold voltage in the writing mode is very greatly affected by the impurity concentration. Therefore, when the P-type high-concentration regions 191 are arranged under the memory functional units 161, 162 and in the vicinities of the source and drain regions 112, 113, only the threshold voltage in the writing mode fluctuates very greatly, and a memory effect (the difference between the threshold voltages in the writing mode and the erasing mode) can be remarkably intensified.

(Fifteenth Embodiment)

Figure 19:
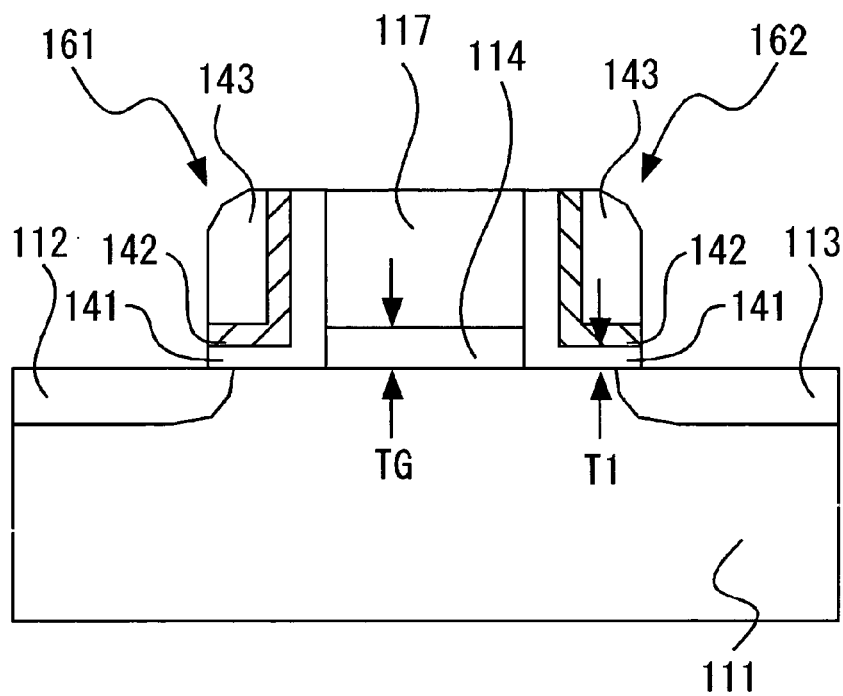
FIG. 19 is a schematic sectional view showing a structural outline of a semiconductor memory device according to a fifteenth embodiment of the present invention.

As shown in FIG. 19, a semiconductor memory device in this embodiment has substantially the same construction as that of the tenth embodiment, except that the thickness (T1) of the insulating films 141 which separate the charge retaining portions (silicon nitride films 142) from the channel region or the well region is smaller than the thickness (TG) of the gate insulating film 114.

The gate insulating film 114 has a lower-limit value in its thickness TG on account of a requirement for a withstand voltage in the rewriting operation of a memory. The thickness T1 of the insulating film 114, however, can be made smaller than the thickness TG irrespective of the requirement for the withstand voltage. When the thickness T1 is made small, the injection of charges into the memory functional unit 161 or 162 is facilitated, it is permitted to lower the voltages of writing and erasing operations or to heighten the speeds of them. Moreover, the quantity of charges which are induced in the channel region or the well region when charges have been stored in the silicon nitride film 142 increases, so that a memory function can be intensified.

Accordingly, when T1<TG is held, it is permitted to lower the voltages of the writing and erasing operations or heighten the speeds of them, and also to intensify the memory effect, without degrading the withstand performance of the memory.

Incidentally, the thickness T1 of the insulating films 141 should more preferably be at least 0.8 nm being a limitation at which a homogeneity and a film property based on a manufacturing process can keep certain standards, and at which retaining characteristics are not extremely degraded.

(Sixteenth Embodiment)

Figure 20:
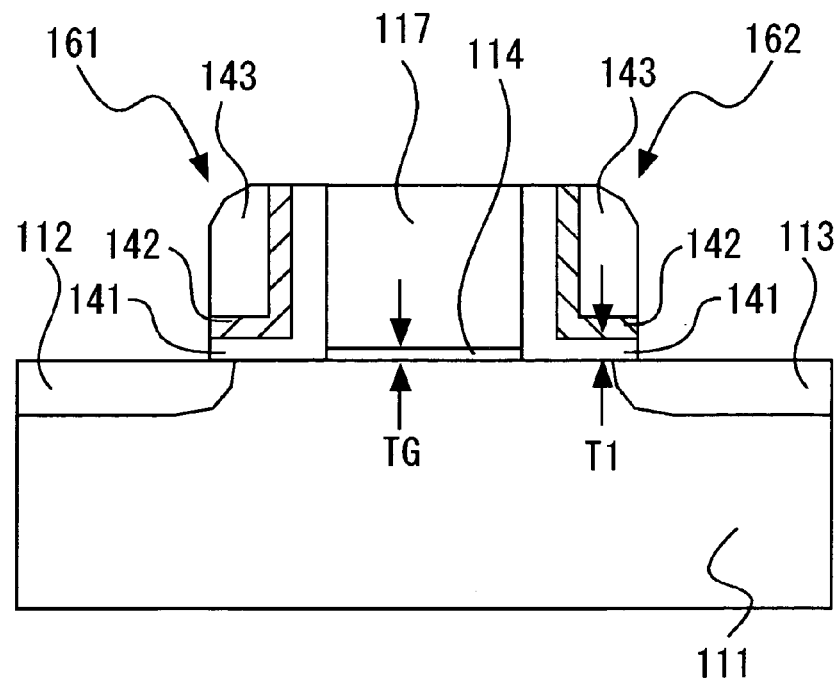
FIG. 20 is a schematic sectional view showing a structural outline of a semiconductor device according to a sixteenth embodiment of the present invention.

As shown in FIG. 20, a semiconductor memory device in this embodiment has substantially the same construction as that of the tenth embodiment, except that the thickness (T1) of the insulating films 141 which separate the charge retaining portions (silicon nitride films 142) from the channel region or the well region is larger than the thickness (TG) of the gate insulating film 114.

The gate insulating film 114 has an upper-limit value in its thickness TG on account of a requirement for preventing the short channel effect of an element. The thickness T1 of the insulating film 114, however, can be made larger than the thickness TG irrespective of the requirement for the prevention of the short channel effect. When the thickness T1 is made large, charges stored in the charge storing region 142 can be prevented from scattering, and the retaining characteristics of the memory can be improved.

Accordingly, when T1>TG is held, it is permitted to improve the retaining characteristics of the memory, without worsening the short channel effect thereof.

Incidentally, the thickness T1 of the insulating films 141 should preferably be at most 20 nm, in consideration of the lowering of a rewriting speed.

(Seventeenth Embodiment)

Figure 23:
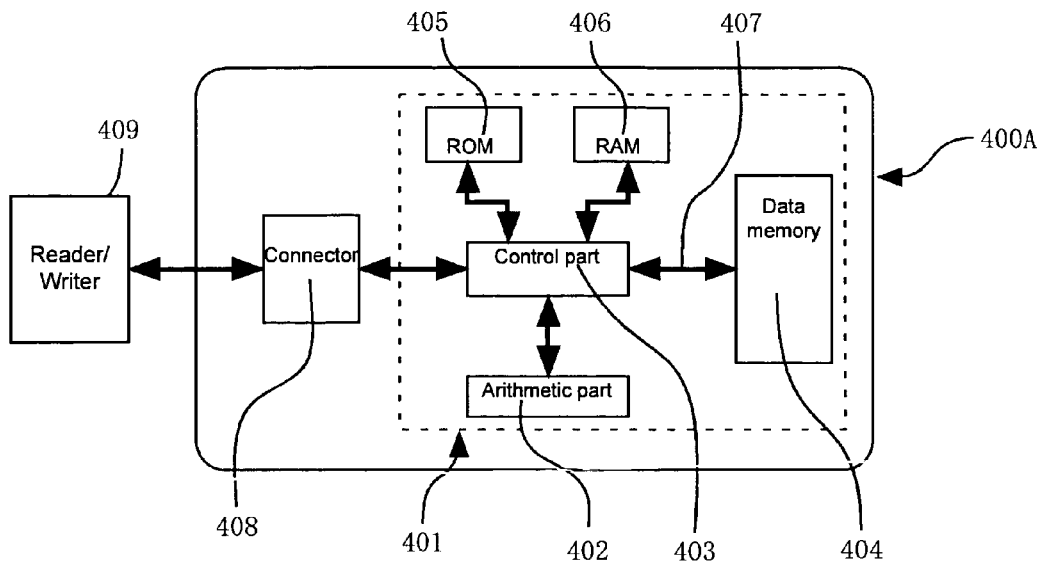
FIGS. 23a–23b are a schematic block diagrams showing an IC card of a seventeenth embodiment of the present invention.
Figure 23:
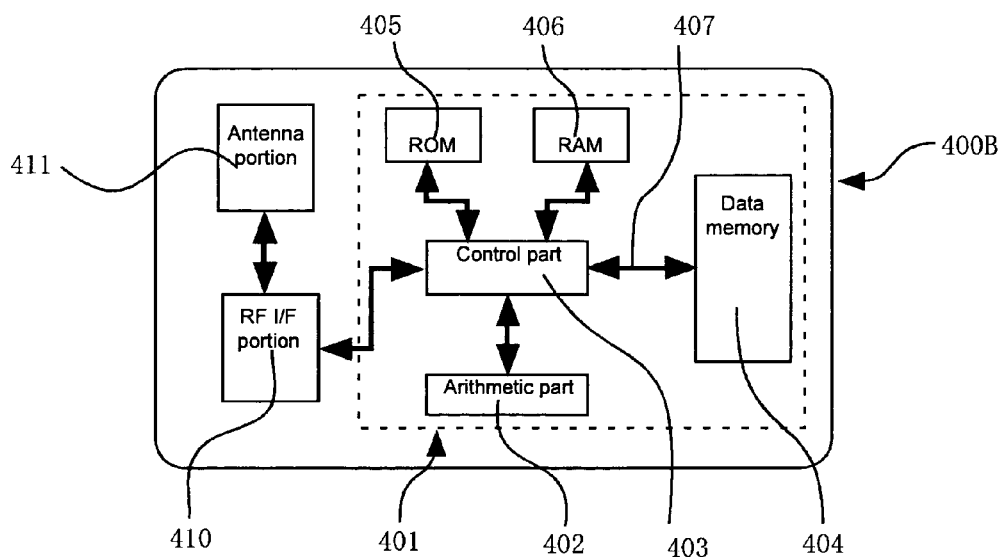

The seventeenth embodiment of this invention will be described with reference to FIG. 23. FIGS. 23(a) and 23(b) are diagrams each showing the construction of an IC card. As shown in FIG. 23(a), an MPU (Micro Processing Unit) portion 401 and a connector portion 408 are built in the IC card 400A. The MPU portion 401 includes therein a data memory part 404, an arithmetic part 402, a control part 403, a ROM (Read Only Memory) 405 and a RAM (Random Access Memory) 406, which are formed on a single chip. The semiconductor device of this invention is incorporated in the MPU portion 401. The various constituents are interconnected by wiring lines 407 (including a data bus, power source lines, etc.). Besides, when the IC card 400A is mounted on an external reader/writer 409, the connector portion 408 and the reader/writer 409 are connected, whereby electric power is fed to the card 400A, and data are exchanged.

The feature of this embodiment is the point that the MPU portion 401 and the data memory part 404 are formed on the single semiconductor chip, thereby constructing the MPU portion 401 having the coexistent data memory part 404. A semiconductor memory element capable of curtailing a manufacturing cost as disclosed in this invention is employed as the data memory part 404.

Since the semiconductor memory element is easy of microfabrication and is capable of 2-bit operation, the area of a memory cell array in which such elements are arrayed is also reduced with ease. Accordingly, the cost of the memory cell array can be curtailed. When the memory cell array is used as the data memory part 404 of the IC card 400A, the cost of the IC card 400A is curtailed.

Besides, since the data memory part 404 is included in the MPU portion 401 and is formed on the single chip, the cost of the IC card 400A can be curtailed much.

Further, the semiconductor memory element of this invention is employed for the data memory part 404, and the semiconductor elements of this invention are employed for logic circuit parts, that is, the MPU portion 401 is formed of the semiconductor devices of this invention. Therefore, elements constituting the logic circuit parts (arithmetic part 402 and control part 403) of the MPU portion 401, and a formation process therefor are very similar to those in the case of employing, for example, a flash memory, and the data memory part 404 and the logic circuit parts can be very easily caused to coexist, so that a coexistent mounting process is remarkably simplified. Accordingly, the advantage of cost curtailment based on forming the MPU portion 401 and the data memory part 404 on the single chip becomes very great.

Incidentally, the ROM 405 may well be constructed of the semiconductor memory elements. In this way, the ROM 405 in which a program for driving the MPU portion 401 is stored can be rewritten from outside, and the performance of the IC card 400A can be sharply heightened. Since the memory element is easy of microfabrication and is capable of 2-bit operation, the increase of a chip area is hardly incurred even when the mask ROM is replaced with the memory elements. Moreover, since a process for forming the semiconductor memory element is hardly different from an ordinary CMOS forming process, the coexistence thereof with the logic circuit parts is easy.

Next, as shown in FIG. 23(b), an MPU portion 401, an RF interface portion 410 and an antenna portion 411 are built in the IC card 400B. The MPU portion 401 includes therein a data memory part 404, an arithmetic part 402, a control part 403, a ROM 405 and a RAM 406, which are formed on a single chip. The various constituents are interconnected by wiring lines 407 (including a data bus, power source lines, etc.).

The IC card 400B in FIG. 23(b) differs from the IC card 400A in FIG. 23(a) in the point that the former is of non-contact type. Therefore, the control part 403 is connected with the RF interface portion 410, not with the connector portion 408. The RF interface portion 410 is further connected to the antenna portion 411. The antenna portion 411 has the functions of communicating with external equipment and collecting electric power. The RF interface portion 410 has the function of rectifying a radio frequency signal transmitted from the antenna portion 411, so as to feed electric power, and the functions of modulating and demodulating signals. Incidentally, the RF interface portion 410 and the antenna portion 411 may well be mounted in coexistence with the MPU portion 401 on a single chip.

Since the IC card 400B in this embodiment is of the non-contact type, it can prevent electrostatic breakdown which might occur through the connector portion. Besides, since it need not always held in close contact with the external equipment, the aspect of its use becomes more versatile. Furthermore, a semiconductor memory element constituting the data memory part 404 operates with a supply voltage (for example, about 9 V) which is lower than that of a prior-art flash memory (a supply voltage of about 12 V), so that the circuit of the RF interface portion 410 can be reduced in size, to curtail a cost.

(Eighteenth Embodiment)

Figure 24:
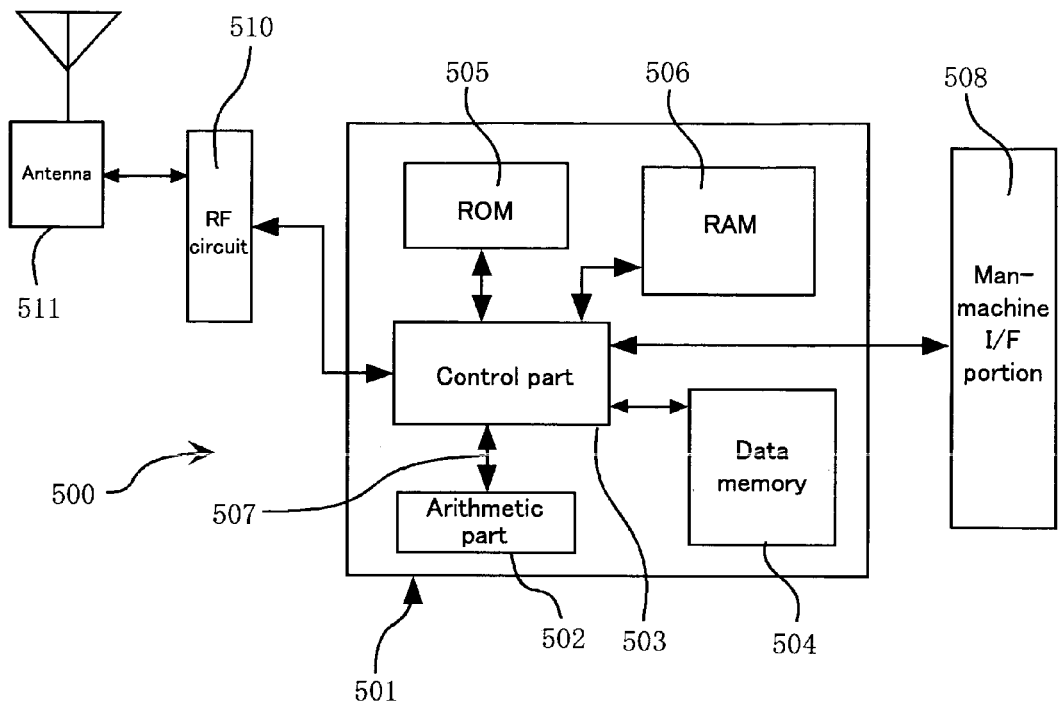
FIG. 24 is a schematic block diagram showing portable electronic equipment according to an eighteenth embodiment of the present invention.
Figure 25:
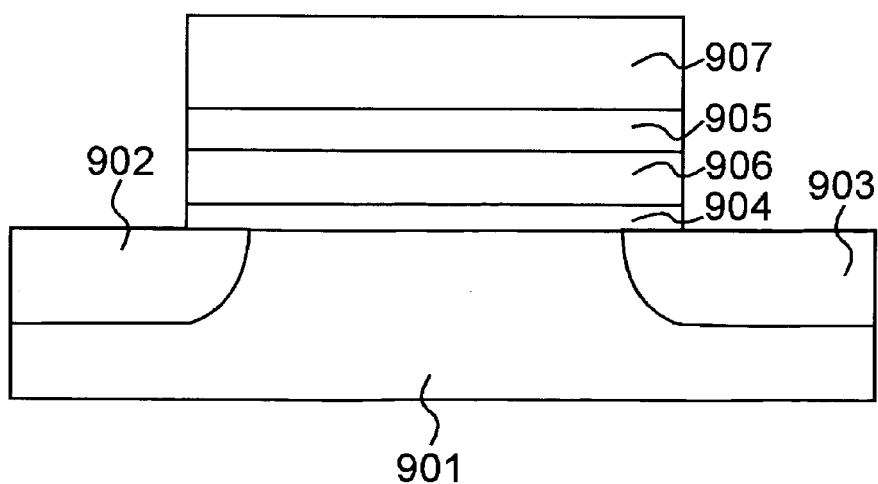
FIG. 25 is a schematic sectional view showing a structural outline of a conventional semiconductor memory device.

The eighteenth embodiment of this invention will be described with reference to FIG. 24. The semiconductor memory device or the semiconductor device described in any of the foregoing embodiments can be applied to battery-driven portable electronic equipment, especially portable information terminal. The portable information terminal, a portable telephone a game machine, etc. are mentioned as the portable electronic equipment. FIG. 24 shows an example of the portable telephone. The semiconductor device of this invention is incorporated in an MPU portion 501.

When the semiconductor device of this invention is applied to the portable electronic equipment, the manufacturing cost of a control circuit can be curtailed, so that the cost of the portable electronic equipment itself can be curtailed. Alternatively, a nonvolatile memory included in the control circuit is enlarged in capacity, and the performance of the portable electronic equipment can be heightened.

As shown in FIG. 24, the portable telephone 500 includes therein the MPU portion 501, a man-machine interface portion 508, an RF (radio frequency) circuit portion 510, and an antenna portion 511. The MPU portion 501 includes therein a data memory part 504, an arithmetic part 502, a control part 503, a ROM 505 and a RAM 506, which are formed on a single chip. The various constituents are interconnected by wiring lines 507 (including a data bus, power source lines, etc.).

The feature of this embodiment is the point that the MPU portion 501 and the data memory part 504 are formed on the single semiconductor chip, thereby constructing the MPU portion 501 having the coexistent data memory part 504. A semiconductor memory element capable of curtailing a manufacturing cost as disclosed in this invention is employed as the data memory part 504.

Since the semiconductor memory element is easy of microfabrication and is capable of 2-bit operation the area of a memory cell array in which such elements are arrayed is also reduced with ease. Accordingly, the cost of the memory cell array can be curtailed. When the memory cell array is used as the data memory part 504 of the portable telephone 500, the cost of the portable telephone 500 is curtailed.

Besides, since the data memory part 504 is included in the MPU portion 501 and is formed on the single chip, the cost of the portable telephone 500 can be curtailed much.

Further, the semiconductor memory element of this invention is employed for the data memory part 504, and the semiconductor elements of this invention are employed for logic circuit parts, that is, the MPU portion 501 is formed of the semiconductor devices of this invention. Therefore, elements constituting the logic circuit parts (arithmetic part 502 and control part 503) of the MPU portion 501, and a formation process therefore are very similar to those in the case of employing, for example, a flash memory, and the data memory part 504 and the logic circuit parts can be very easily caused to coexist, so that a coexistent mounting process is remarkably simplified. Accordingly, the advantage of cost curtailment based on forming the MPU portion 501 and the data memory part 504 on the single chip becomes very great.

Incidentally, the ROM 505 may well be constructed of the semiconductor memory elements. In this way, the ROM 505 in which a program for driving the MPU portion 501 is stored can be rewritten from outside, and the performance of the portable telephone 500 can be sharply heightened. Since the memory element is easy of microfabrication and is capable of 2-bit operation, the increase of a chip area is hardly incurred even when the mask ROM is replaced with the memory elements. Moreover, since a process for forming the semiconductor memory element is hardly different from an ordinary CMOS forming process, the coexistence thereof with the logic circuit parts is easy.

This invention brings forth a large number of great advantages.

According to the semiconductor memory device of one embodiment of this invention, the charge retaining portion of each memory functional unit is formed sideward of a gate electrode, not in the gate insulating film portion of a field effect transistor, so that over-erasure and the problem of defective readout pertaining thereto are substantially eliminated.

Besides, a anti-dissipation insulating film which can suppress the scatter of charges from the charge retaining portion of the memory functional unit is existent, so that the retaining time of charges is enhanced.

The distance (T2) between the sidewall of the gate electrode and the charge retaining portion opposing to this sidewall is made different from the distance (T1) between the bottom of the charge retaining portion located on the semiconductor substrate side thereof. Thus, when the distance T1 is made smaller than the distance T2 by way of example, charges injected from a semiconductor substrate can be restrained from penetrating the memory functional unit to the gate electrode, and conversely when the distance T1 is made larger than the distance T2, charges injected from the gate electrode can be restrained from penetrating the memory functional unit to the semiconductor substrate. It is therefore possible to obtain a semiconductor memory device of high charge injection efficiency and high writing/erasing speeds.

Besides, according to the semiconductor device of an embodiment of this invention, a semiconductor element in which source and drain diffused regions are not offset with respect to the end parts of a gate electrode, and a semiconductor memory element in which they are offset, are mounted in coexistence on an identical substrate, and memory functional units having the function of storing charges are arranged at the sidewalls of the gate electrode in each of the semiconductor element and the semiconductor memory element. Since, however, the fabricating processes of both the elements do not differ greatly, the coexistence of, for example, a nonvolatile memory including the semiconductor memory element, and a logic circuit including the semiconductor element, is very easily realized. Moreover, since the thickness of a gate insulating film is not limited, a semiconductor device to which the most advanced MOSFET manufacturing process is easily applicable can be provided.

Besides, according to the IC card of an embodiment of this invention, a semiconductor device in which a nonvolatile memory and its peripheral circuit portion, logic circuit parts, an SRAM part, etc. are easily mounted in coexistence and whose cost can be lowered can be included, so that an IC card of curtailed cost can be provided.

Besides, according to the portable electronic equipment of this invention, a portable telephone, for example, can include a semiconductor device in which a nonvolatile memory and its peripheral circuit portion, logic circuit parts, an SRAM part, etc. are easily mounted in coexistence and whose cost can be lowered, so that a portable telephone of curtailed cost can be provided.

Besides, according to the manufacturing method of an embodiment of this invention for a semiconductor memory device, the thickness of that part of the insulating film of a semiconductor memory element which lies in touch with the gate electrode of the element can be made much different from the thickness of that part thereof which lies in touch with the semiconductor substrate of the element, whereby it is permitted to suppress defective erasing in an erasing mode or to heighten writing/erasing speeds. More specifically, in a case where the thickness of the insulating film at the part lying in touch with the semiconductor substrate is made smaller than the thickness of the insulating film at the part lying in touch with the gate electrode, the defective erasing in the erasing mode can be suppressed, or charges injected from the semiconductor substrate can be restrained from penetrating the insulating film to the gate electrode, so that a semiconductor memory device of good charge injection efficiency and high writing/erasing speeds can be provided. Conversely, in a case where the thickness of the first insulating film at the part lying in touch with the semiconductor substrate is made larger than the thickness of the first insulating film at the part lying in touch with the gate electrode, charges injected from the gate electrode can be restrained from penetrating the first insulating film to the semiconductor substrate, so that a semiconductor memory device of good charge injection efficiency and high writing/erasing speeds can be provided.

Further, the source and drain diffused regions of a semiconductor memory element can be formed so as to offset with respect to the gate electrode of the element and so as to be overlapped by the charge storing regions of the element, so that a memory effect is favorable, and that a current value in the readout operation of a semiconductor memory device is enhanced much more than in a case where the source and drain diffused regions are not overlapped. Thus, a readout speed is also enhanced much more, so that a semiconductor memory device of high readout speed is provided.

Besides, according to another manufacturing method of an embodiment of this invention for a semiconductor memory device, the semiconductor substrate and gate electrode of a semiconductor memory element are formed using materials of different compositions, so that the thickness of that part of the insulating film of the element which lies in touch with the gate electrode can be made much different from the thickness of that part thereof which lies in touch with the semiconductor substrate, whereby it is permitted to suppress defective erasing in an erasing mode or to heighten writing/erasing speeds.

Further, the step of forming the first insulating film of the semiconductor memory element so as to differ in the thicknesses of the part lying in touch with the gate electrode and the part lying in touch with the semiconductor substrate, can be performed by only the ordinary step of forming an insulating film, without employing an etching step or the like, so that a semiconductor memory device which does not require any complicated step and whose manufacturing cost is low can be provided.

Moreover, the source and drain diffused regions of a semiconductor memory element can be formed so as to offset with respect to the gate electrode of the element and so as to be overlapped by the charge storing regions of the element, so that a memory effect is favorable, and that a current value in the readout operation of a semiconductor memory device is enhanced much more than in a case where the source and drain diffused regions are not overlapped. Thus, a readout speed is also enhanced much more, so that a semiconductor memory device of high readout speed is provided.

Besides, according to still another manufacturing method of an embodiment of this invention for a semiconductor memory device, the impurity concentration of the gate electrode of a semiconductor memory element is at least $5\times10^{19}$ cm$^{-3}$, and hence, the effect of impurity-enhanced oxidation appears remarkably. Moreover, impurity regions each of which has an impurity concentration lower than that of a gate electrode are formed in a semiconductor substrate, and an insulating film based on a heat treatment is formed on the semiconductor substrate and the gate electrode. Thus, the thickness of that part of the first insulating film which lies in touch with the gate electrode can be made much different from the thickness of that part thereof which lies in touch with the semiconductor substrate, so that a semiconductor memory device which does not require any complicated step such as etching and whose manufacturing cost is low can be provided.

Further, in a case where the thickness of the first insulating film at the part lying in touch with the semiconductor substrate of the semiconductor memory element is made smaller than the thickness of the first insulating film at the part lying in touch with the gate electrode of the element, charges injected from the semiconductor substrate can be restrained from penetrating the first insulating film to the gate electrode, so that a semiconductor memory device of good charge injection efficiency and high writing/erasing speeds can be provided.

Besides, according to yet another manufacturing method of an embodiment of this invention for a semiconductor memory device, the impurity concentration of the gate electrode of a semiconductor memory element is at most $1\times10^{20}$ cm$^{-3}$ and is lower than that of the semiconductor substrate of the element, so that the condition under which the effect of impurity-enhanced oxidation does not appear can be set for the gate electrode, whereas the effect of impurity-enhanced oxidation begins to conspicuously appear in the semiconductor substrate when the impurity concentration thereof is higher than that of the gate electrode and is at least $5\times10^{19}$ cm$^{-3}$. Therefore, when an insulating film based on a heat treatment is formed on the semiconductor substrate and the gate electrode, the thickness of that part of the first insulating film which lies in touch with the gate electrode can be consequently made much different from the thickness of that part thereof which lies in touch with the semiconductor substrate, so that a semiconductor memory device which does not require any complicated step and whose manufacturing cost is low can be provided. In addition, the thickness of the part of the first insulating film lying in touch with the gate electrode is much different from the thickness of the part thereof lying in touch with the semiconductor substrate, so that a semiconductor memory device of remarkably high writing/erasing speeds can be provided.

Moreover, the first insulating film of the semiconductor memory element is thicker at the part lying in touch with the semiconductor substrate, than at the part lying in touch with the gate electrode, and hence, charges injected from the gate electrode can be restrained from penetrating the first insulating film to the semiconductor substrate, so that a semiconductor memory device of good charge injection efficiency and high writing/erasing speeds can be provided.

Further, in a case where the thickness of the first insulating film at the part lying in touch with the semiconductor substrate of the semiconductor memory element is made smaller than the thickness of the first insulating film at the part lying in touch with the gate electrode of the element, charges injected from the semiconductor substrate can be restrained from penetrating the first insulating film to the gate electrode, so that a semiconductor memory device of good charge injection efficiency and high writing/erasing speeds can be provided.

What is claimed is:

1. A semiconductor memory device including memory cells, each memory cell comprising:
   a gate insulating film formed on a semiconductor substrate;
   a gate electrode formed on the gate insulating film;
   a channel region located below the gate electrode;
   a pair of source and drain regions arranged on a opposite_sides; respectively, of the channel region, the source and drain regions having a conductive type opposite to that of the channel region; and memory functional units located on opposite sides, respectively, of the gate electrode, each memory functional unit including a charge retaining portion and an anti-dissipation insulator, the charge retaining portion being made of a material serving to store charges, the anti-dissipation insulator serving to prevent the stored charges from being dissipated by separating the charge retaining portion from both the gate electrode and the substrate, wherein a distance between a side wall of the gate electrode and a side of the charge retaining portion facing each other (T2) is adapted to differ from a distance between a bottom of the charge retaining portion and a surface of the substrate (T1).

2. A semiconductor memory device according to claim 1, wherein the distance T2 increases as it is measured farther from the substrate.

3. A semiconductor memory device according to claim 1, wherein the distance T2 is larger than T1.

4. A semiconductor memory device according to claim 1, wherein an oxynitride film is formed between the charge retaining portion and the gate electrode.

5. A semiconductor memory device according to claim 1, wherein a deposited insulating film is formed between the charge retaining portion and the gate electrode.

6. A semiconductor memory device according to claim 5, wherein a thermal insulator ranging from 1 nm to 10 nm inclusive in thickness is arranged between the deposited insulator and the semiconductor substrate.

7. A semiconductor memory device according to claim 1, wherein the gate electrode is formed of a different composition of material from the substrate, and the distance T2 is different from T1.

8. A semiconductor memory device according to claim 1, wherein the charge retaining portion in the memory functional unit is separated from both the gate electrode and the substrate by the anti-dissipation insulator, the substrate and the gate electrode being made of silicon, and wherein a region of the substrate facing the memory functional unit differs in impurity concentration from a region of the gate electrode facing the memory functional unit, and the distance T2 is different from T1.

9. A semiconductor memory device according to claim 8, wherein the gate electrode has an impurity concentration of $1 \times 10^{20}$ cm$^{-3}$ or more, and the substrate has an impurity concentration lower than that of the gate electrode.

10. A semiconductor memory device according to claim 1, wherein at least a portion of the gate insulating film and at least a portion of the memory functional unit are each made of an oxide film, and the gate insulating film has an oxide film equivalent thickness smaller than that of a path extending through the memory functional unit from the side wall of the gate electrode opposed to the memory functional unit to the surface of the substrate located below the memory functional unit.

11. A semiconductor memory device according to claim 1, wherein the charge retaining portions, locating on the opposite sides, respectively, of the gate electrode, are adapted to store charges independently.

12. A semiconductor memory device according to claim 1, wherein at least a portion of the gate insulating film and at least a portion of the memory functional unit are each made of an oxide film, and the gate insulating film has an oxide film equivalent thickness larger than that of a path extending through the memory functional unit from the side wall of the gate electrode opposed to the memory functional unit to the surface of the substrate located below the memory functional unit.

13. A semiconductor memory device according to claim 12, wherein at least a part of the source and drain regions are arranged below the gate electrode.

14. A semiconductor memory device according to claim 1, wherein the anti-dissipation insulator in the memory functional unit is made of a silicon oxide film or a silicon oxynitride film, and the charge retaining portion in the memory functional unit is made of a silicon nitride film.

15. A semiconductor memory device according to claim 1, wherein at least a part of the charge retaining portion in the memory functional unit is arranged above the source or drain region.

16. A semiconductor memory device according to claim 15, wherein the charge retaining portion in the memory functional unit has a surface substantially parallel to a surface of the gate insulating film.

17. A semiconductor memory device according to claim 16, wherein the charge retaining portion in the memory functional unit includes a portion extending substantially in parallel with a side surface of the gate electrode.

18. A semiconductor memory device according to claim 16, wherein the semiconductor memory device comprises an insulating film separating the charge retaining portion in the memory functional unit from the substrate, and the insulating film is thinner than the gate insulating film and is 0.8 nm or more in thickness.

19. A semiconductor memory device according to claim 16, wherein the semiconductor memory device comprises an insulating film separating the charge retaining portion in the memory functional unit from the substrate, the insulating being thicker than the gate insulating film and 20 nm or less in thickness.

20. An IC card comprising a semiconductor memory device as claimed in claim 1.

21. Portable electronic equipment comprising a semiconductor memory device as claimed in claim 1.

22. A semiconductor device including a semiconductor memory cell and a semiconductor element, each of the semiconductor memory cell and the semiconductor element comprising:

a gate insulating film formed on a semiconductor substrate;

a gate electrode formed on the gate insulating film;

a channel region located below the gate electrode;

a pair of source and drain regions arranged on opposite sides, respectively, of the channel region, the source and drain regions having a conductive type opposite to that of the channel region; and memory functional units located on opposite sides, respectively, of the gate electrode, each memory functional unit including a charge retaining portion and an anti-dissipation insulator, the charge retaining portion being made of a material serving to store charges, the anti-dissipation insulator serving to prevent the stored charges from being dissipated, wherein a distance between a sidewall of the gate electrode and a side of the charge retaining portion facing each other is adapted to differ from a distance between a bottom of the first charge retaining portion and a surface of the substrate, wherein the source and drain regions in the memory cell are arranged outside a region below the gate electrode of the memory cell, and a part of the source and drain regions in the semiconductor element is arranged below the gate electrode of the semiconductor element.

23. An IC card comprising a semiconductor device as claimed in claim 22.

24. Portable electronic equipment comprising a semiconductor device as claimed in claim 22.

25. A semiconductor memory device including memory cells, each memory cell comprising:
  a semiconductor substrate;
  a pair of source and drain regions formed on said substrate and separated by a channel region;
  a gate insulating film formed on said channel region;
  a gate electrode formed over said gate insulating film; and
  memory functional units located on opposite sides of the gate electrode, each memory functional unit including a charge retaining portion and an anti-dissipation insulator,
  wherein the charge retaining region is separated from the substrate by a first distance (T1) and from the gate electrode by a second distance (T2) not equal to said first distance (T1).

26. A semiconductor memory device according to claim 25, wherein said second distance T2 increases as it is measured farther from the substrate.

27. A semiconductor memory device according to claim 25, wherein said second distance T2 is greater than said first distance T1.

28. A semiconductor memory device according to claim 25, wherein the gate electrode is formed of a different composition of material from the substrate.

29. A semiconductor memory device according to claim 25, wherein the gate electrode has an impurity concentration greater than or equal to $1 \times 10^{20}$ cm$^{-3}$, and the substrate has an impurity concentration lower than said gate electrode impurity concentration.

30. A semiconductor memory device according to claim 25, wherein said anti-dissipation insulator comprises silicon oxide film or silicon oxynitride film, and said charge retaining portion comprises silicon nitride film.

* * * * *